United States Patent [19]
Shirota

[11] Patent Number: 5,341,385
[45] Date of Patent: Aug. 23, 1994

[54] METHOD AND APPARATUS FOR DECODING REED-SOLOMON CODE

[75] Inventor: Norihisa Shirota, Kanagawa, Japan

[73] Assignee: Sony Corporation, Tokyo, Japan

[21] Appl. No.: 950,779

[22] Filed: Sep. 24, 1992

Related U.S. Application Data

[63] Continuation of Ser. No. 630,765, Dec. 21, 1990, abandoned, which is a continuation of Ser. No. 208,056, Jun. 17, 1988, abandoned.

[30] Foreign Application Priority Data

Jun. 18, 1987 [JP] Japan ................... 62-152233
Jun. 18, 1987 [JP] Japan ................... 62-152234

[51] Int. Cl.$^5$ .............................. H03M 13/00
[52] U.S. Cl. .................................. 371/37.1
[58] Field of Search ........................ 371/37.1

[56] References Cited

U.S. PATENT DOCUMENTS 4,649,541 3/1987 Lahmeyer ................ 371/37.1

OTHER PUBLICATIONS

Brent, R., et al., "Systolic VLSI Arrays for Polynomial GCD Computation", *IEEE Trans. on Computers*, vol. C-33, No. 8, Aug. 1984, pp. 731-736.
Shao, H., et al., "A VLSI Design of a Pipeline Reed-Solomon Decoder", *IEEE Trans. on Computers*, vol. C-34, No. 5, May 1985, pp. 393-403.
Clark, G. et al., *Error-Correction Coding for Digital Communications*, copyright 1981, Plenum Press, N.Y., pp. 188-201.
Shao, H., et al., "A Single Chip VLSI Reed-Solomon Decoder", *ICASSP 86 Proceedings, International Conference on Acoustic, Speech and Signal Processing* (Apr. 7-11, 1986, Tokyo, Japan, pp. 2151-2154).
"A Method for Solving Key Equation For Decoding Goppa Codes", *Information and Control*, vol. 27, 1975, New York, pp. 87-99.

*Primary Examiner*—Stephen M. Baker
*Attorney, Agent, or Firm*—Lewis H. Eslinger; Jay H. Maioli

[57] ABSTRACT

A decoding method of Reed-Solomon code produces an error position polynomial $\sigma(x)$ and an error evaluation polynomial $\omega(x)$ by a Euclidean algorithm, whereby a syndrome polynomial $S(x)$ is obtained, the highest degrees of the syndrome polynomial $S(x)$ and of an initial polynomial $x^{2t}$, which is determined by the number $t$ of symbols to be corrected, are multiplied, while the degree is incrementally reduced, thereby obtaining polynomials $h(x)$ and $g(x)$ that satisfy the relation:

$$f(x) \cdot B(x) + g(x) \cdot S(x) = h(x)$$

(where the degree of $h(x)$ is less than the degree of $g(x) \leq t$). The polynomial $g(x)$ is set to the error position polynomial $\sigma(x)$, and the polynomial $h(x)$ is set to the error evaluation polynomial $\omega(x)$, thereby performing the decoding by real time processing.

2 Claims, 64 Drawing Sheets

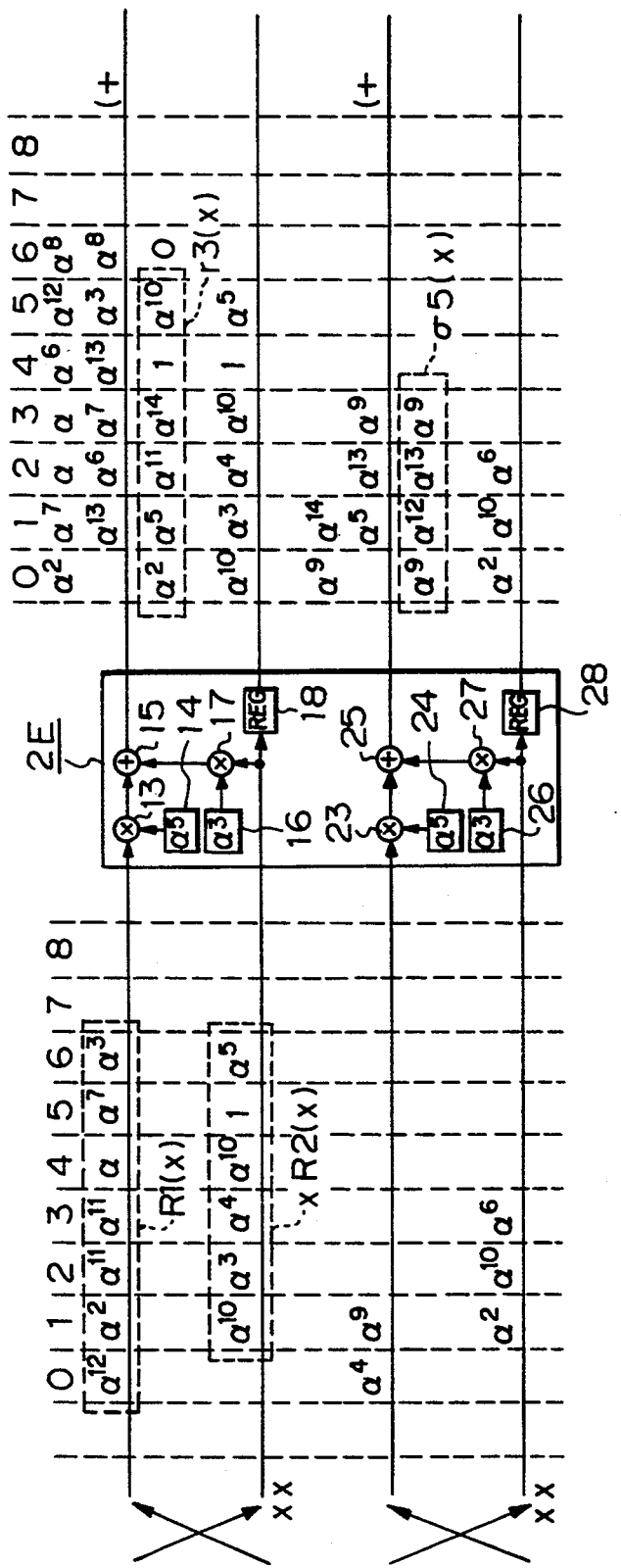

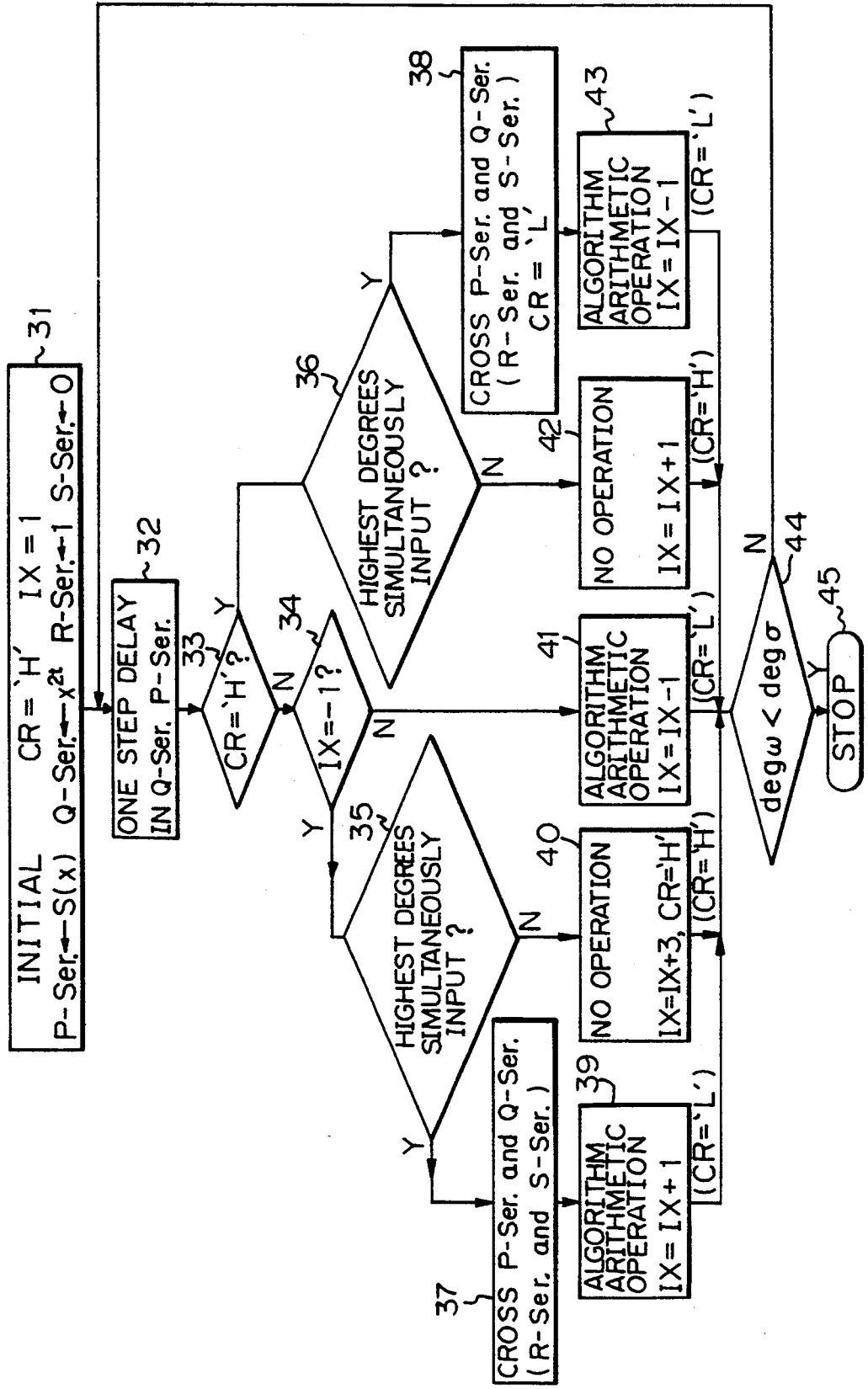

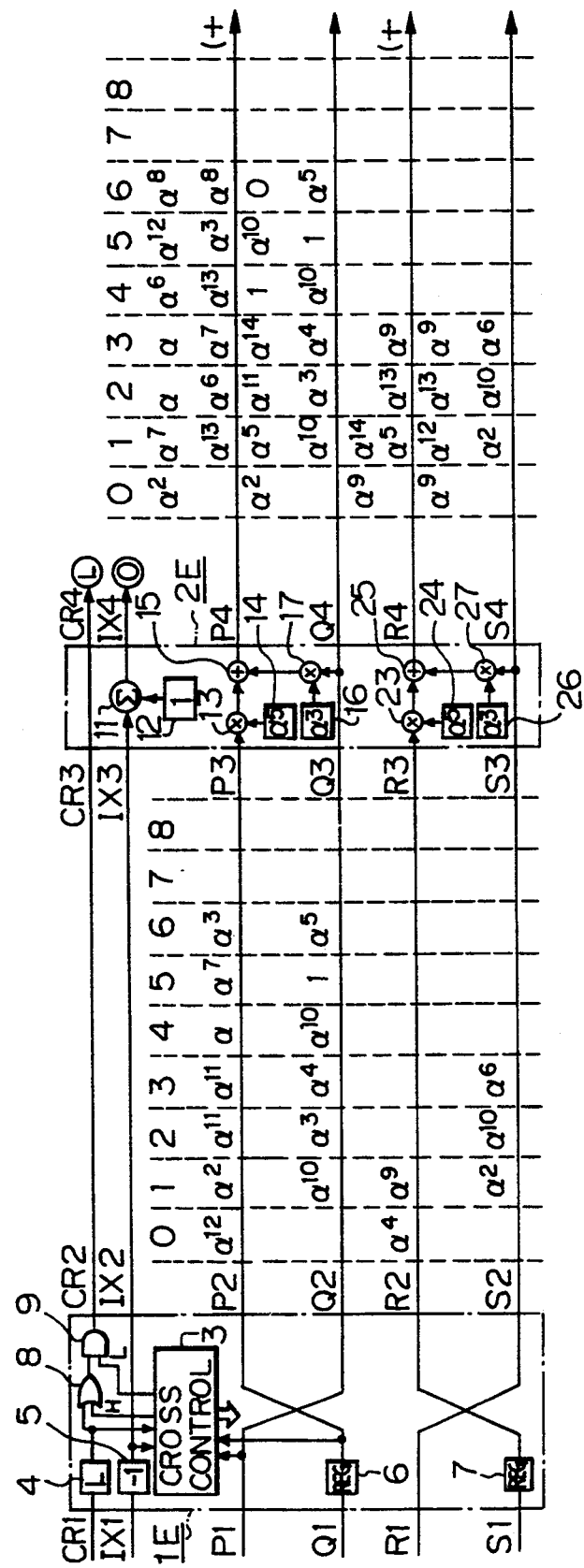

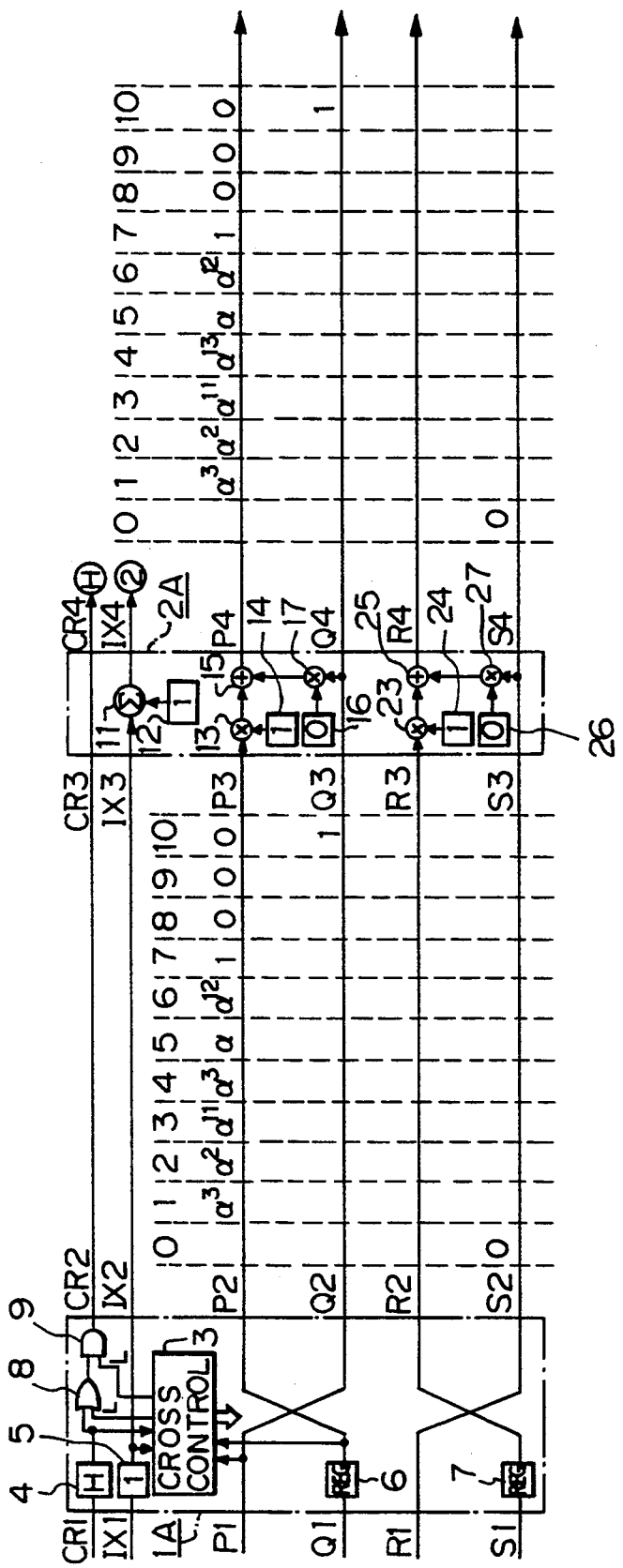

Fig. 13B

| OR7 | MUX7 |
|-----|------|
| L   | 0    |
| H   | 1    |

Fig. 13A

| STOP | AD8 | AD13 | MUX1 MUX3 | MUX2 |                        |
|------|-----|------|-----------|------|------------------------|
| L    | L   | L    | 0         | 1    | 40, 41, 42             |
| L    | L   | H    | 2         | 0    | 39, 43 CROSS MODE      |
| *    | *   | *    | 1         | 1    | FOR CALCULATION IX SIGNAL |
| H    | *   | *    | 1         | 1    | THROUGH                |

Fig. 13C

|       |     |    |     |      |      |      |      | TO DATA SERIES | TO IX SIGNAL | | | | |
|-------|-----|----|-----|------|------|------|------|----------------|--------------|--|--|--|--|
| STOP | AD8 | CR | INV | CRINH | MUX8 | MUX9 | ALGORITHM ARITHMETIC OPERATION |
| L    | L   | *  | *   | L     | 0    | 0    | NO-OPERATION |
| L    | L   | L  | L   | H     | 2    | 1    |              |
| L    | L   | L  | H   | *     | 1    | 1    | 41, IX=IX−1, OUTPUT $\alpha^1$ |
| L    | L   | L  | H   | L     | 3    |      | 39, IX=IX+1, OUTPUT $\alpha$ |
| L    | L   | L  | L   | H     | 4    |      | 40, IX=IX+3, OUTPUT $\alpha^3$ |
| L    | H   | H  | *   | L     | 1    |      | 43, IX=IX−1, OUTPUT $\alpha^{-1}$ |
| L    | H   | H  | *   | H     | 3    |      | 42, IX=IX+1, OUTPUT $\alpha$ |
| H    | *   | *  | *   | *     | 2    | 1    | NO-OPERATION IX − NO CHANGE |

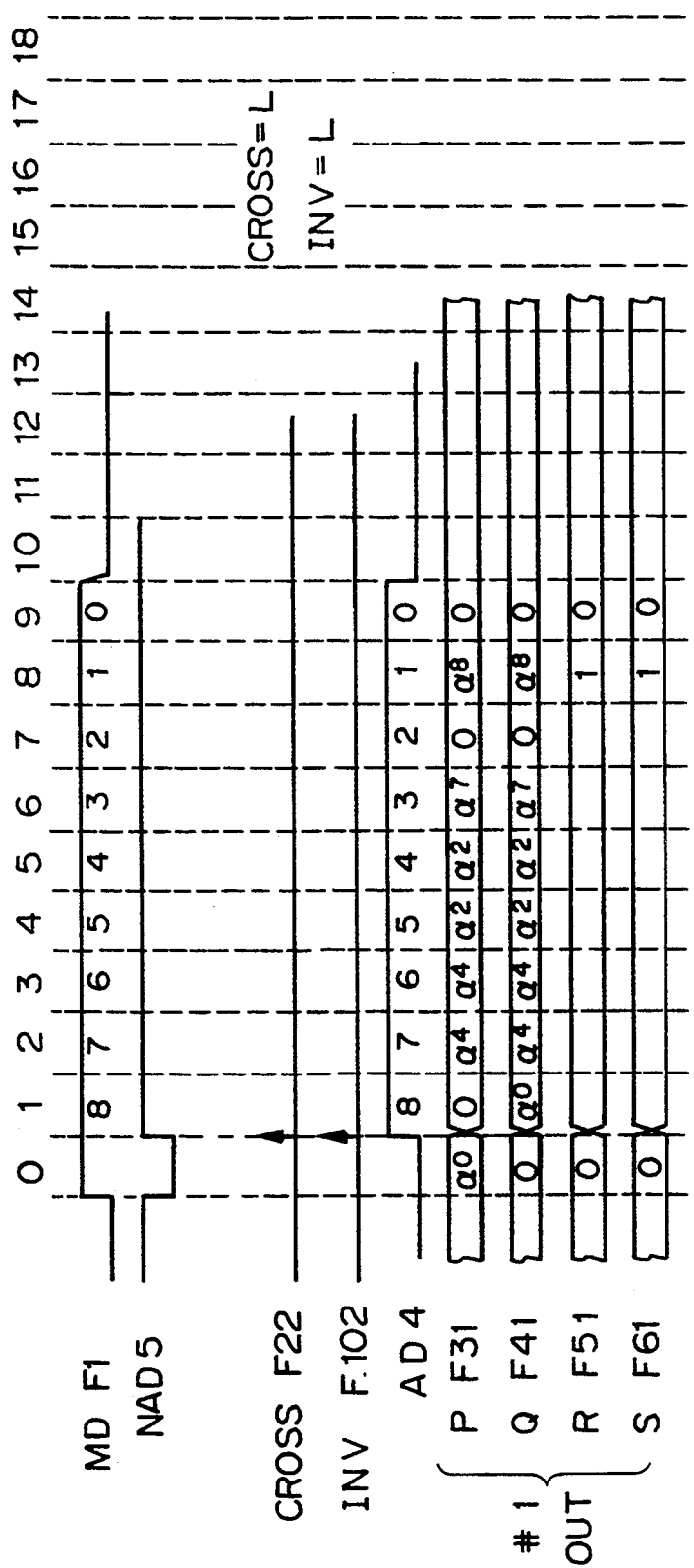

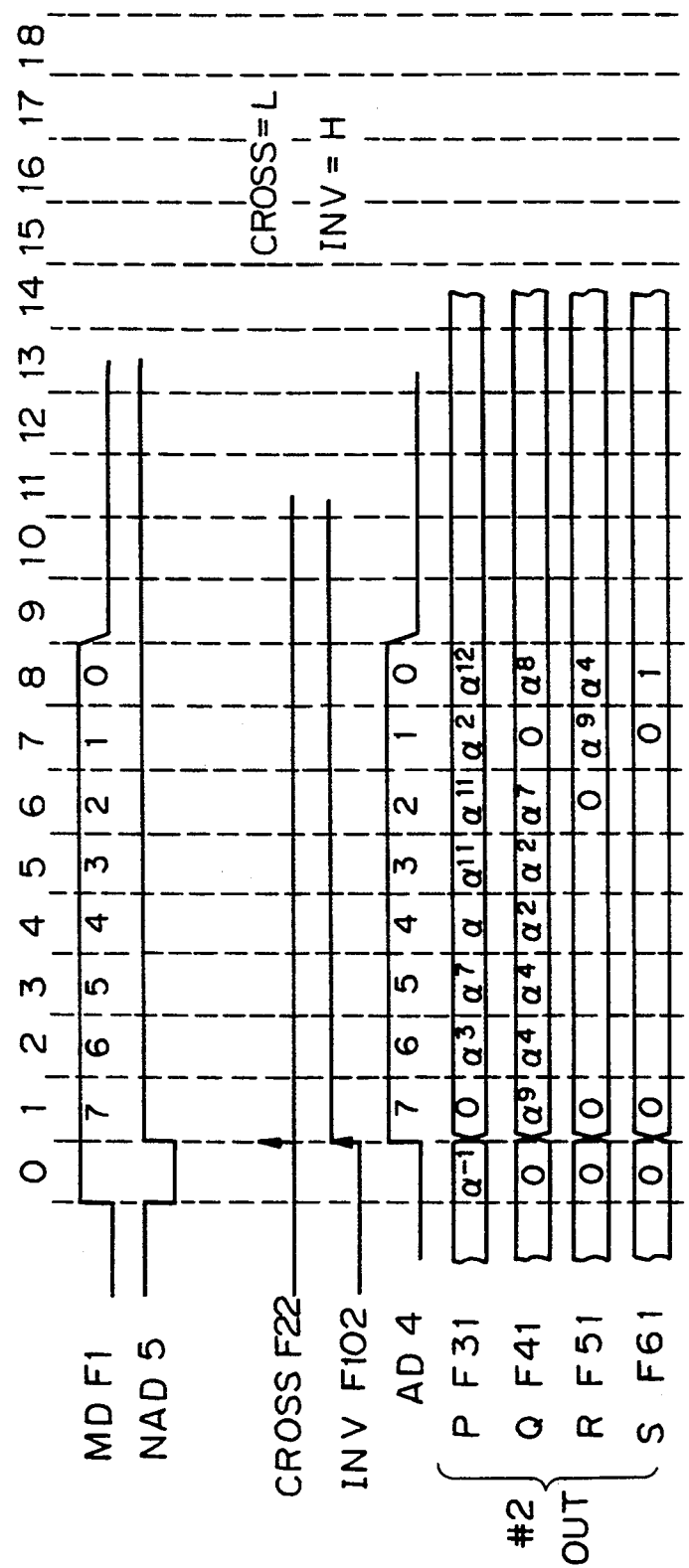

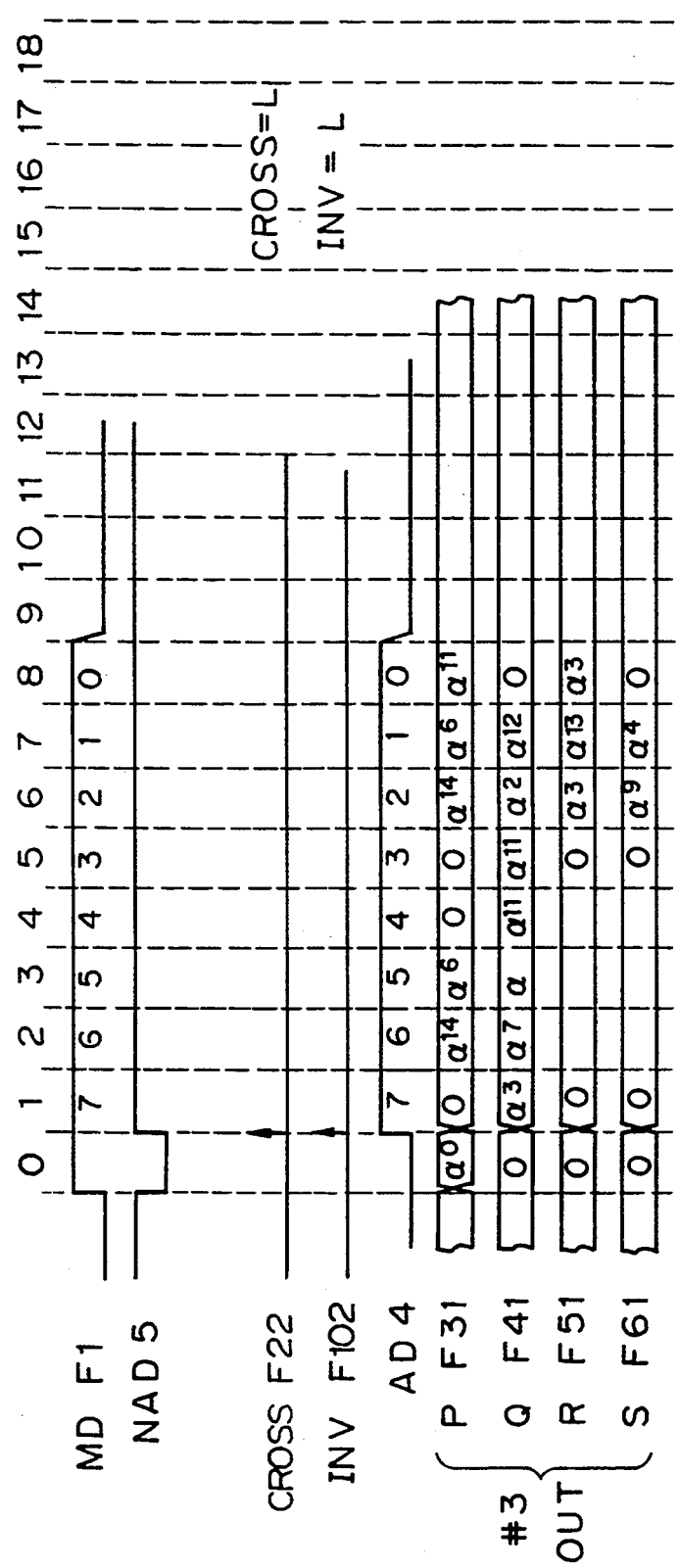

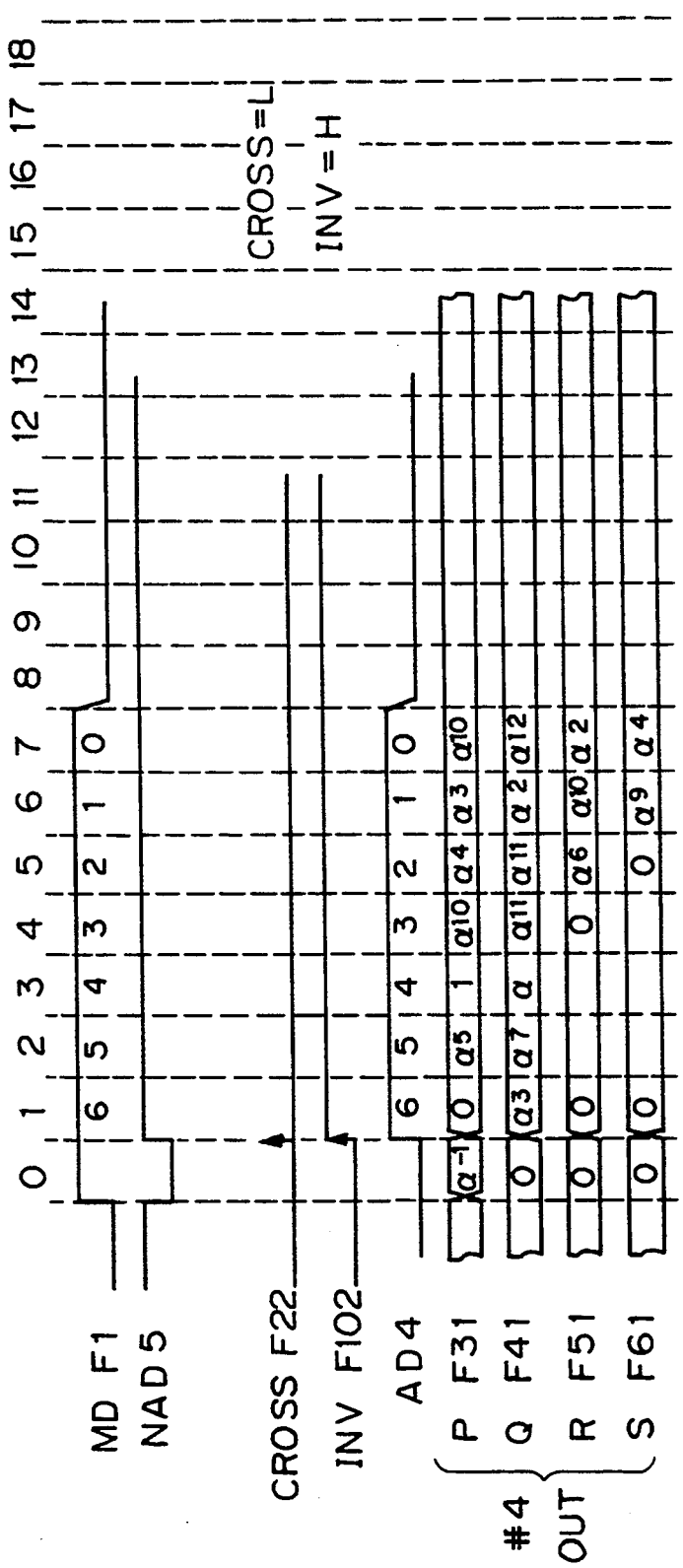

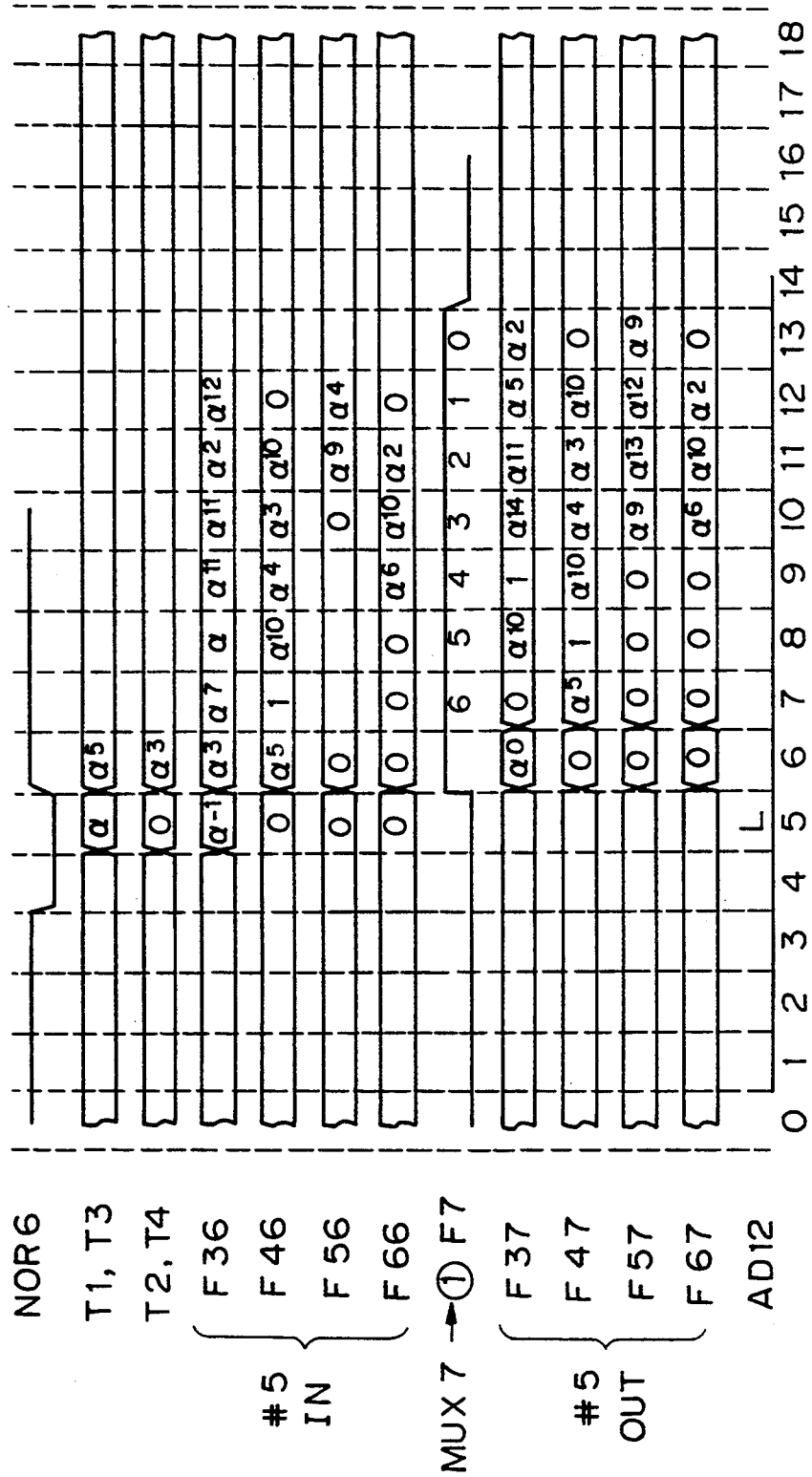

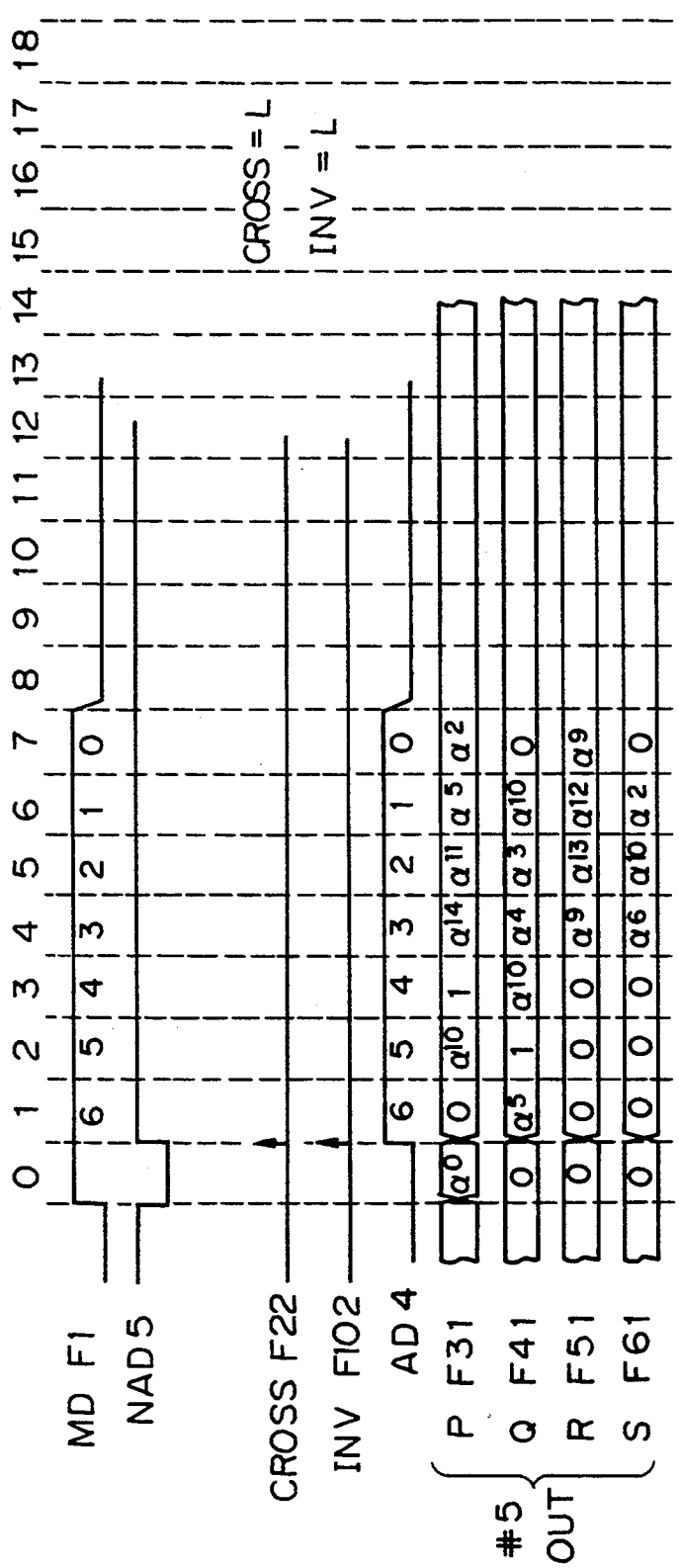

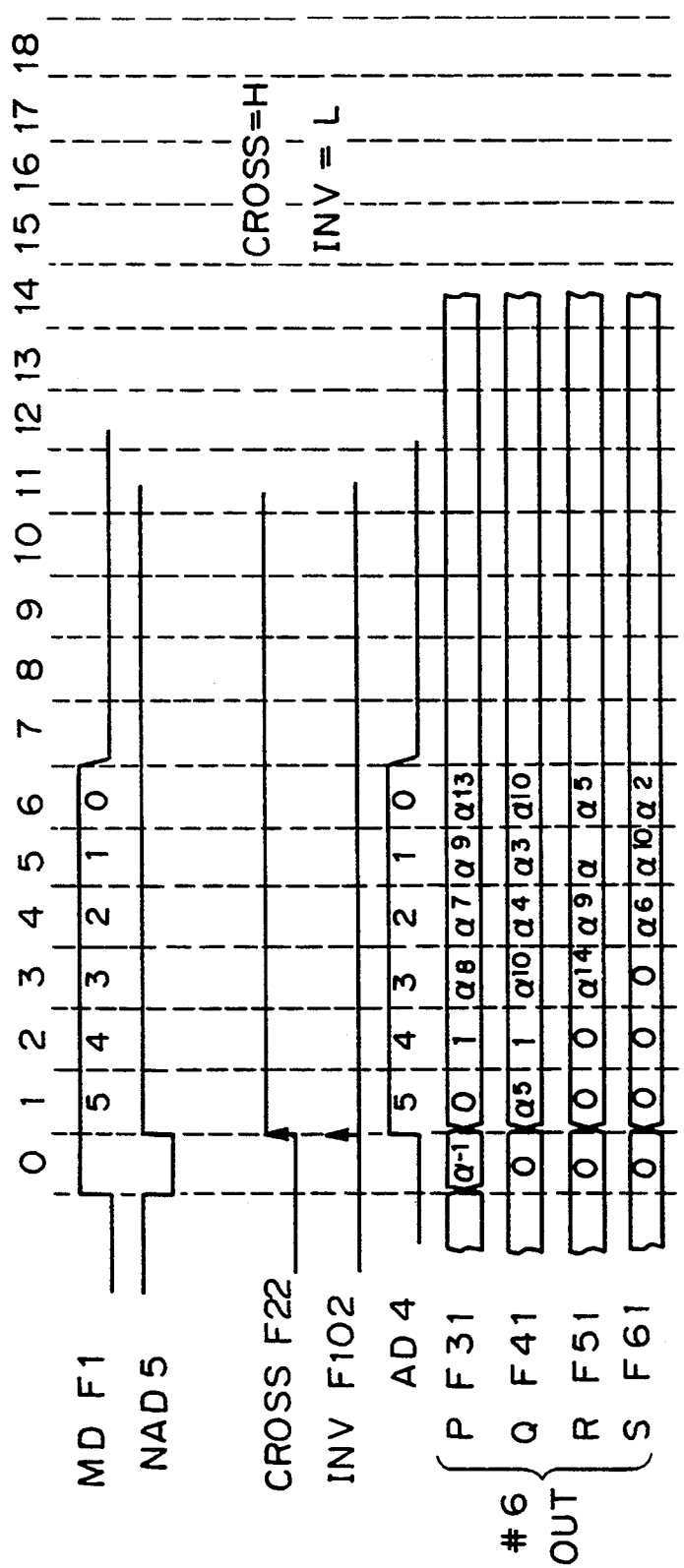

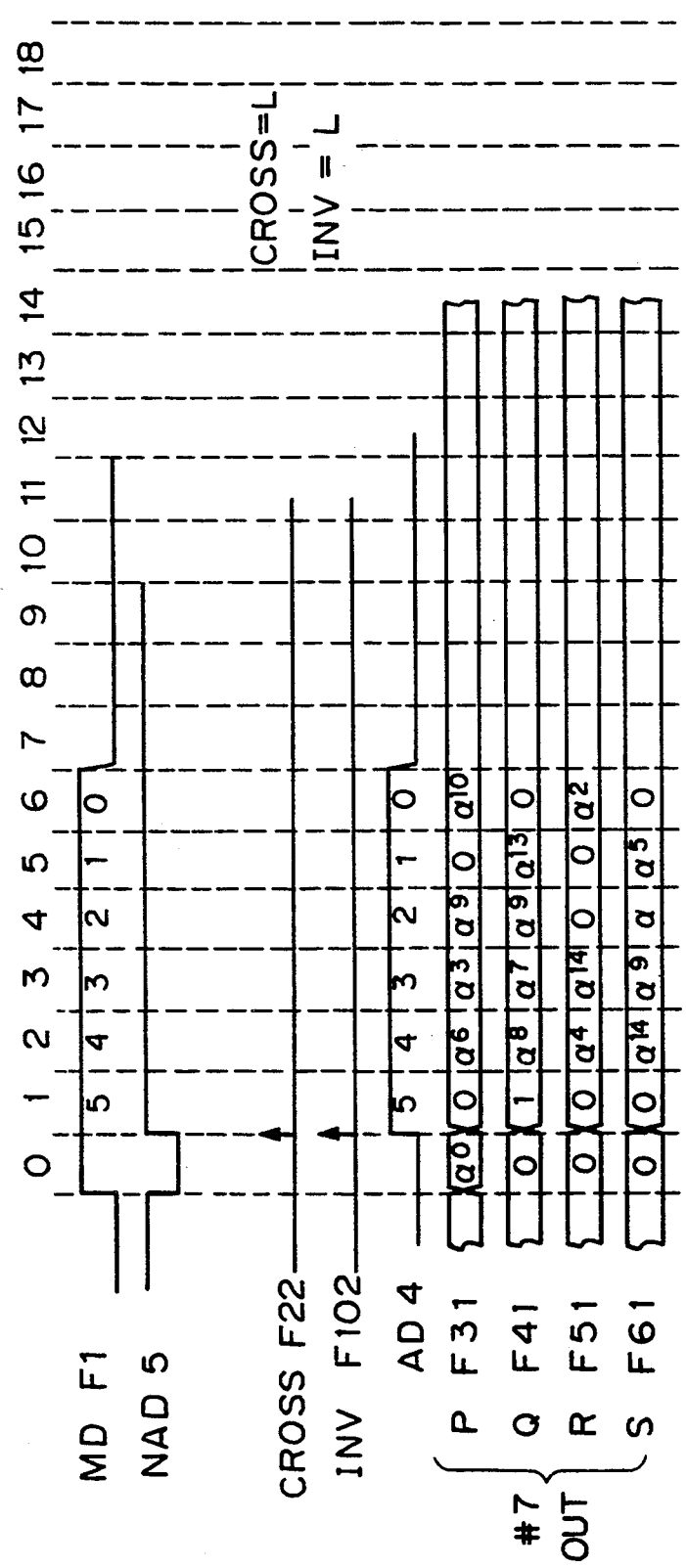

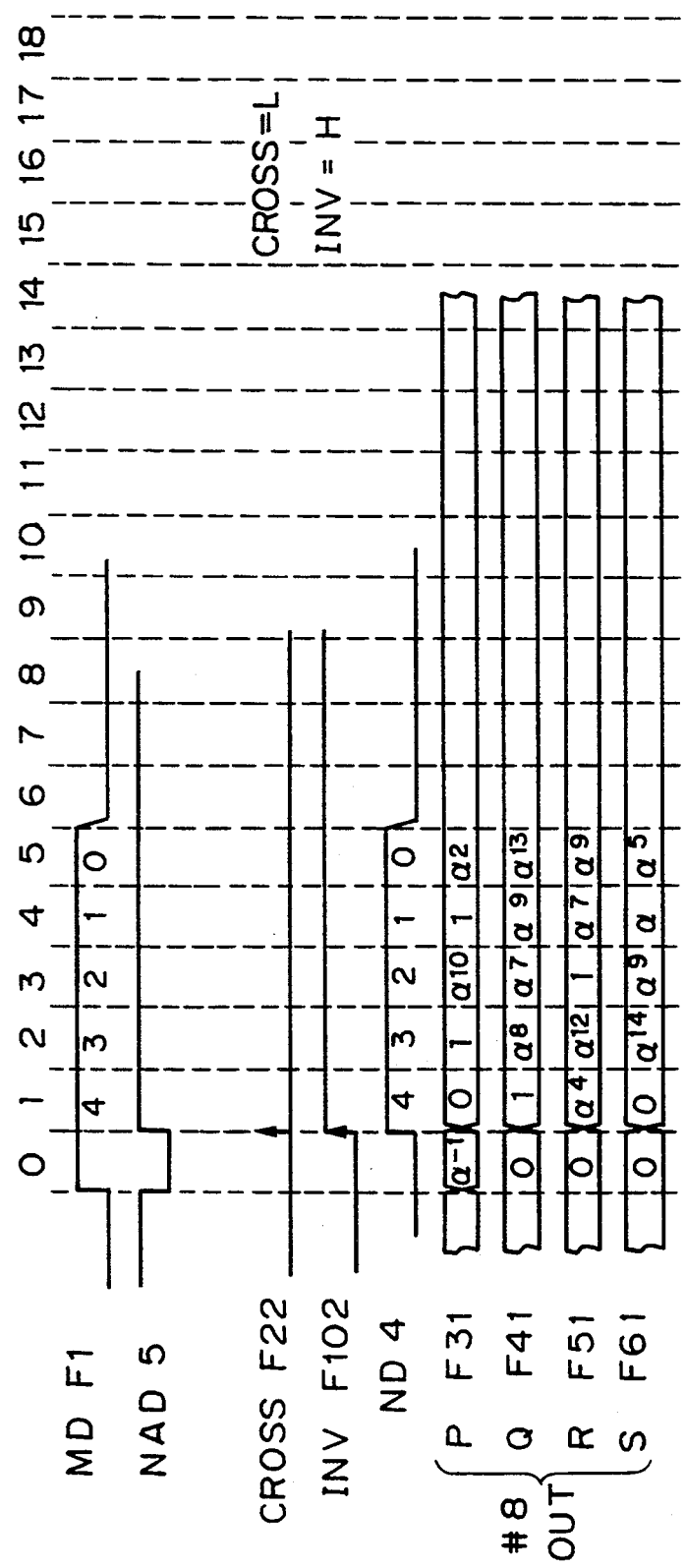

METHOD AND APPARATUS FOR DECODING REED-SOLOMON CODE

This is a continuation of application Ser. No. 07/630,765 filed Dec. 21, 1990, now abandoned which is a continuation of application Ser. No. 07/208,056, filed Jun. 17, 1988, abandoned.

BACKGROUND OF THE INVENTION

1. Field of the Invention

This invention relates generally to a method and apparatus for decoding an error correction code and, more particularly, to a method and apparatus for decoding a Reed-Solomon code and to Euclidean algorithm arithmetic operation circuit that can be used therein.

2. Description of the Background

Conventionally, the decoding of the Reed-Solomon code is executed by steps involving: i) calculation of syndromes; ii) production of the error position polynomial $\sigma(x)$ and error evaluation polynomial $\omega(x)$; iii) estimation of the error position and error value; and iv) execution of the error correction.

The conventional decoding method using the solutions involving the roots of equations cannot be applied in situations requiring the correction of multiple errors consisting of five or more errors. In such situations a decoding method using the Euclidean algorithm is known for the correction of five or more errors. That is, the error position polynomial $\sigma(x)$ and error evaluation polynomial $\omega(x)$ are calculated by using the Euclidean algorithm.

In the apparatus for decoding the Reed-Solomon code using such Euclidean algorithm, there occurs a problem such that a reciprocal number, such as $\alpha^{-9}$, is calculated to match with the highest degree coefficients of the dividend polynomial. More specifically, and assuming that the coefficients of the highest degree of two polynomials $B(x)$ and $S(x)$ are b and S, respectively, it is necessary to first calculate $(b \times S^{-1})$. To accomplish that calculation circuitry corresponding to a read only memory (ROM) or random access memory (RAM) is needed to obtain the reciprocal number, thereby causing the amount of hardware and circuitry to be increased beyond a desirable level.

OBJECTS AND SUMMARY OF THE INVENTION

Accordingly, it is an object of the present invention to provide a method and apparatus for decoding an error correction code that can eliminate the above-mentioned defects inherent in the conventional techniques, as well as a Euclidean algorithm arithmetic operation circuit that can be applied thereto.

It is a further object of the present invention to provide a decoding method of the Reed-Solomon code employing an improved control method to realize arithmetic operating sections that are connected in cascade and an error position polynomial $\sigma(x)$ and an error evaluation polynomial $\omega(x)$ that are obtained by real time processing.

It is another object of the invention to provide a Euclidean algorithm arithmetic operation circuit having an improved control method in which arithmetic operating sections are cascade connected and an error position polynomial $\sigma(x)$ and an error evaluation polynomial $\omega(x)$ are obtained by the real time processing.

In accordance with an aspect of the present invention, a decoding method of a Reed-Solomon code produces an error polynomial $\sigma(x)$ and an error evaluation polynomial $\omega(x)$ by a Euclidean algorithm, whereby a syndrome polynomial $S(x)$ is obtained, the highest degrees of the syndrome polynomial $S(x)$ and of an initial polynomial $x^{2t}$, which is determined by the number t of symbols to be corrected, are multiplied while the degree is sequentially reduced on a unit basis, thereby obtaining polynomials $h(x)$ and $g(x)$ that satisfy the relation:

$$f(x) \cdot B(x) + g(x) \cdot S(x) = h(x)$$

(where, the degree of $h(x)$ < the degree of $g(x) \leq t$), then the polynomial $g(x)$ is set to the error position polynomial $\sigma(x)$, and the polynomial $h(x)$ is set to the error evaluation polynomial $\omega(x)$.

The above and other objects, features, and advantages of the present invention will become apparent from the following detailed description of illustrative embodiments thereof to be read in conjunction with the accompanying drawings, in which like numerals represent the same or similar elements.

BRIEF DESCRIPTION OF THE DRAWINGS

FIG. 4 is a flowchart useful in explaining the operation of a control section in the embodiment of FIG. 2;

FIGS. 9A to 9H are schematic diagrams useful in explaining the operation of a fundamental unit according to the present invention;

FIGS. 10A to 10J are schematic diagrams useful in explaining a basic unit according to the present invention;

FIGS. 13A to 13C are tables useful in explaining the operation of the circuit of FIG. 12, and FIGS. 14A to 14I are a timing charts representing the operation of the operable circuit of FIG. 12,

DETAILED DESCRIPTION OF PREFERRED EMBODIMENTS

Figure 1A:
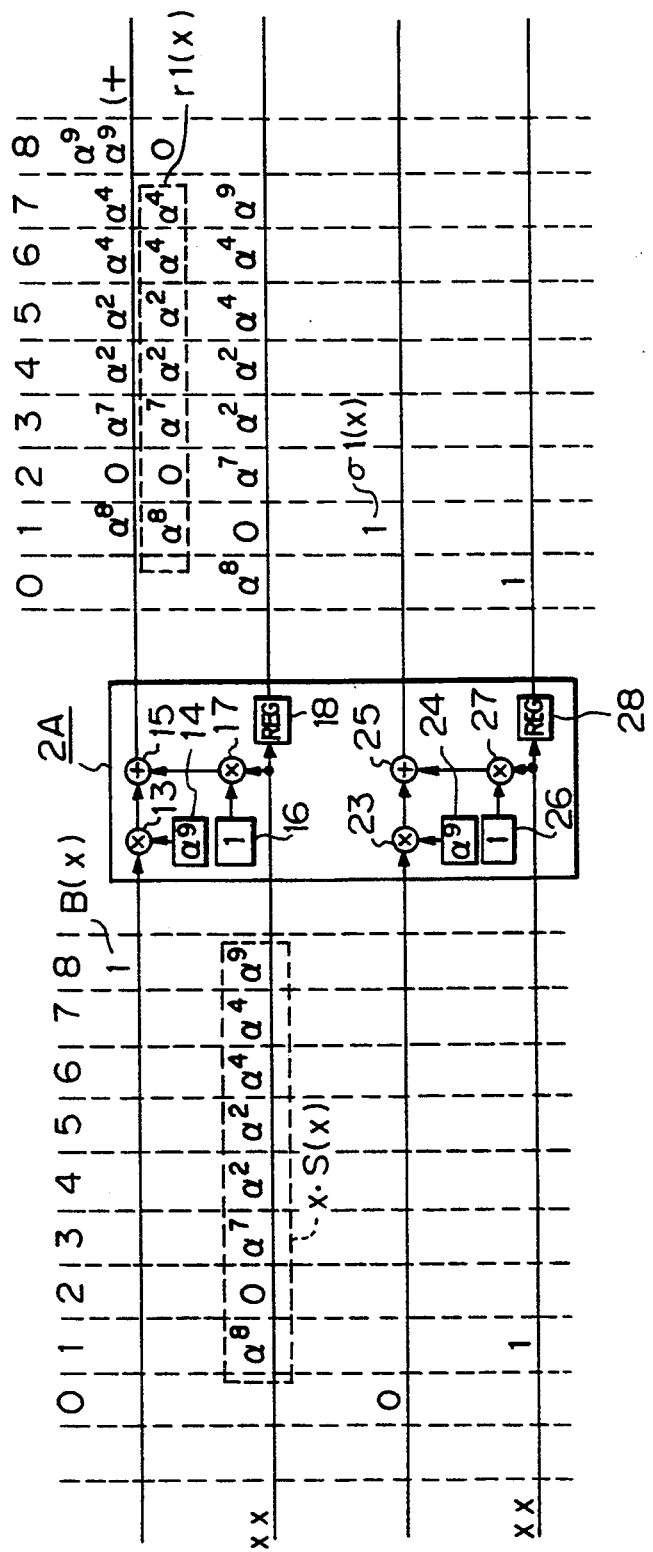
FIGS. 1A to 1H are schematic diagrams of decoding circuits of Reed-Solomon code useful in explaining the present invention.

Before describing an embodiment of the present invention, a conventional decoding method of Reed-Solomon code using the Euclidean algorithm will be described.

If it is assumed that t is the number of correctable symbols and n is the code length, then a parity check matrix H for correction of t errors of Reed-Solomon code will be expressed by:

$$H = \begin{bmatrix} 1 & \alpha & \alpha^2 & \alpha^3 & \ldots & \alpha^{n-1} \\ 1 & \alpha^2 & \alpha^4 & \alpha^6 & \ldots & \alpha^{2(n-1)} \\ \cdot & & & & & \cdot \\ \cdot & & & & & \cdot \\ \cdot & & & & & \cdot \\ 1 & \alpha^{2t} & (\alpha^2)^{2t} & (\alpha^3)^{2t} & \ldots & (\alpha^{n-1})^{2t} \end{bmatrix}$$

From the product of the foregoing parity check matrix H and the received signal, the syndromes are generated and the following syndrome polynomials are defined:

$$S_0 = \sum_{i=1}^{n} r_i \alpha^{i-1} = \sum_{k \in E} e_k \alpha^{(k-1)}$$

$$S_1 = \sum_{i=1}^{n} r_i \alpha^{2(i-1)} = \sum_{k \in E} e_k \alpha^{2(k-1)}$$

$$\cdot$$
$$\cdot$$
$$\cdot$$

$$S_j = \sum_{i=1}^{n} r_i \alpha^{(j+1)(i-1)} = \sum_{k \in E} e_k \alpha^{(j+1)(k-1)}$$

$$\cdot$$
$$\cdot$$
$$\cdot$$

$$S_{2t-1} = \sum_{i=1}^{n} r_i \alpha^{2t(i-1)} = \sum_{k \in E} e_k \alpha^{2t(k-1)}.$$

The following polynomial, in which the values generated in the above equations are used as coefficients, is referred to as a syndrome polynomial.

$$S(x) = S_0 + S_1 x + S_2 x^2 + \ldots + S_{2t-1} x^{2t-1}$$

There are various kinds of polynomials known for error correction, and they all satisfy the following relation:

$$\phi(x) \cdot x^{2t} + \sigma(x) \cdot S(x) = \omega(x)$$

where, $$S(x) = \sum_{i=0}^{2t-1} S_i x^i : \text{syndrome polynomial,}$$

$$\sigma(x) = \pi_{L \in E} (x - \alpha^{-(L-1)}) : \text{error position polynomial,}$$

$$\omega(x) = \sum_{L \in E} e_L \cdot \pi_{\substack{K \in E \\ K \neq L}} (x - \alpha^{-(k-1)}) : \text{error evaluation polynomial,}$$

$$\phi(x) = \sum_{L \in E} e_L \cdot \alpha^{2t(L-1)} \cdot \pi_{\substack{K \in E \\ K \neq L}} (x - \alpha^{-(k-1)})$$

Among the above equations, the error position polynomial $\sigma(x)$ and the error evaluation polynomial $\omega(x)$ are required when the error correction is actually performed.

Assuming that the above equations are always satisfied, $x^{2t}$ is obviously known, and $S(x)$ can be known from the reception signal. From $x^{2t}$ and $S(x)$, $\sigma(x)$ and $\omega(x)$ can be obtained by using the Euclidean algorithm. In a well-known example, the Euclidean algorithm is used to solve a problem such as: "For given positive integers m and n, calculate the greatest common measure d and integers a and b that satisfy the expression (am+bn=d)". The Euclidean algorithm is also similarly used in the case of polynomials, in addition to being used simply with integers as in the above. More specifically, it is sufficient to derive a correspondence such that (m→$x^{2t}$) and (n→S(x)). Nevertheless, in the above example involving integers, the greatest common measure d is obtained by executing the Euclidean algorithm to its final stage. Similarly, in the case of obtaining $\sigma(x)$ and $\omega(x)$ to execute the error correction, the greatest common measure is not obtained until the final stage of the algorithm is executed, however, if the following conditions are satisfied during the algorithm, the execution of the algorithm can be stopped.

$$t \geq \deg \sigma(x) > \deg \omega(x)$$

(deg denotes a degree of the polynomial)

In a practical example of obtaining $\sigma(x)$ and $\omega(x)$ by using the Euclidean algorithm relating to the case of a correction code of 4-sample errors, when the received signal consists of n symbols, the values that are substituted as x in the error position polynomial $\sigma(x)$ are sequentially: $1, \alpha^{-1}, \alpha^{-2}, \ldots, \alpha^{-(P-1)}, \ldots, \alpha^{-(n-1)}$, from the end of the received signal toward the beginning thereof. Thus, in this example, the number P indicates the number that is counted from the end of the received signal.

As an example, assuming that the end of the received signal is the 0th position, and errors are generated at the first to fourth positions. A correction is now considered with respect to the case where these errors have an error pattern of $(\alpha^4, \alpha, \alpha^7, \alpha^2)$. The syndromes in this case are:

$$S_0 = \alpha^4 \alpha + \alpha \alpha^2 + \alpha^7 \alpha^3 + \alpha^2 \alpha^4$$
$$= \alpha^5 + \alpha^3 + \alpha^{10} + \alpha^6 = \alpha^8$$

$$S_1 = \alpha^4 \alpha^2 + \alpha \alpha^4 + \alpha^7 \alpha^6 + \alpha^2 \alpha^8$$
$$= \alpha^6 + \alpha^5 + \alpha^{13} + \alpha^{10} = 0$$

$$S_2 = \alpha^4 \alpha^3 + \alpha \alpha^6 + \alpha^7 \alpha^9 + \alpha^2 \alpha^{12}$$
$$= \alpha^7 + \alpha^7 + \alpha + \alpha^{14} = \alpha^7$$

$$S_3 = \alpha^4 \alpha^4 + \alpha \alpha^8 + \alpha^7 \alpha^{12} + \alpha^2 \alpha^{16}$$
$$= \alpha^8 + \alpha^9 + \alpha^4 + \alpha^3 = \alpha^2$$

$$S_4 = \alpha^4 \alpha^5 + \alpha \alpha^{10} + \alpha^7 \alpha^{15} + \alpha^2 \alpha^{20}$$
$$\alpha^9 + \alpha^{11} + \alpha^7 + \alpha^7 = \alpha^2$$

$$S_5 = \alpha^4 \alpha^6 + \alpha \alpha^{12} + \alpha^7 \alpha^{18} + \alpha^2 \alpha^{24}$$
$$= \alpha^{10} + \alpha^{13} + \alpha^{10} + \alpha^{11} = \alpha^4$$

-continued $$S_6 = \alpha^4\alpha^7 + \alpha\alpha^{14} + \alpha^7\alpha^{21} + \alpha^2\alpha^{28}$$
$$= \alpha^{11} + 1 + \alpha^{13} + 1 = \alpha^4$$

$$S_7 = \alpha^4\alpha^8 + \alpha\alpha^{16} + \alpha^7\alpha^{24} + \alpha^2\alpha^{32}$$
$$= \alpha^{12} + \alpha^2 + \alpha + \alpha^4 = \alpha^9$$

$$S(x) = \alpha^9 x^7 + \alpha^4 x^6 + \alpha^4 x^5 + \alpha^2 x^4 + \alpha^2 x^3 + \alpha^7 x^2 + \alpha^8$$

$\sigma(x)$ and $\omega(x)$ are obtained by using the foregoing syndrome polynomial $S(x)$ and $x^{2t}$, and the procedure of the Euclidean algorithm is computed by:

$\deg \omega(x) < \deg \sigma(x) \leq 4$ $B(x)=(\alpha^{-9}x+\alpha)S(x)+R1(x)$ $B(x)=x^8$ $R1(x)=x^6+\alpha^4x^5+\alpha^{13}x^4+\alpha^8x^3\alpha^8x^2+\alpha^{14}x+\alpha^9$ $S(x)=(\alpha^9x+\alpha^{11})R1(x)+R2(x)$ $R2(x)=\alpha^{14}x^5+\alpha^9x^4+\alpha^4x^3+\alpha^{13}x^2+\alpha^{12}x+\alpha^4$ $R1(x)=(\alpha^{-14}x+\alpha^3)R2(x)+R3(x)$ $R3(x)=\alpha^2x^4+\alpha^{10}x^3+\alpha^{14}x^2+\alpha^{11}x+1$ $R2(x)=(\alpha^{12}x+\alpha^{-2})R3(x)+R4(x)$ $R4(x)=\alpha^9x^3+\alpha^4x^2+\alpha^9x+\alpha^{11}$ The above arithmetic operations can be summarized as follows:

$$R1 = B + Q1S$$

$$R2 = S + Q2R1 = S + Q2(B + Q1S)$$
$$= Q2B + (1 + Q2Q1)S$$

$$R3 = R1 + Q3R2 = B + Q1S + Q3[Q2B + (1 + Q2Q1)S]$$
$$= (1 + Q3Q2)B + (Q1 + Q3 + Q3Q2Q1)S$$

$$R4 = R2 + Q4R3 = Q2B + (1 + Q2Q1)S +$$
$$Q4(1 + Q3Q2)B + Q4(Q1 + Q3 + Q3Q2Q1)S$$

$$\therefore R4 = (Q2 + Q4 + Q4Q3Q2)B + (1 + Q2Q1 + Q4Q1 + Q4Q3 + Q4Q3Q2Q1)S$$

In these equations, $R_4$ corresponds to $\omega(x)$, the first term of the right side corresponds to the error position polynomial $\sigma(x)$, and the second term of the right side corresponds to the error evaluation polynomial $\omega(x)$.

$Q1=\alpha^{-9}x+\alpha$, $Q2=\alpha^9x+\alpha^{11}$, $Q3=\alpha^{-14}x+\alpha^3$, $Q4=\alpha^{12}x+\alpha^{-2}$ Therefore, $\sigma(x)=\alpha^{13}x^4+\alpha^6x^3+\alpha^9x^2+\alpha x+\alpha^3$ $\omega(x)=\alpha^9x^3+\alpha^4x^2+\alpha^9x+\alpha^{11}$ $\deg \sigma(x)=4$, $\deg \omega(x)=3$ By differentiating $\sigma(x)$, $\sigma'(x)=\alpha^6x^2+\alpha$ is obtained, and the error positions and error pattern are derived by using the error position polynomial and error evaluation polynomial.

For errors of $[x=\alpha^{-1}]$:

$\sigma(\alpha^{-1})=\alpha^9+\alpha^3+\alpha^7+1+\alpha^3=0$

Thus, it can be known that this position is an error position.

$\sigma'(\alpha^{-1})=\alpha^4+\alpha=1$ $\omega(\alpha^{-1})=\alpha^6+\alpha^2+\alpha^8+\alpha^{11}=\alpha^4$ Therefore, the error pattern is $e_{-1}=\omega(\alpha^{-1})/\sigma'(\alpha^{-1})=\alpha^4$ For errors of $[x=\alpha^{-2}]$:

$\sigma(\alpha^{-2})\approx\alpha^5+1+\alpha^5+\alpha^{14}+\alpha^3=0$

Thus, it is known that this position is an error position.

$\sigma'(\alpha^{-2})=\alpha^2+\alpha=\alpha^5$ $\omega(\alpha^{-2})=\alpha^3+1+\alpha^7+\alpha^{11}=\alpha^6$ Accordingly, the error pattern is $$e_{-2} = \omega(\alpha^{-2})/\sigma'(\alpha^{-2})$$
$$= \alpha$$

For errors of $[x=\alpha^{-3}]$:

$\sigma(\alpha^{-3})=\alpha+\alpha^{-3}+\alpha^3+\alpha^{-2}+\alpha^3=0$

Therefore, it is known that this position is an error position.

$\sigma'(\alpha^{-3})=1+\alpha=\alpha^4$ $\omega(\alpha^{-3})=1+\alpha^{-2}+\alpha^6+\alpha^{11}=\alpha^{11}$ Accordingly, the error pattern is $$e_{-3} = \omega(\alpha^{-3}/\sigma'(\alpha^{-3})$$
$$= \alpha^7$$

For errors of $[x=\alpha^{-4}]$:

$\sigma(\alpha^{-4})=\alpha^{-3}+\alpha^{-6}+\alpha+\alpha^{-3}+\alpha^3=0$

Therefore, it is known that this position is an error position.

$\sigma'(\alpha^{-4})=\alpha^{-2}+\alpha=\alpha^{12}$ $\omega(\alpha^{-4})=\alpha^{-3}+\alpha^{-4}+\alpha^5+\alpha^{11}=\alpha^{14}$ $$e_{-4} = \omega(\alpha^{-4})/\sigma'(\alpha^{-4})$$
$$= \alpha^2$$

As mentioned above, it will be understood that the error positions and error pattern obtained by $\sigma(x)$ and $\omega(x)$ are the same as those that have initially been set.

In the case where the decoding apparatus of the Reed-Solomon code using the Euclidean algorithm, as described above, is realized by actual circuitry and not a software simulation, there occurs a problem in that a reciprocal number, such as $\alpha^{-9}$, is calculated to match the highest degree coefficients of the product polynomial. That is, assuming that the coefficients of the highest degree of two polynomials $B(x)$ and $S(x)$ are b and S, respectively, it is necessary to first calculate $(b \times S^{-1})$. To accomplish this it is necessary to use circuits corresponding to a ROM or to a RAM to obtain the reciprocal number, which causes the amount of hardware to be increased significantly.

Therefore, one proposal to overcome this shortcoming is described in "IEEE TRANSACTIONS ON COMPUTERS", Vol. c-34, No. 5, May, 1985, pages 393 to 403, which employs a Euclidean algorithm that does not use the arithmetic operation to obtain the reciprocal number. This proposed method will be described using an example similar to the example of correcting four errors described hereinabove:

$$B(x) = x^8$$

$$S(x) = \alpha^9 x^7 + \alpha^4 x^6 + \alpha^4 x^5 + \alpha^2 x^4 \alpha^2 x^3 + \alpha^7 x^2 + \alpha^8$$

The calculations are based on a system in which the degree is sequentially reduced while multiplying the mutual highest degree coefficients.

Step 1:

$$\begin{array}{r} \alpha^9 \, B(x) \\ + \; 1 \cdot x \cdot S(x) \\ \hline r1(x) \end{array}$$

```
  8   7   6   5   4   2   1   0  degree
 α⁹
+ α⁹  α⁴  α⁴  α²  α²  α⁷  0  α⁸
────────────────────────────────
  0   α⁴  α⁴  α²  α²  α⁷  0  α⁸  0
```

$\deg r1(x) = 7$ $$r1(x) = \alpha^4 x^7 + \alpha^4 x^6 + \alpha^2 x^5$$
$$\alpha^2 x^4 + \alpha^7 x^3 + \alpha^8 x$$

Since the highest degree coefficient of $r1(x)$ is 7, this equation can be further divided by $S(x)$.

Step 2:

$$\begin{array}{r} \alpha^9 \, r1(x) \\ + \; \alpha^4 \, S(x) \\ \hline R1(x) \end{array}$$

```
   7    6    5    4   3   2    1    0
  α¹³  α¹³  α¹¹  α¹¹  α   0    α²
+ α¹³  α⁸   α⁸   α⁶   α⁶  α¹¹  0    α¹²
────────────────────────────────────────
   0   α³   α⁷   α    α¹¹ α¹¹  α²   α¹²
```

$\deg R1(x) = 6$ $$R1(x) = \alpha^3 x^6 + \alpha^7 x^5 + \alpha x^4$$
$$\alpha^{11} x^3 + \alpha^{11} x^2 + \alpha^2 x + \alpha^{12}$$

Since deg $R1(x)$ is less than deg $S(x)$, $S(x)$ is further divided by $R1(x)$.

By combining Steps 1 and 2 above:

$$\alpha^9 B = xS + r1$$

$$\alpha^9 r1 = \alpha^4 S + R1$$

By removing or so-called erasing r1 from the above equations, we have:

$$(\alpha^9)^2 B = (\alpha^9 x + \alpha^4) S + R1$$

Therefore, when considering the processes for $\sigma(x)$ and $\omega(x)$, $$\alpha^9 B + \underline{xS} = \underline{r1}$$

$$(\alpha^9)^2 B + (\underline{\alpha^9 x \alpha^4}) S = R1$$

The underlined terms are the portions that become $\sigma(x)$ and $\omega(x)$. Therefore, until Step 2, the degree of $(\alpha^9 x + \alpha^4)$ is still the first degree and the degree of R1 is still the sixth degree and, indeed, it is necessary to perform the arithmetic operation until they become the fourth and third degrees, respectively. Therefore, the above procedure is continued.

Step 3:

$$\begin{array}{r} \alpha^3 S(x) \\ + \; \alpha^9 x R1(x) \\ \hline r2(x) \end{array}$$

```
   7    6   5    4   3   2    1   0   degree
  α¹²  α⁷  α⁷   α⁵  α⁵  α¹⁰  0   α¹¹
+ α¹²  α   α¹⁰  α⁵  α⁵  α¹¹  α⁶
───────────────────────────────────
   0   α¹⁴ α⁶   0   0   α¹⁴  α⁶  α¹¹
```

$\deg r2(x) = 6$ $$r2(x) = \alpha^{14} x^6 + \alpha^6 x^5 + \alpha^{14} x^2 + \alpha^6 x + \alpha^{11}$$

Since the highest degree coefficient of $r2(x)$ is 6, r2 can be further divided by R1.

Step 4:

$$\begin{array}{r} \alpha^3 r2(x) \\ + \; \alpha^{14} R1(x) \\ \hline R2(x) \end{array}$$

```
  6   5    4    3    2    1    0   degree
 α²  α⁹   0    0    α²   α⁹   α¹⁴
+α²  α⁶   1    α¹⁰  α¹⁰  α    α¹¹
────────────────────────────────────
  0  α⁵   1    α¹⁰  α⁴   α³   α¹⁰
```

$\deg R2(x) = 5$ $$R2(x) = \alpha^5 x^5 + x^4 + \alpha^{10} x^3$$
$$\alpha^4 x^2 + \alpha^3 x + \alpha^{10}$$

Since deg R2 is less than deg R1, R1 is then divided by R2.

Step 5:

-continued $$\frac{\alpha^5 R1(x)}{+ \alpha^{13} x R2(x)}$$
$$r3(x)$$

| 6 | 5 | 4 | 3 | 2 | 1 | 0 | degree |
|---|---|---|---|---|---|---|---|
|   | $\alpha^8$ | $\alpha^{12}$ | $\alpha^6$ | $\alpha$ | $\alpha$ | $\alpha^7$ | $\alpha^2$ |
| $\alpha^8$ | $\alpha^3$ | $\alpha^{13}$ | $\alpha^7$ | $\alpha^6$ | $\alpha^{13}$ | 0 | |

$\deg r3(x) = 5$ $r3(x) = \alpha^{10} x^5 + x^4 + \alpha^{14} x^3$
$\alpha^{11} x^2 + \alpha^5 x + \alpha^2$ Step 6:

$$\frac{\alpha^5 r3(x)}{+ \alpha^{10} R2(x)}$$
$$R3(x)$$

| 5 | 4 | 3 | 2 | 1 | 0 | degree |
|---|---|---|---|---|---|---|
| 1 | $\alpha^5$ | $\alpha^4$ | $\alpha$ | $\alpha^{10}$ | $\alpha^7$ | |
| 1 | $\alpha^{10}$ | $\alpha^5$ | $\alpha^{14}$ | $\alpha^{13}$ | $\alpha^5$ | |
| 0 | 1 | $\alpha^8$ | $\alpha^7$ | $\alpha^9$ | $\alpha^{13}$ | |

$\deg R3(x) = 4$
$R3(x) = x^4 + \alpha^8 x^3 + \alpha^7 x^2 \alpha^9 x + \alpha^{13}$ Step 7:

$$\frac{1 \cdot R2(x)}{+ \alpha^5 x R2(x)}$$
$$r4(x)$$

| 5 | 4 | 3 | 2 | 1 | 0 | degree |
|---|---|---|---|---|---|---|
| $\alpha^5$ | 1 | $\alpha^{10}$ | $\alpha^4$ | $\alpha^3$ | $\alpha^{10}$ | |
| $\alpha^5$ | $\alpha^{13}$ | $\alpha^{12}$ | $\alpha^{14}$ | $\alpha^3$ | | |
| 0 | $\alpha^6$ | $\alpha^3$ | $\alpha^9$ | 0 | $\alpha^{10}$ | |

$\deg r4(x) = 4$
$r4(x) = \alpha^6 x^4 + \alpha^3 x^3 + \alpha^9 x^2 + \alpha^{10}$ Step 8:

$$\frac{1 \cdot r4(x)}{+ \alpha^6 R3(x)}$$
$$R4(x)$$

| 4 | 3 | 2 | 1 | 0 |
|---|---|---|---|---|
| $\alpha^6$ | $\alpha^3$ | $\alpha^9$ | 0 | $\alpha^{10}$ |
| $\alpha^6$ | $\alpha^{14}$ | $\alpha^{13}$ | 1 | $\alpha^4$ |
| 0 | 1 | $\alpha^{10}$ | 1 | $\alpha^2$ |

$\deg R4(x) = 3$
$R4(x) = x^3 + \alpha^{10} x^2 + x + \alpha^2$

Now, since R4(x), which can become $\omega(x)$, becomes a ternary equation, the above procedure is stopped. The results of the above arithmetic operations can be summarized as:

$\alpha^9 B = 1xS + r1 \rightarrow \alpha^9 B + xS = r1$
$\alpha^9 r1 = \alpha^4 S + R1 \rightarrow \alpha^3 B + (\alpha^9 x + \alpha^4)S = R1$
$\alpha^3 S = \alpha^9 x R1 + r2 \rightarrow \alpha^{12} x B + (\alpha^3 x^2 + \alpha^{13} x + \alpha^3)S = r2$
$\alpha^3 r2 = \alpha^{14} R1 + R2 \rightarrow (x + \alpha^2)B + (\alpha^6 x^2 + \alpha^{10} x + \alpha^2)S = R2$
$\alpha^5 R1 = \alpha^3 x R2 + r3 \rightarrow (\alpha^5 x^2 + \alpha^5 x + \alpha^8)B +$
$\qquad (\alpha^9 x^3 + \alpha^{13} x^2 + \alpha^{12} x + \alpha^9)S = r3$
$\alpha^5 r3 = \alpha^{10} R2 + R3 \rightarrow$
$\qquad (\alpha^8 x^2 + \alpha)B + (\alpha^{14} x^3 + \alpha^9 x^2 + \alpha x + \alpha^5)S = R3$
$1 \cdot R2 = \alpha^5 x R3 + r4 \rightarrow$
$\qquad (\alpha^{13} x^3 + \alpha^{13} x + \alpha^2)B + (\alpha^4 x^4 + \alpha^{14} x^3 + \alpha^2)S = r4$
$1 \cdot r4 = \alpha^6 R3 + R4 \rightarrow (\alpha^{13} x^3 + \alpha^{14} x^2 +$ -continued
$\alpha^{13} x + \alpha^{12})B + (\alpha^4 x^4 + \alpha^{12} x^3 + x^2 + \alpha^7 x + \alpha^9)S = R4$ Only when R4 is obtained, the relation of:

$\deg R4 > \deg (\alpha^4 x^4 + \alpha^{12} x^3 + x^2 + \alpha^7 x + \alpha^9) \leq t(=4)$ is satisfied, so that this procedure is stopped.
Therefore, we have $\sigma(x) = \alpha^4 x^4 + \alpha^{12} x^3 + x^2 + \alpha^7 x + \alpha^9$ $\omega(x) = Re(x) = x^3 + \alpha^{10} x^2 + x + \alpha^2$ By multiplying these equations with $\alpha^9$, the resultant equations become the same as $\sigma(x)$ and $\omega(x)$ that were obtained by using $\alpha^{-9}$ described above, that is, the error positions are obviously obtained. With respect to the equations to derive the error pattern, by multiplying both of the numerator and denominator with $\alpha^9$, the error pattern itself does not change and the correct answer is obtained. Finally, it is also possible to divide one degree by one while multiplying the mutual highest degree coefficients.

FIGS. 1A to 1H represent a construction that can be considered in the case where the processes, which are executed in accordance with the order of the above steps 1 through 3, are realized as a circuit.

In FIGS. 1A to 1H eight respective arithmetic operating sections 2A to 2H are cascade connected and each arithmetics operating section has a product sum arithmetic operating circuit of the same constitution. The product sum circuit for first and second input signals comprises a first multiplier 13 to which the first input signal is supplied; a register 14 connected to another input of multiplier 13; a second multiplier 17 to which the second input signal is supplied; a first register 16 connected to another input of multiplier 17; a second register 18 that acts to delay the second input signal by one clock and then to output it; and an adder 15 that adds the output signal of first multiplier 13 and the output signal of second multiplier 17. Similarly, the product sum circuit for third and fourth input signals comprises a third multiplier 23 to which the third input signal is supplied; a third register 24 connected to another input of third multiplier 23; a fourth multiplier 27 to which the fourth input signal is supplied; a fourth register 26 connected to another input of fourth multiplier 27; a register 28 to delay the fourth input signal by one clock and then to output it; and an adder 25 to add the output signal of third multiplier 23 and the output signal of fourth multiplier 27.

In the circuits shown in FIGS. 1A to 1H, the advance of data by one clock denotes that the polynomial is multiplied by x. On the other hand, the delay of data by one clock means that the polynomial is multiplied by $x^{-1}$ and the polynomial degree is reduced by one.

Figure 1B:
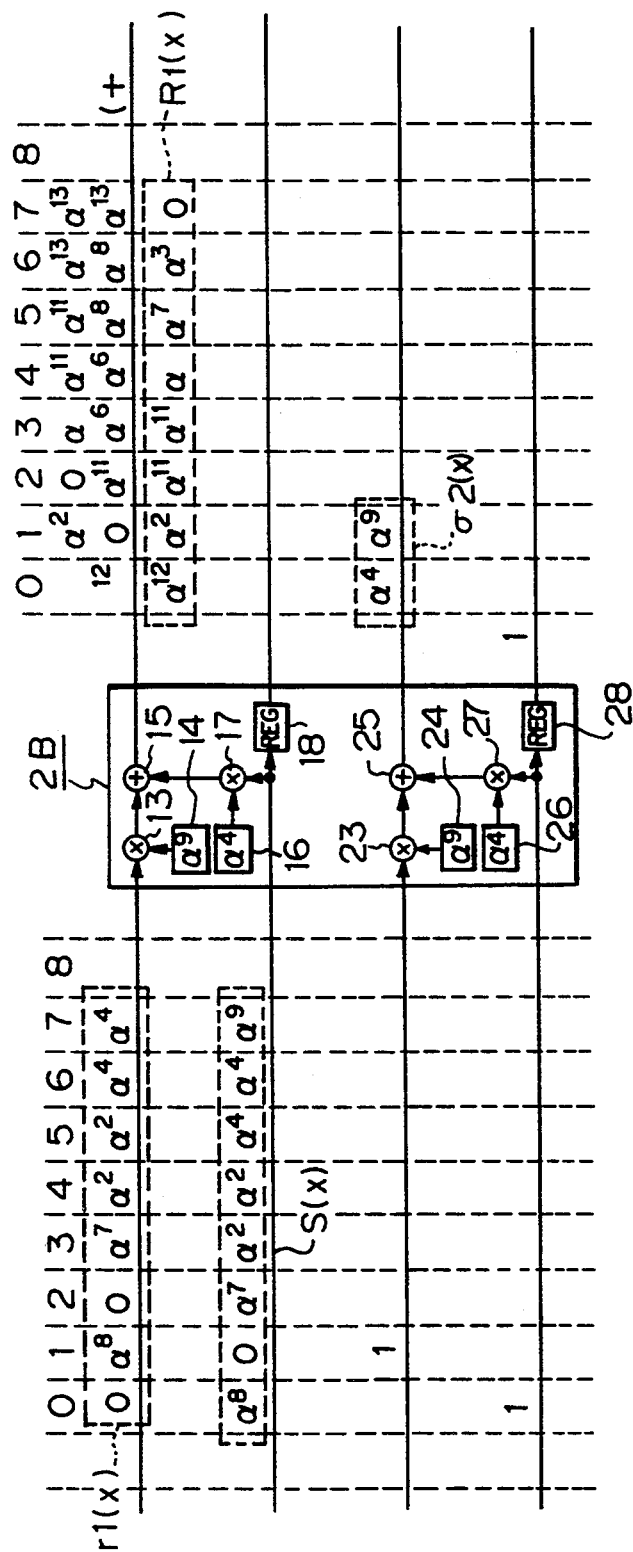
Figure 1C:
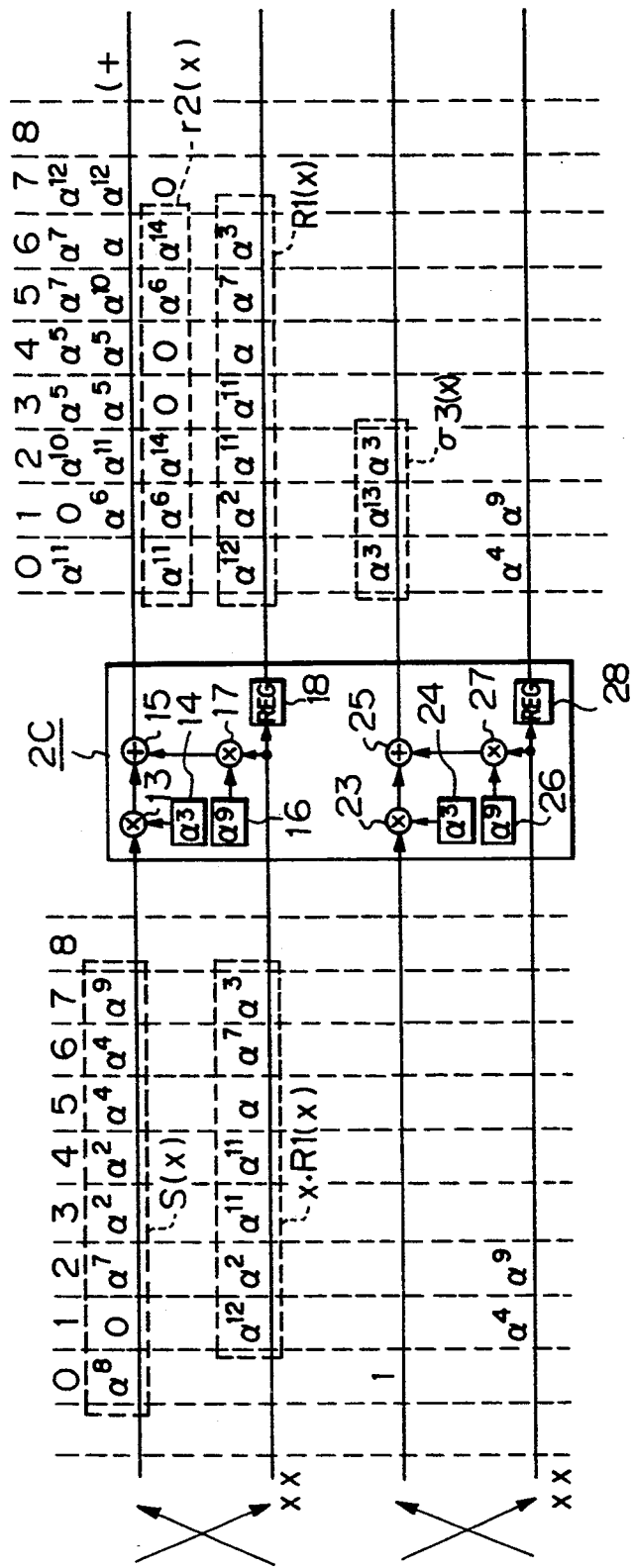
Figure 1D:
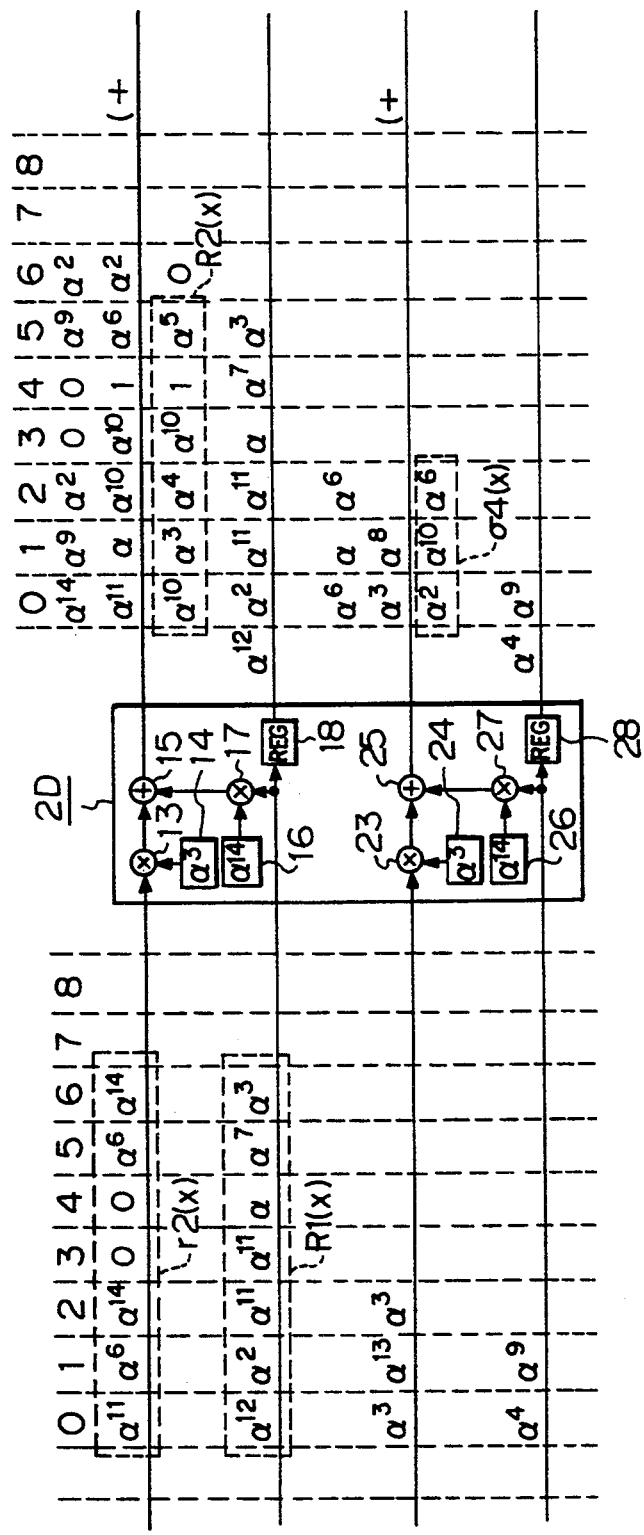
Figure 1F:
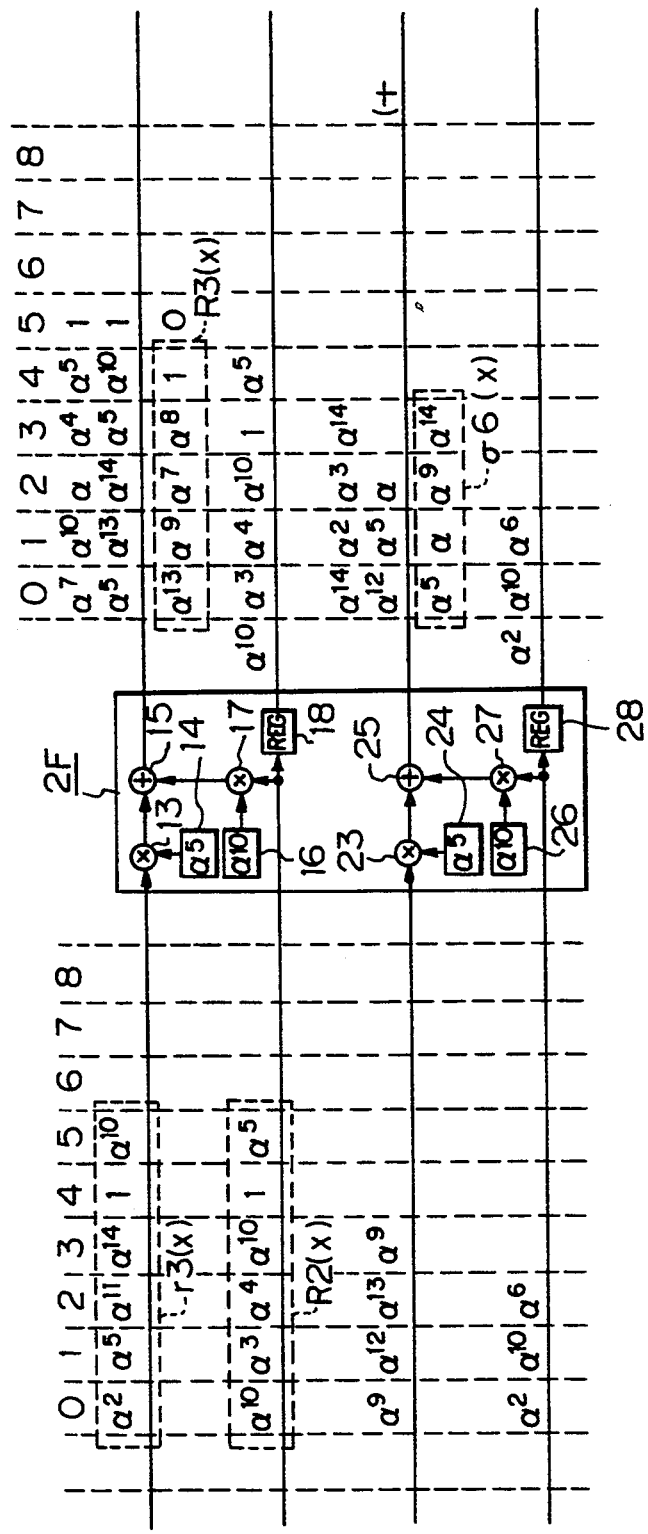
Figure 1G:
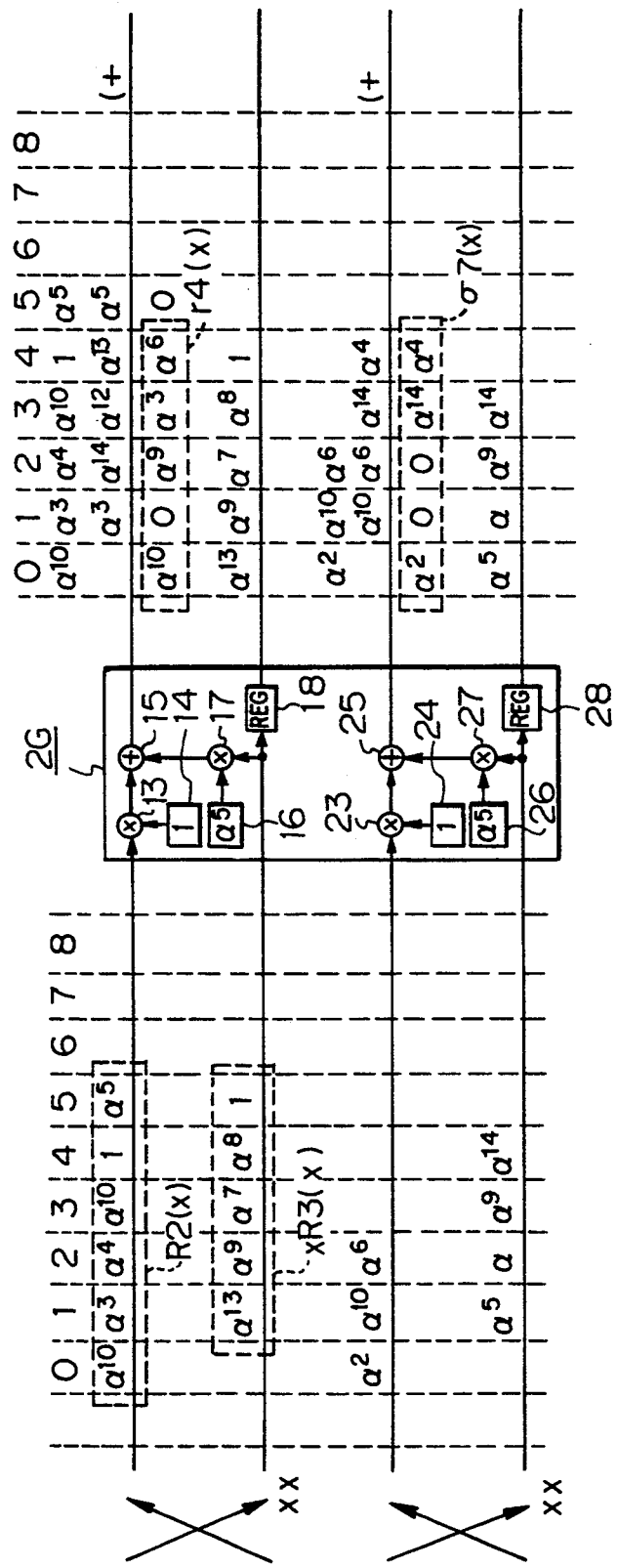
Figure 1H:
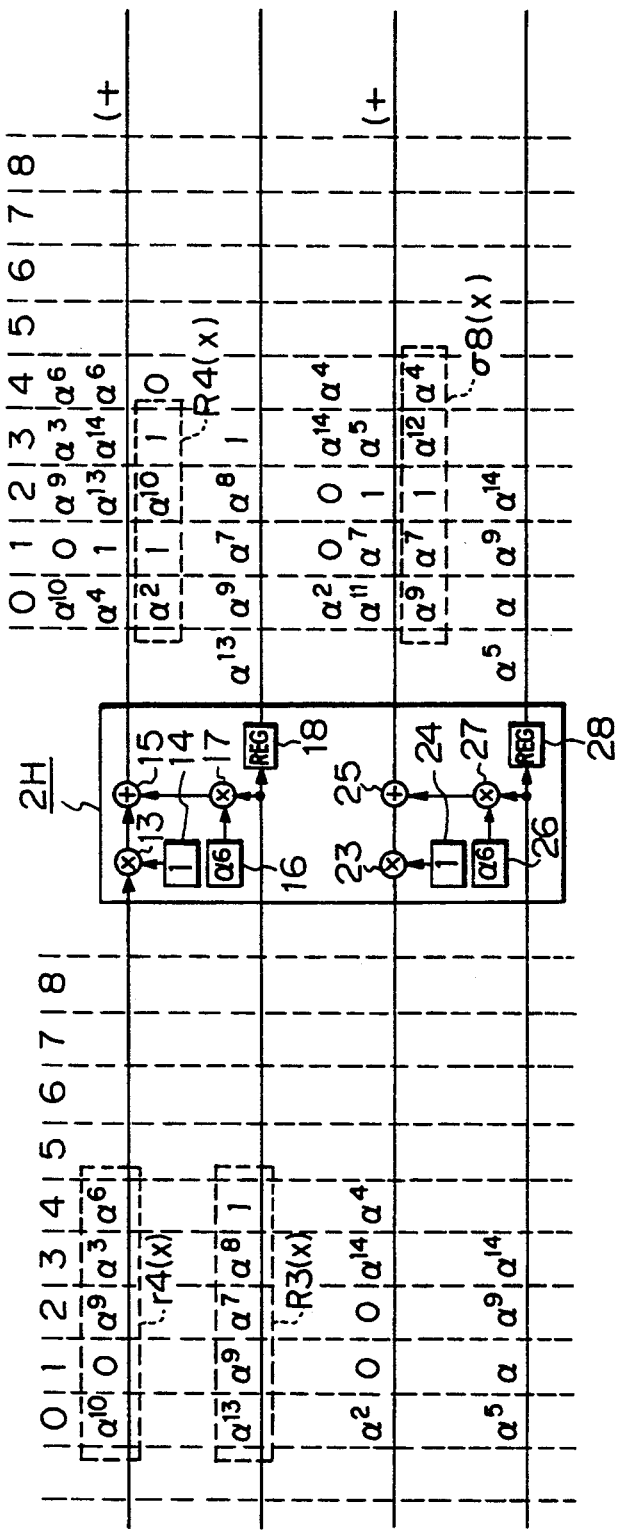

FIG. 1A represents inputs and outputs of the arithmetic operating sections when the processes in step 1 above are performed and FIG. 1B represents inputs and outputs of the arithmetic operating sections when the processes in step 2 above are performed. Similarly, FIGS. 1C through 1H represent inputs and outputs of the arithmetic operating section when the processes in steps 3 through 8, respectively are performed.

As described above, the processes automatically to obtain the error position polynomial $\sigma(x)$ and error evaluation polynomial $\omega(x)$ involve the derivation of the polynomials g(x) and h(x) that satisfy the following relations:

$$f(x) \cdot B(x) + g(x) \cdot S(x) = h(x)$$

$$\deg h(x) > \deg g(x) \leq t$$

in other words, there is provided a circuit that always outputs the polynomials $f_i(x)$ and $g_i(x)$ that satisfy the relation:

$$f_i(x)B + g_i(x)A = f_i(x)$$

where i denotes the number of arithmetic operation procedures using the polynomials B and A. Because $$\deg g_1 \leq \deg g_2 \leq \deg g_3 \leq \deg g_4 \ldots$$

$$\deg h_1 \leq \deg h_2 \leq \deg h_3 \leq \deg h_4 \ldots$$

after going through several procedures, there comes the point in time when the relation:

$$\deg h_i < \deg g_i \leq t$$

is satisfied.

Although the construction to obtain the error position polynomial $\sigma(x)$ and error evaluation polynomial $\omega(x)$ is considered, FIGS. 1A to 1H constitute only the arithmetic operating sections and nothing is clarified with respect to the control of the replacement of the first and second input signals, that is, the exchange of the divisor polynomial and dividend polynomial, and the detection that the relation of the difference between the degrees becomes: deg $\omega(x)$ is less than deg $\sigma(x)$.

Figure 2:
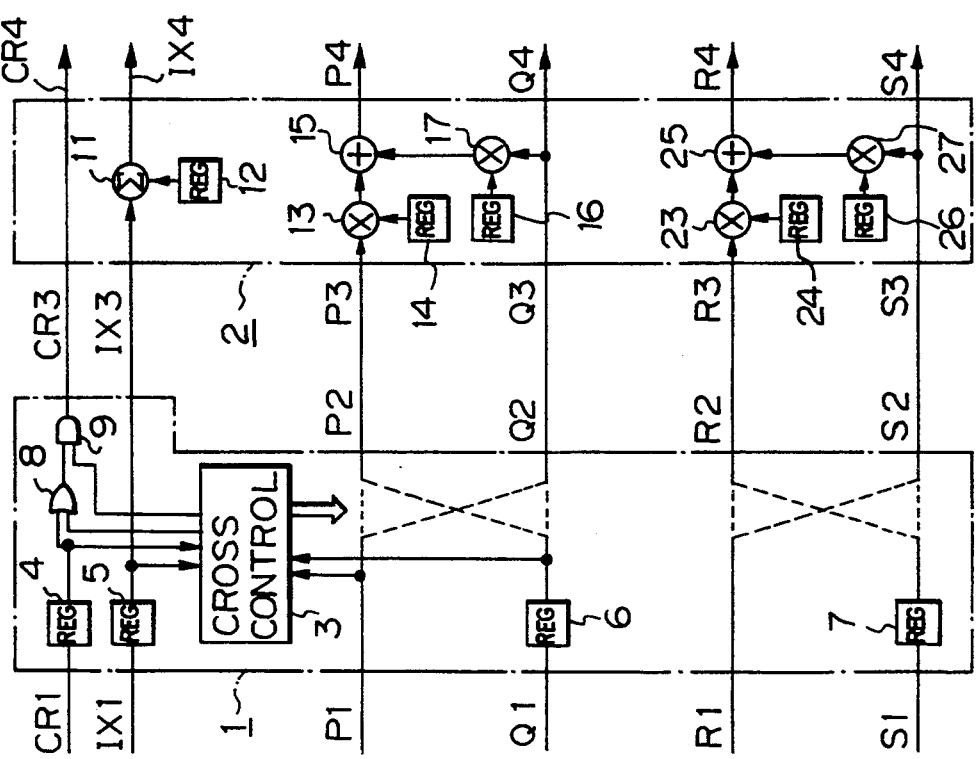
FIG. 2 is a block diagram of a fundamental unit of a preferred embodiment according to the present invention.

An embodiment of the method and apparatus for decoding an error correction code and the Euclidean algorithm arithmetic operation circuit that is applied thereto according to the present invention is described hereinbelow. More specifically, a fundamental constitution of the control section and arithmetic operating section are shown in FIG. 2. In the case of t-error correction code, a plurality of the basic sections shown in FIG. 2 are connected in cascade.

In FIG. 2, four data transmission lines and two flag transmission lines are provided. More specifically, the data of the P series are supplied on the first data line, the data of the Q series are supplied on the second data line, the data of the R series are supplied on the third data line, and the data of the S series are supplied on the fourth data line. CR and IX denote flags for control and these flags are supplied on the corresponding respective flag transmission lines.

The basic apparatus consists of a data control section 1 and an arithmetic operating section 2, in which data control section 1 includes a cross control circuit 3. Cross control circuit 3 controls whether the first and second data lines P1 and Q1 are crossed or not and also controls whether the third and fourth data lines R1 and S1 are crossed or not. Registers 4 to 7 are connected to the flag transmission line inputs CR and IX and to the second and fourth data transmission lines Q1 and S1, respectively. To perform the flag processes data control section 1 further includes an OR gate 8 and an AND gate 9.

Arithmetic operating section 2 includes an adder 11 to process a flag IX, a register 12, and a product sum arithmetic operating circuit for the data. The product sum arithmetic operating circuit for the P and Q series comprises a first multiplier 13, a register 14, an adder 15, a register 16, and a second multiplier 17. Similarly, the product sum arithmetic operating circuit for the R and S series comprises a third multiplier 23, a register 24, an adder 25, a register 26, and a fourth multiplier 27.

Figure 3:
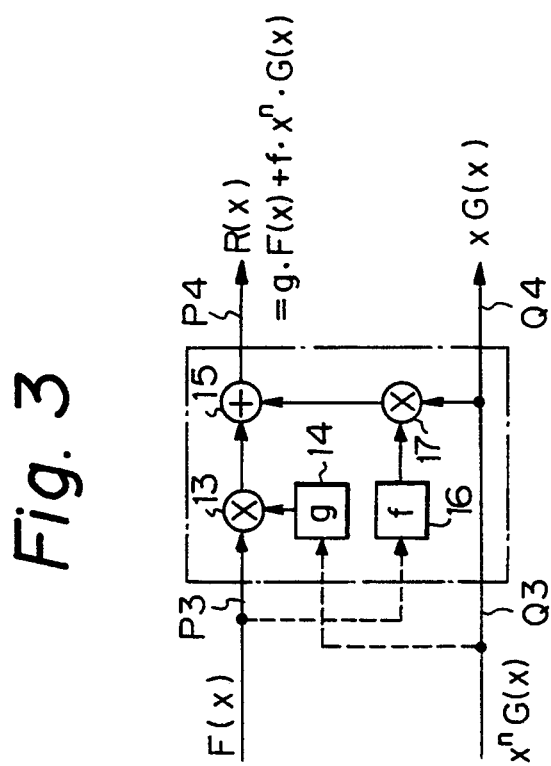
FIG. 3 is a block diagram of an arithmetic operating section used in the circuits of FIGS. 1A–1H.

When only the product sum for the P and Q series are to be extracted the product sum arithmetic operating circuit has an arrangement as shown in FIG. 3. As the P series, a polynomial F(x), having the highest degree coefficient: f, is supplied. As the Q series, polynomial $x^n G(x)$, having the highest degree coefficient: g, is supplied and as the output of the P series:

$$R(x) = gG(x) + fx^n G(x)$$

is obtained.

The condition such that the arithmetic operating section will perform the normal arithmetic operations is that the highest degree coefficients f and g can be simultaneously loaded into the registers 14 and 16, respectively. This is equivalent to: deg $f(x) = \deg x^n G(x)$ and, also, $g = 0$.

As represented in FIG. 3, in the case where: deg $f(x) > \deg g(x)$, and two polynomials having the difference of n degrees are set to a product polynomial and to a initial polynomial, the degree of the polynomial R(x) of the output is reduced by at least one degree. Therefore, to divide F(x) by G(x), it is sufficient to use only (n+1) arithmetic operating sections. In order to continue the new algorithm arithmetic operations, it is sufficient to cross the data lines such that R(x) of the final stage output P4 and the output G(x) of Q4 are respectively input to the Q and P series at the next stage.

Data control section 1 has the following two roles. First, it performs the control to determine the time when the polynomials of two systems are to be crossed and the initial polynomial and product polynomial are to be exchanged. Second, it detects that the arithmetic operation stop condition of (deg $\omega(x)$ < deg $\sigma(x)$) is satisfied.

According to the present invention, when the first control is performed, the real time processes are executed without having a buffer memory such that all of the coefficients of the polynomial can be stored. To enable this real time processing, the flags IX and CR are used. The flag IX denotes the difference of degrees of two polynomials before the division arithmetic operation is actually started, and in the Galois field GF ($S^8$), eight bits are generally necessary for this. The flag CR is the flag to indicate that the P series and the Q series, as well as the R series and S series, are crossed any time that the conditions are satisfied. When the flag CR is at a high level, this means that the data series are crossed, and when the flag CR is at low level, it means that they are not crossed and there is no need to cross them.

The above phrase "if the conditions are satisfied" with respect to the flag CR denotes the condition such that the highest degree coefficients of the input polynomials of the P and Q series can be simultaneously loaded into registers 14 and 16.

On the other hand, the point that (IX = −1) means that the degree of the initial polynomial, which is the output of Q4, is larger by one degree than the degree of the remainder polynomial, which is the output of data line P4, as the result of the algorithm arithmetic operation. In this case, the P series and Q series are exchanged and the algorithm arithmetic operations must be continued by the new initial polynomial. At such time, by deciding whether the P series and Q series are exchanged and the arithmetic operation should be started or not, a difference occurs relative to whether the flag $CR_4$ that is transferred to the next stage should be set to low (L) or high (H) or is held to the L level. In this manner, flags CR and IX are signals that should be always considered as a pair. Because this control method of the flags IX and CR is somewhat involved, it is shown more clearly in the flowchart of FIG. 4.

Referring then to FIG. 4, the operations commence with the setting at block 31 of the initial conditions. Namely, the flags are set such that CR=H (high level) and IX=1. The data of S(x) is supplied as the P series, $x^{2t}$ is supplied as the Q series, 1 is supplied as the R series, and 0 is supplied as the S series, all of which occur at this initial step 31. The delay of one stage is provided for each of the Q and S series at operation 32 and the decision whether CR=H occurs at step 33. At decisional block 34 the decision whether IX=1 is performed. That is, the determination is made with respect to whether the degree of the initial polynomial is larger than the degree of the product polynomial.

At the two decisional blocks 35 and 36 the decision is made with regard to whether the highest degrees have been simultaneously input or not. The processes to cross the respective data series are performed at 37 and 38, respectively. The processes for performing the algorithm arithmetic operations occur at blocks 39, 41, and 43. When the algorithm arithmetic operation is performed, the flag IX is set to (+1) or (−1).

The instruction that no algorithm arithmetic operation is to be performed and that the flag IX is to be increased by (+3) and the flag CR is to be set to the H level occurs at block 40 and at block 42 it is provided that no algorithm arithmetic operation is performed and flag IX is increased by (+1). The decision with respect to whether the condition of (deg $\omega(x)$<deg $\sigma(x)$) is satisfied or not is made at block 44 and when this condition is satisfied, the arithmetic operation is stopped.

Figure 5A:
FIGS. 5A and 5B, are schematic diagrams showing examples of errors occurring in a data stream.
Figure 5B:
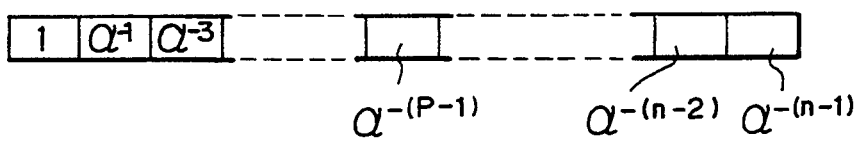

Now, an example in which the present invention is applied to 4-error correction is described in which FIG. 5A represents the case that the received data series consists of n symbols. More specifically, the values of (1, $\alpha^{-1}$, $\alpha^{-2}$, ... $\alpha^{-(n-1)}$) are sequentially input as x of the error position polynomial $\omega(x)$ or the error evaluation polynomial $\sigma(x)$ starting from the last of the received series, as shown in FIG. 5B.

Figure 6A:
FIGS. 6A and 6B are another example of errors in a data stream.
Figure 6B:

FIG. 6A represents data in which four errors, indicated by hatched portions, occur and the case of a specific error pattern as shown in FIG. 6B is considered. In this example it is assumed that the generation of syndromes is completed, and the syndrome polynomial S(x) is obtained and the syndrome polynomial S(x) is input, so that the processes shown in the flowchart of FIG. 4 are started. First, the initialization at 31 is executed and next, at stage 32, the delay of one clock is inserted into the Q series, that is, into the data series of B(x). Thus, the phases of the highest degree coefficient 1 deg $\alpha^9$ of the P and Q series become the same.

Figure 9A:
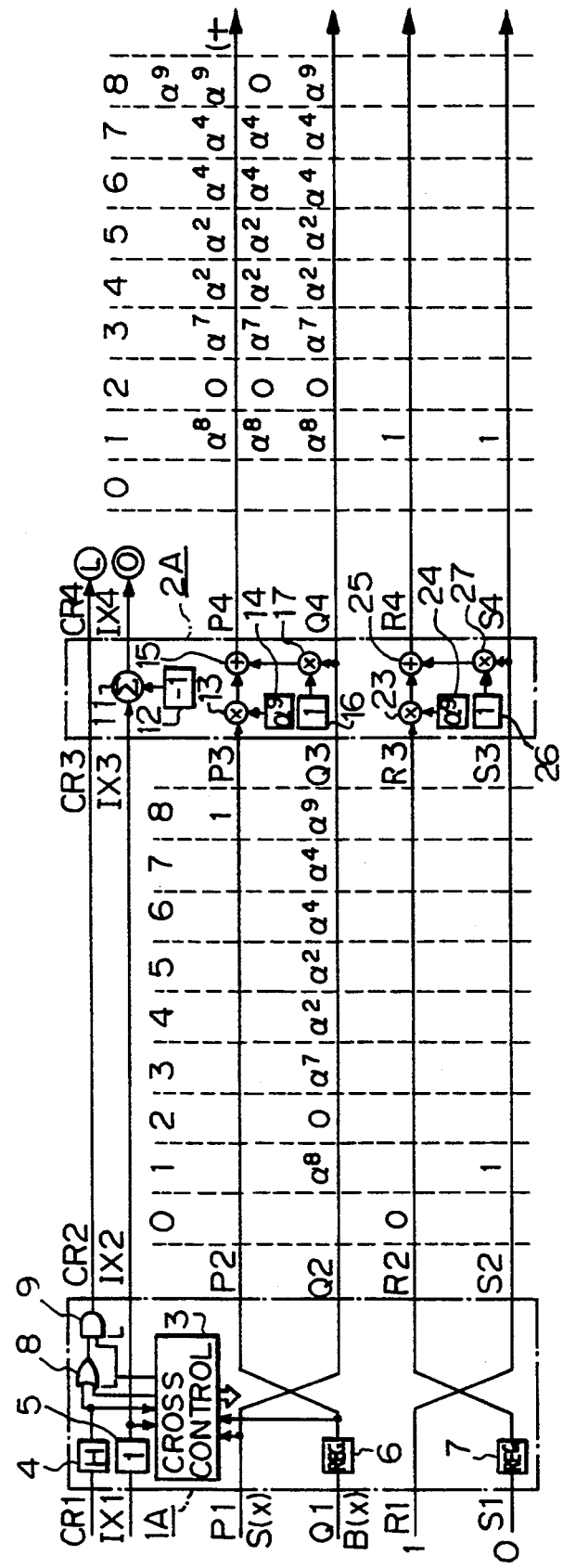

In step 33, because (CH=H), step 36 follows and then because the simultaneous input is executed, step 38 follows. In the operation represented at 38, the process to cross the data is performed. B(x) and S(x) are respectively input as the P and Q series in the arithmetic operating section, as shown in FIG. 9A. On the other hand, because the data series are crossed in step 38, ($CR_1$=H) is changed to ($CR_4$=L). In addition, in the arithmetic operating section 2A of FIG. 9A, the algorithm arithmetic operation is actually performed. The polynomial whose degree was reduced by 1 is output from the input polynomial P3 (the eighth degree). Therefore, the operation in which the flag IX indicative of the relative degree difference between the P and Q series was reduced by 1 is set to a new value of IX ($IX_4$) is performed.

Thus, as described above in the operation of the circuit of FIG. 9A, the processes in steps represented at 31, 32, 33, 36, 38, 43, and 44 are sequentially executed in accordance with the flowchart shown in FIG. 4. These operations are repeated until the conditions required to stop the arithmetic operation are satisfied.

Figure 9B:
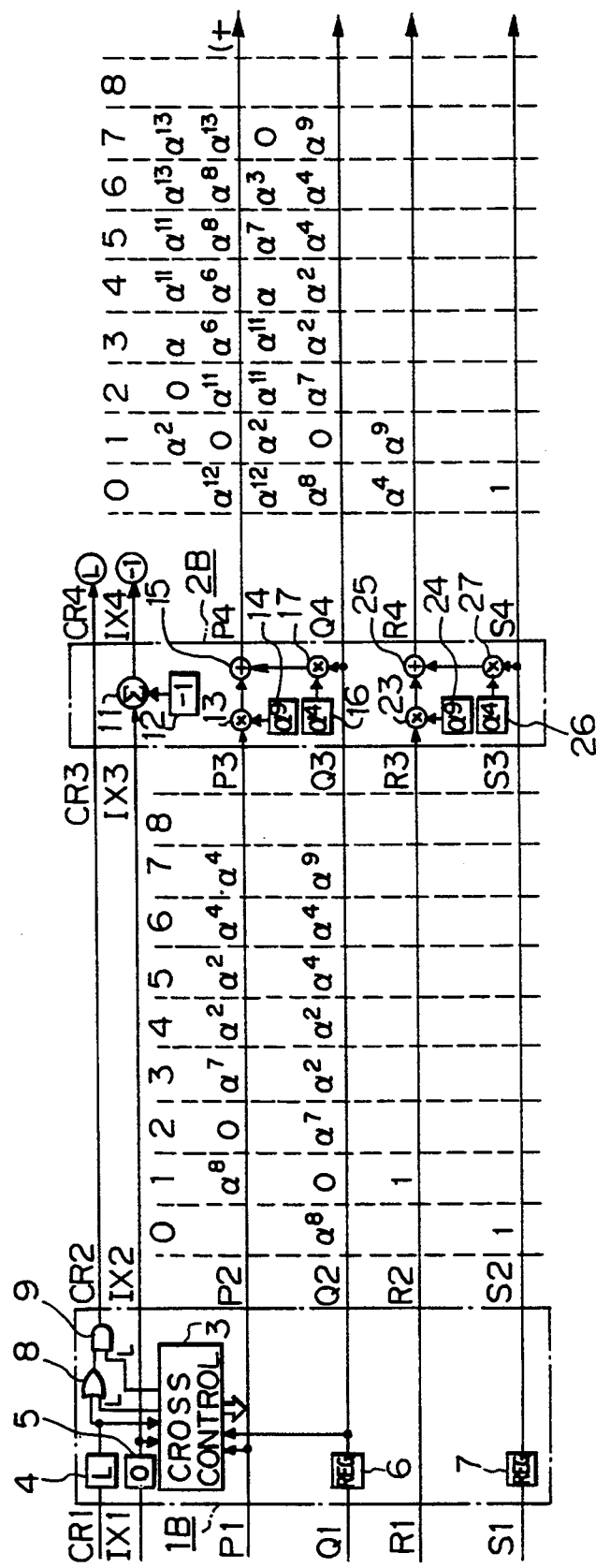

FIG. 9B shows the processes at the second stage at which the processes in steps 32, 33, 34, 41, and 44 are sequentially executed.

Figure 9C:
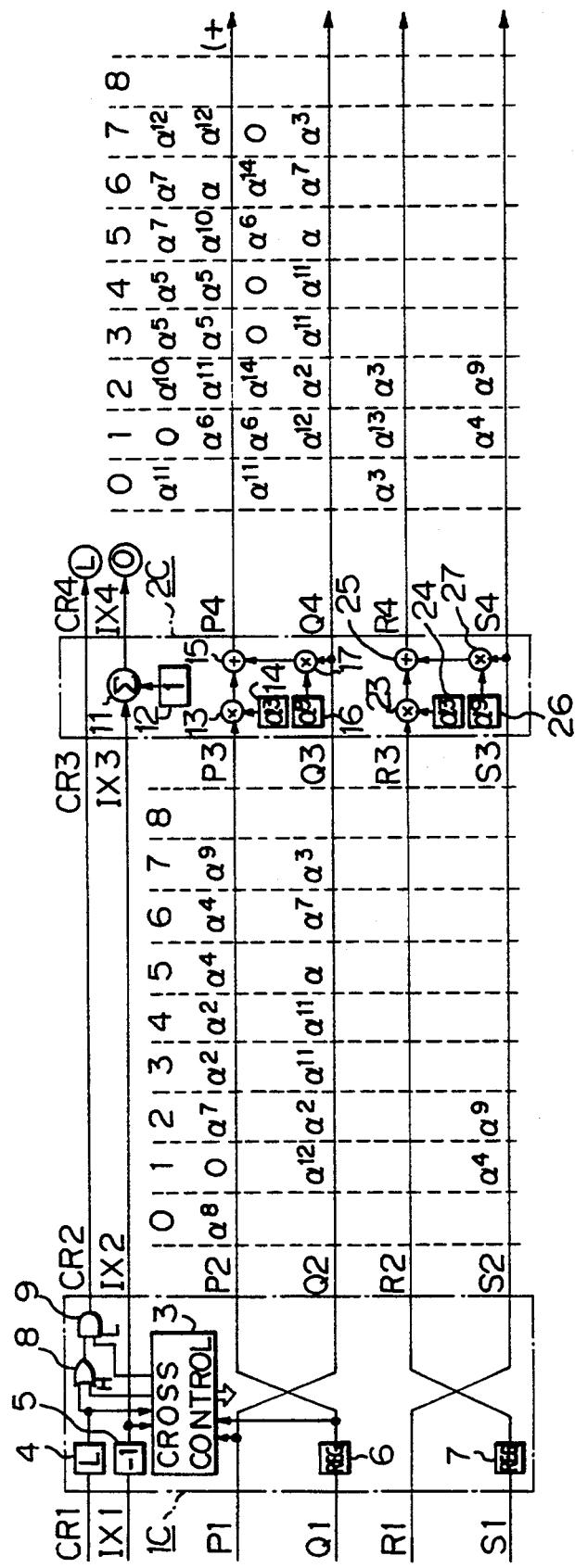

FIG. 9C shows the processes at the third stage at which the processes in steps 32, 33, 34, 41, and 44 are sequentially performed.

Figure 9D:
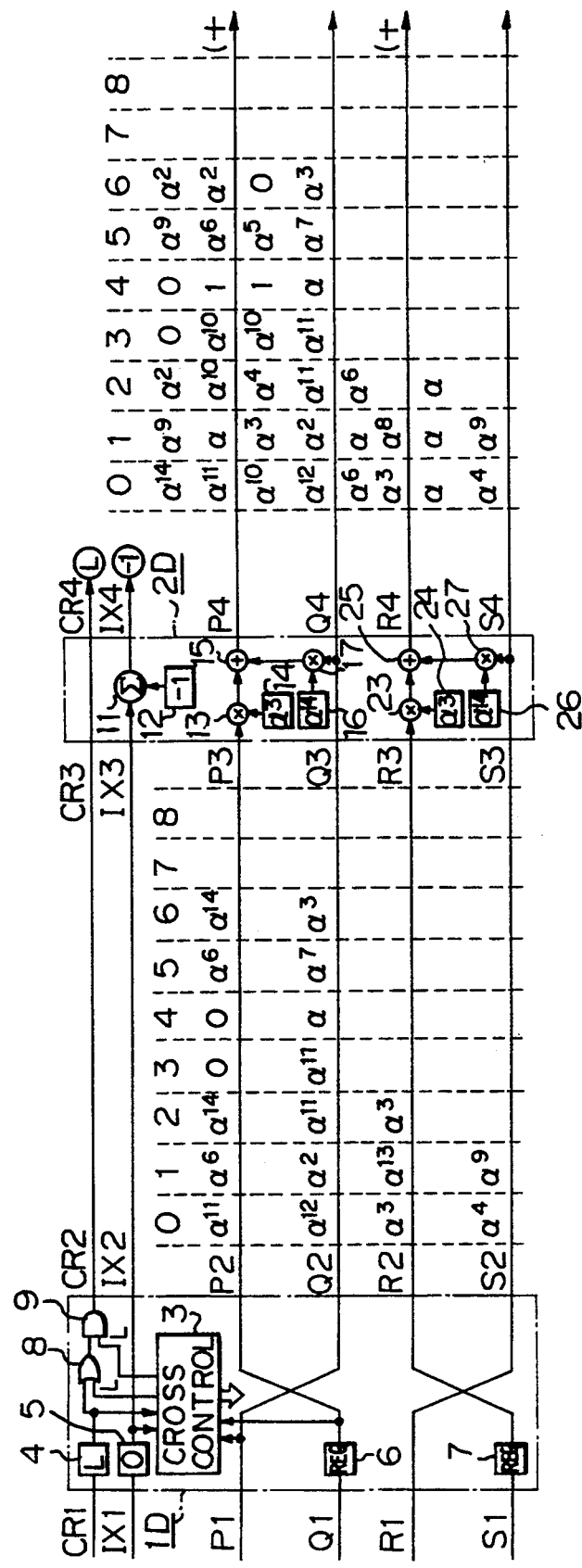

FIG. 9D shows the processes at the fourth stage at which the processes in steps 32, 33, 34, 41, and 44 are sequentially performed.

FIG. 9E shows the processes at the fifth stage at which the processes in steps 32, 33, 34, 35, 37, 39, and 41 are sequentially executed.

Figure 9F:
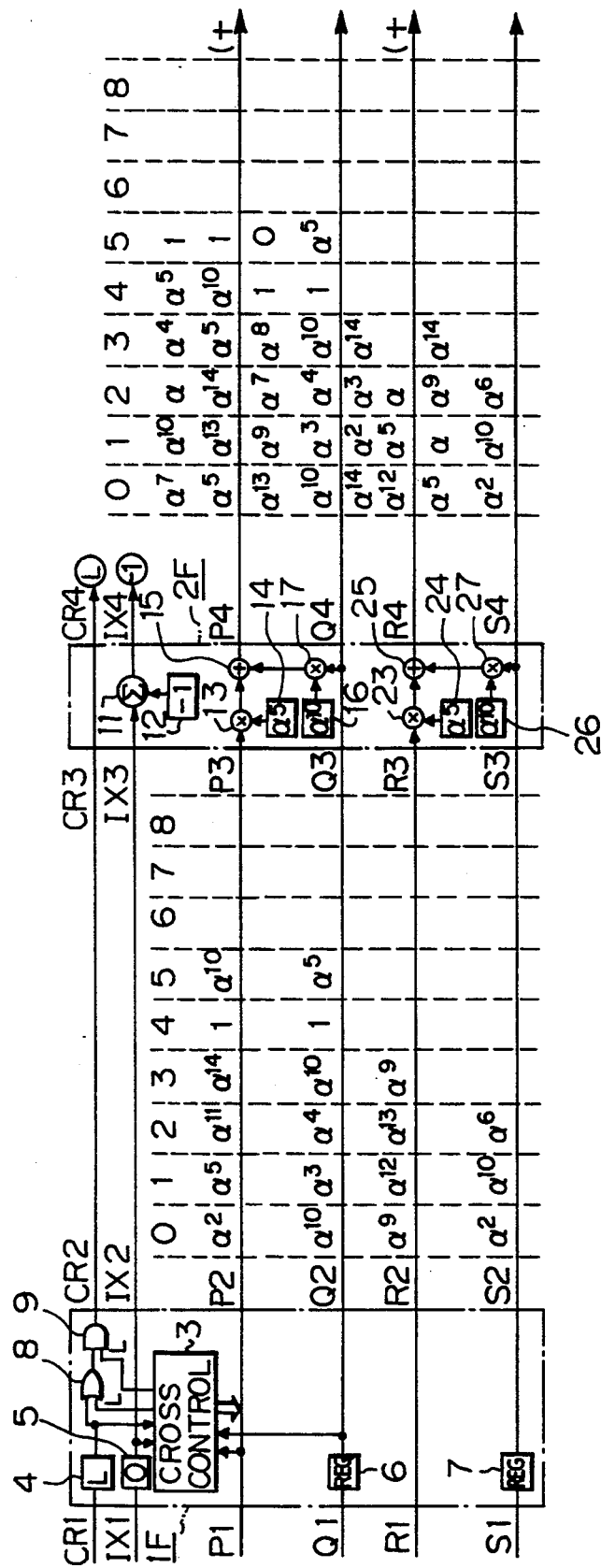

FIG. 9F shows the processes at the sixth stage at which the processes in steps 32, 33, 34, 41, 44 are sequentially performed.

Figure 9G:
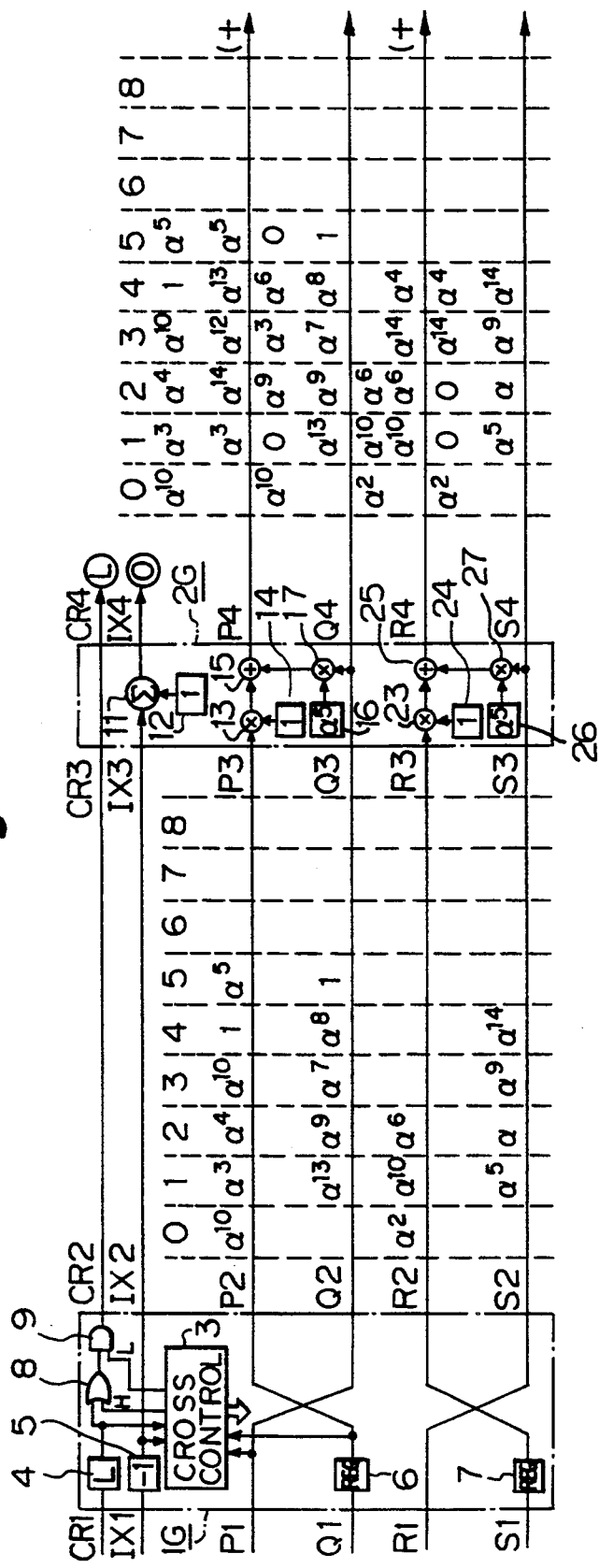

FIG. 9G shows the processes at the seventh stage at which the processes in steps 32, 33, 34, 35, 37, 39, and are sequentially executed.

Figure 9H:
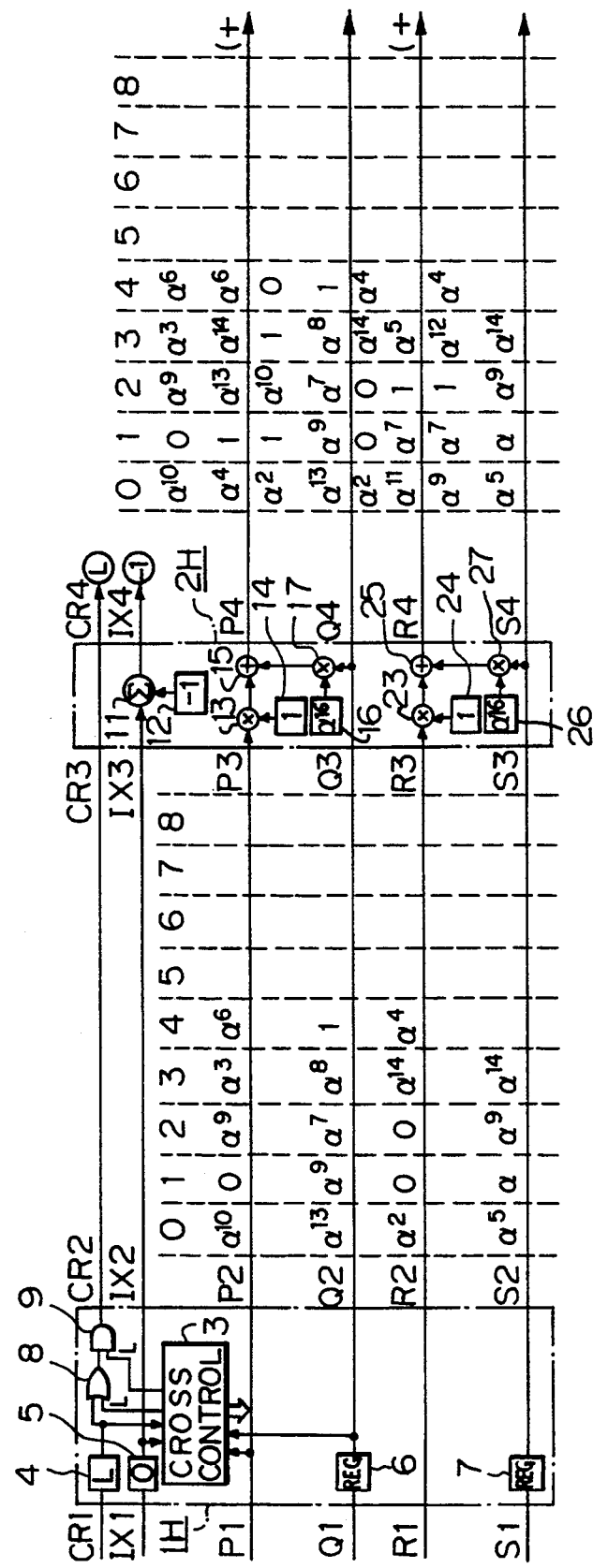

FIG. 9H shows the processes at the eighth stage at which the processes in steps 32, 33, 34, 41, and 44 are sequentially performed. Since the condition in step 44 is satisfied at this stage, step 45 to stop the arithmetic operation follows and the processes are finished.

Figure 7A:
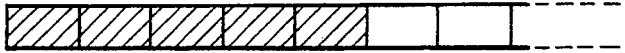
FIGS. 7A and 7B are a further example of errors in a data stream.
Figure 7B:
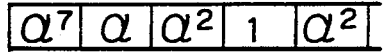

An example of a 5-error correction code, as represented by the hatched portions in FIG. 7A, is now explained with respect to the case where five symbol errors exist and the three upper coefficients of the syndrome polynomial are set to 0. The three upper coefficients are set to 0 in the case of the error pattern of $\alpha^7$, $\alpha$, $\alpha^2$, 1, $\alpha^2$, as shown in FIG. 7B. The coefficients of the syndrome polynomial S(x) are:

$$S_0 \alpha^3, S_1=\alpha^2, S_2=\alpha^{11}, S_3=\alpha^{13}, S_4=\alpha, S_5=\alpha^{12},$$
$$S_6=1\ S_7,\ S_8,\ S_9=0$$

The operations of the control section 1 and arithmetic operating section 2, when the present invention is applied to the foregoing example, are as shown in FIGS. 10A to 10J. As in the operation of the system shown in FIGS. 9A to 9H, the processes are executed sequentially from FIG. 10A to FIG. 10B, FIG. 10C, etc.

In the process performed by the circuit of FIG. 10A in accordance with the flowchart of in FIG. 4, the processes in steps 31, 32, 33, 36, 42, and 44 are sequentially executed.

Figure 10B:
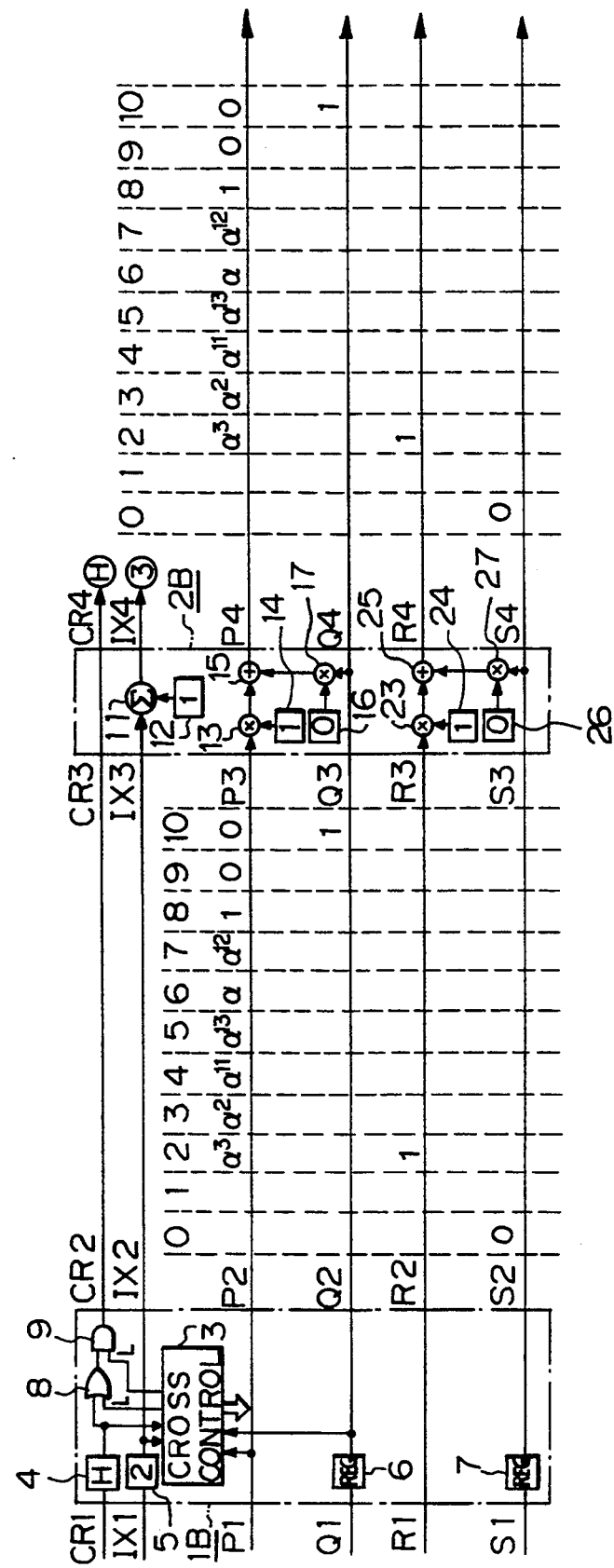

FIG. 10B shows the processes at the second stage at which the processes in steps 32, 33, 36, 42, and 44 are sequentially executed.

Figure 10C:
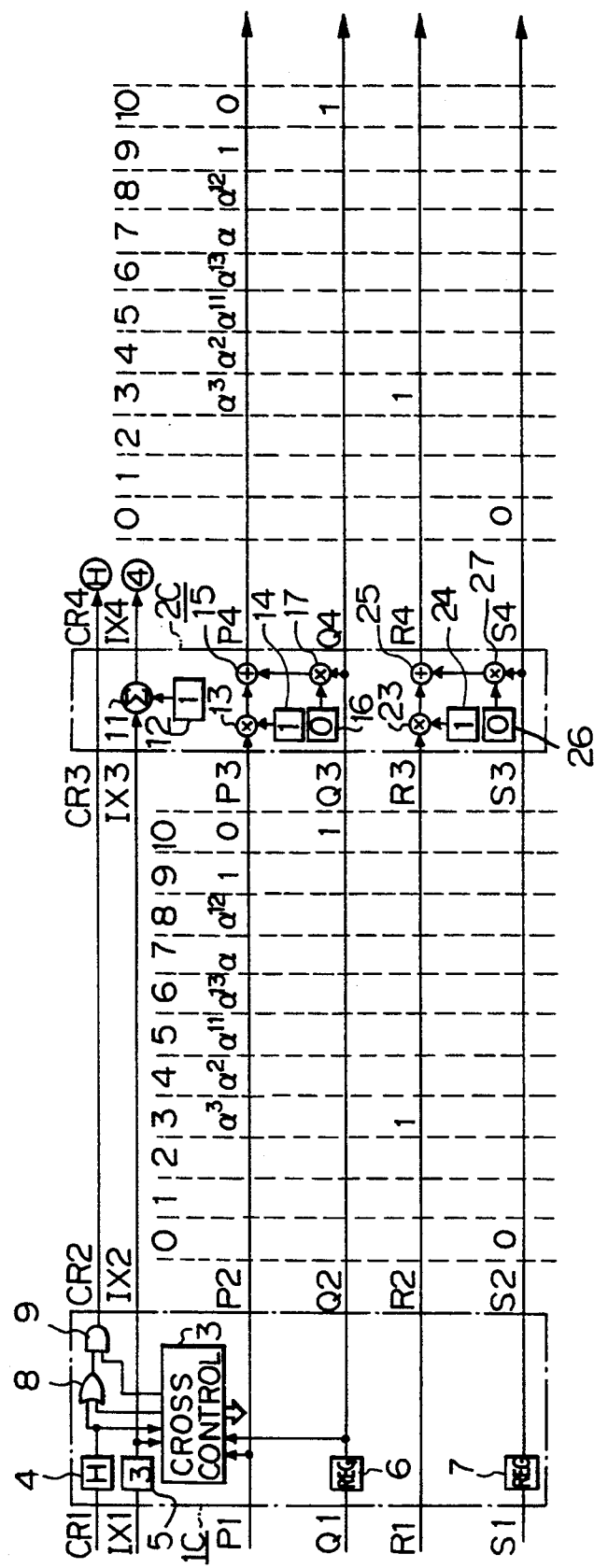

FIG. 10C shows the processes at the third stage at which processes in steps 32, 33, 36, 42, and 44 are sequentially performed.

Figure 10D:
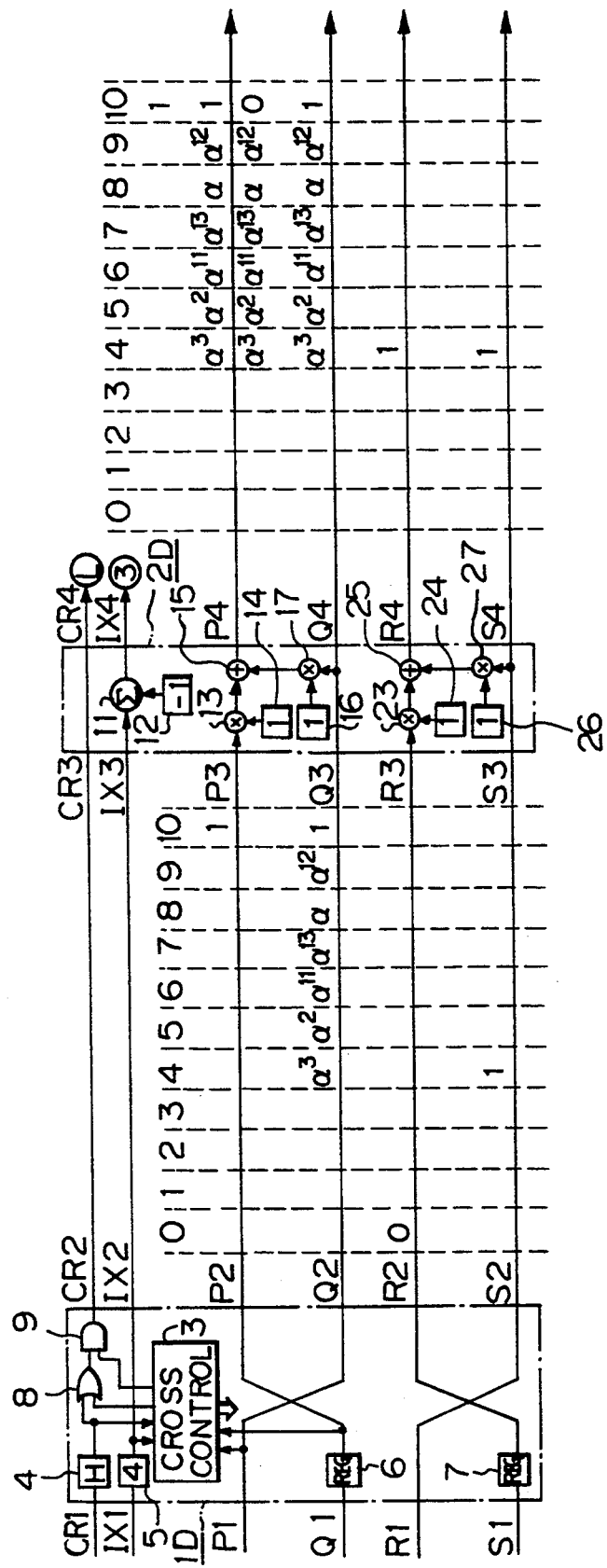

FIG. 10D shows the processes at the fourth stage at which the processes in steps 32, 33, 36, 38, 43, 44 are sequentially performed.

Figure 10E:
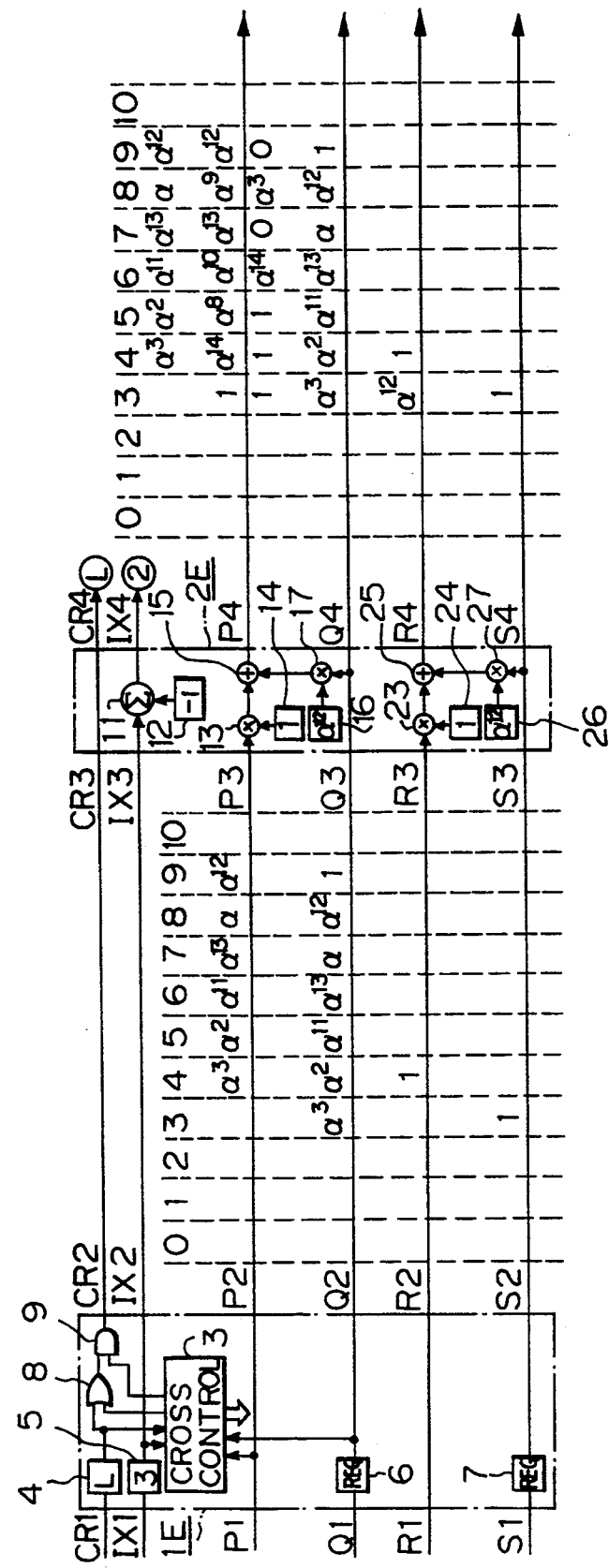

FIG. 10E shows the processes at the fifth stage at which the processes in steps 32, 33, 34 41, and 44 are sequentially executed.

Figure 10F:
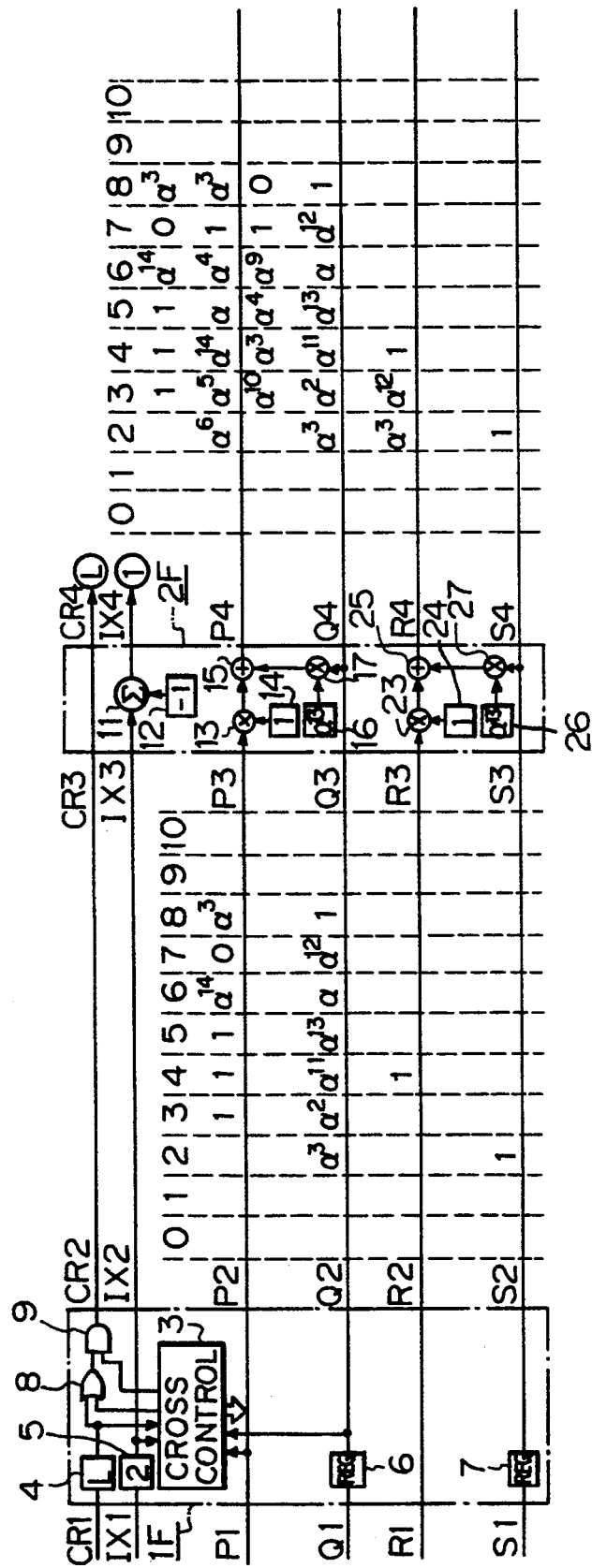

FIG. 10F shows the processes at the sixth stage at which the processes in steps 32, 33, 34, 41, and 44 are sequentially performed.

Figure 10G:
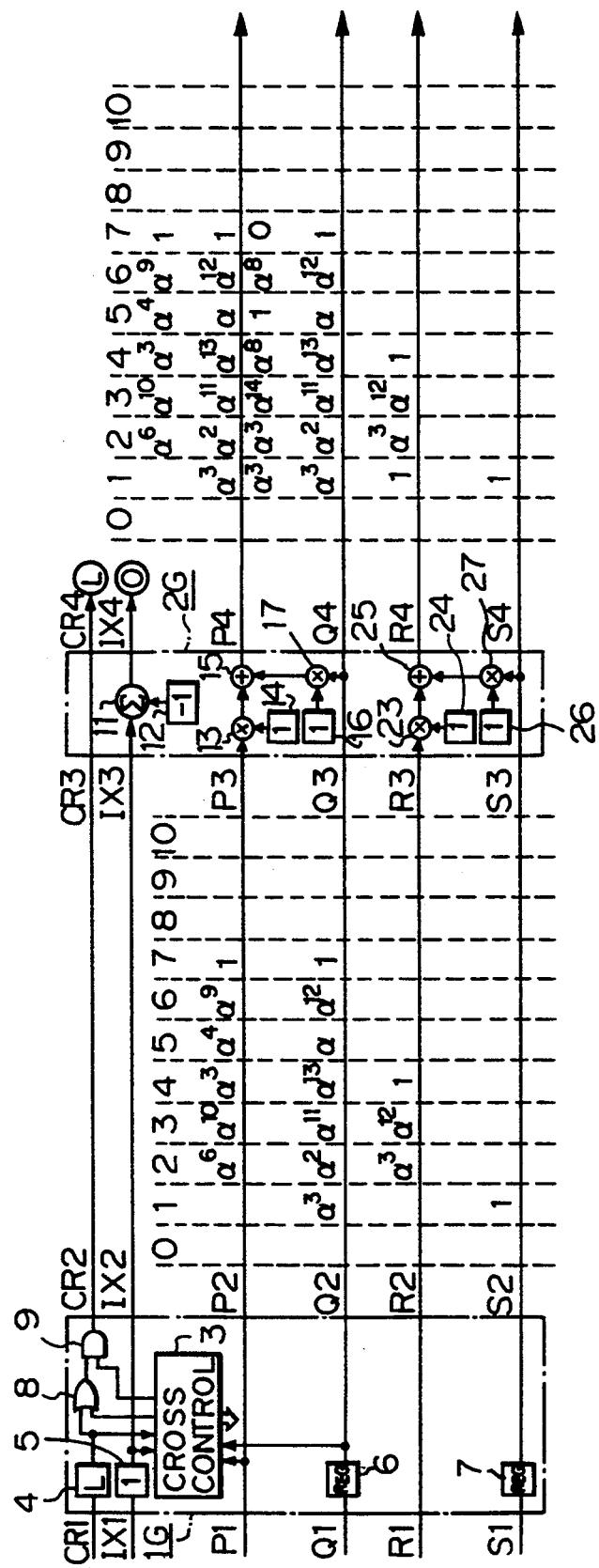

FIG. 10G shows the processes at the seventh stage at which the processes in steps 32, 33, 34, 41, and 44 are sequentially executed.

Figure 10H:
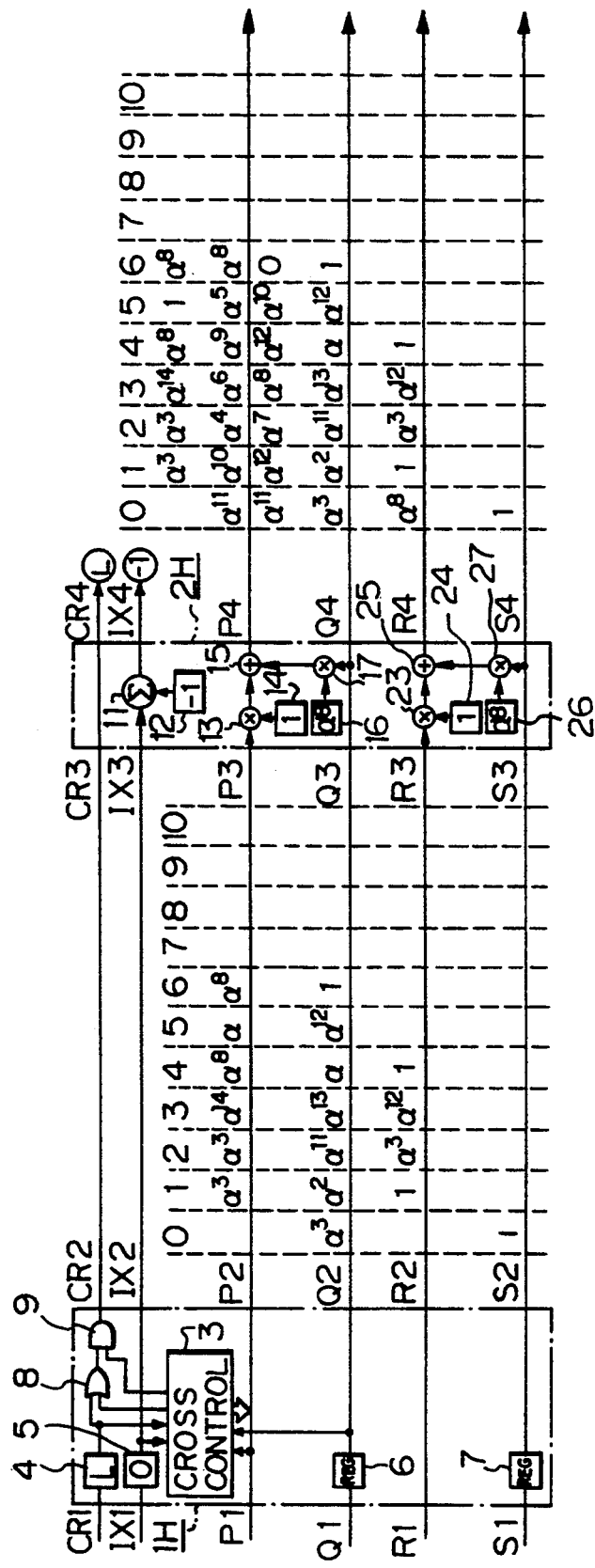

FIG. 10H shows the processes at the eighth stage at which the processes in steps 32, 33, 34, 41, and 44 are sequentially performed.

Figure 10I:
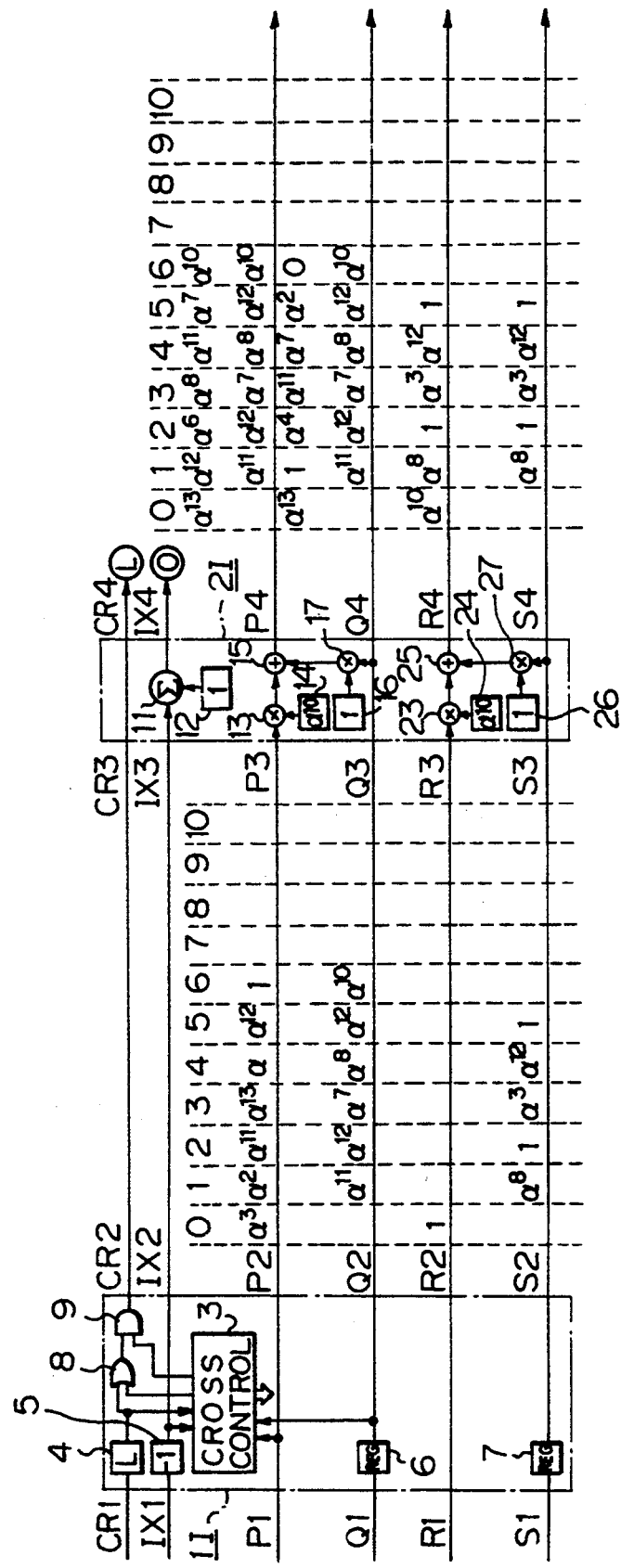

FIG. 10I shows the processes at the ninth stage at which the processes in steps 32, 33, 34, 35, 37, 39, and 44 are sequentially executed.

Figure 10J:
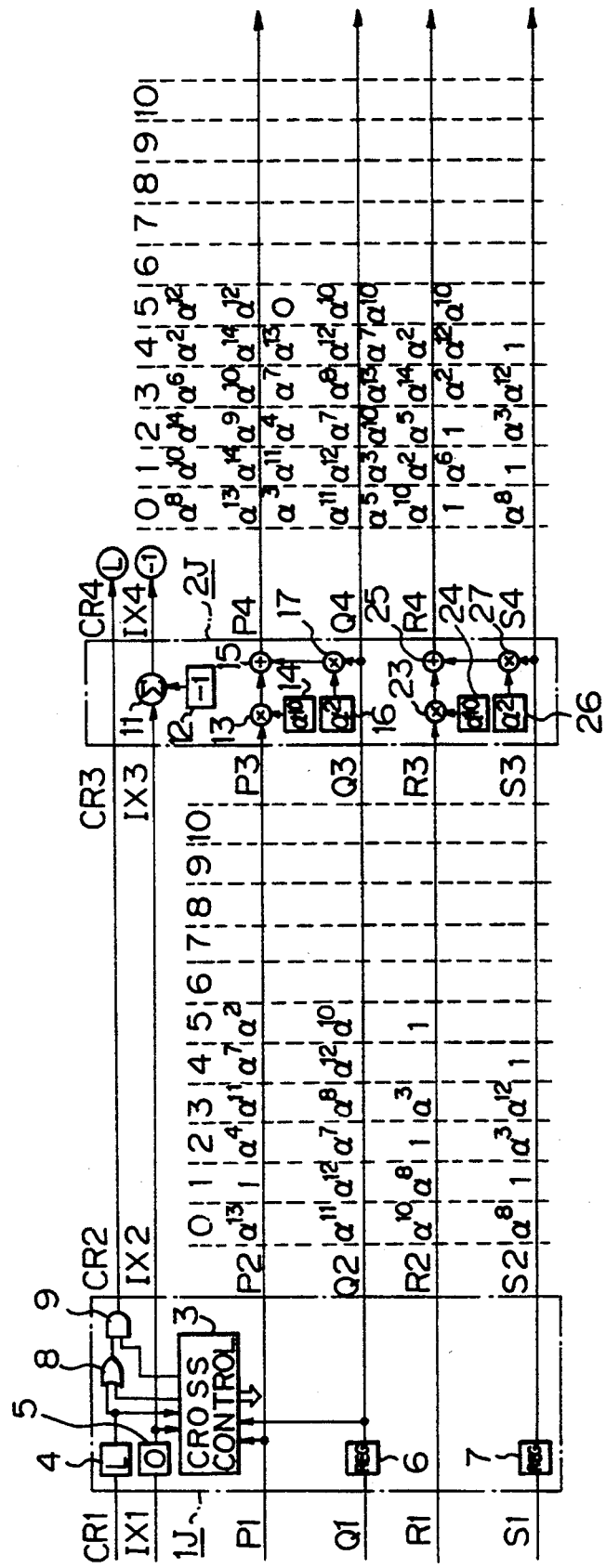

FIG. 10J shows the processes at the tenth stage at which the processes in steps 32, 33, 34, 41, and 44 are sequentially performed. Because the condition of operation 44 is satisfied at this stage, step 45 to stop the arithmetic operation follows and the processes are finished.

The example in which all of the foregoing three upper coefficients are set to 0 differs from the example of the 3-error correction code described previously. More specifically, because all of the three upper coefficients are 0, when the series of $(B(x)=x^{10})$ is merely delayed by one clock, the highest degree coefficients of the P and Q series cannot be loaded into the register at the same time. This is so because since the degree of the syndrome polynomial $S(x)$ is six, $B(x)$ needs to be delayed by four stages. These delaying processes are executed by data control sections 1A, 1B, 1C, and 1D. At this time, the processes in steps 33, 36, and 42 in the flowchart of FIG. 4 are executed. By repeating these delaying processes three times and crossing the data at the fourth time, the algorithm arithmetic operation is performed. The flag CR is set to H until this crossing process is executed.

On the other hand, the relative degree difference of two polynomials increases until it reaches four. When the arithmetic operation is not performed (NO OPERATION), 1 ($=\alpha^0$) and 0 are loaded into the registers 14, 16, 24, and 26, respectively. Further, the data lines are not crossed until the eighth stage of $(IX=-1)$ after the start of the actual arithmetic operation in the data control section ID at the fourth stage.

Figure 8A:
FIGS. 8A and 8B are still another example of errors in a data stream.
Figure 8B:
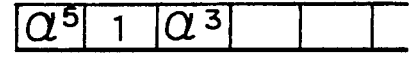
Figure 11A:
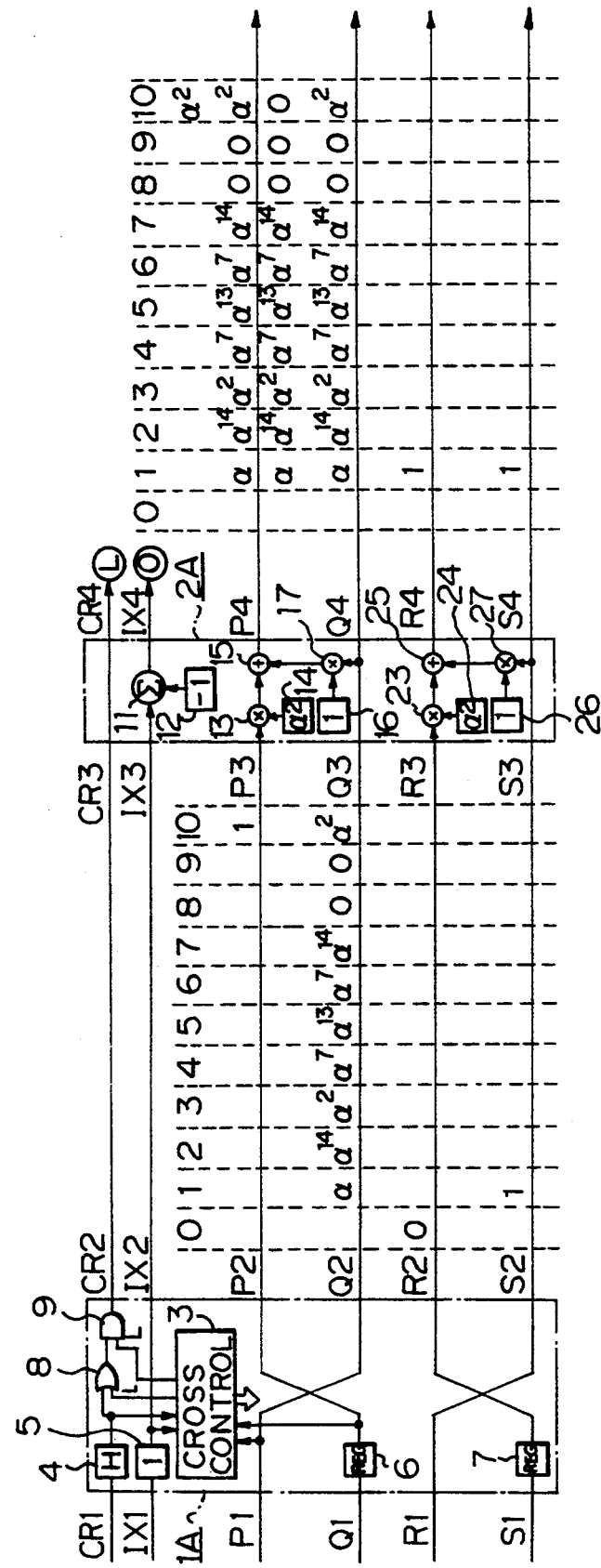
FIGS. 11A to 11F are schematic diagrams useful in explaining a fundamental operating unit according to the present invention.
Figure 11B:
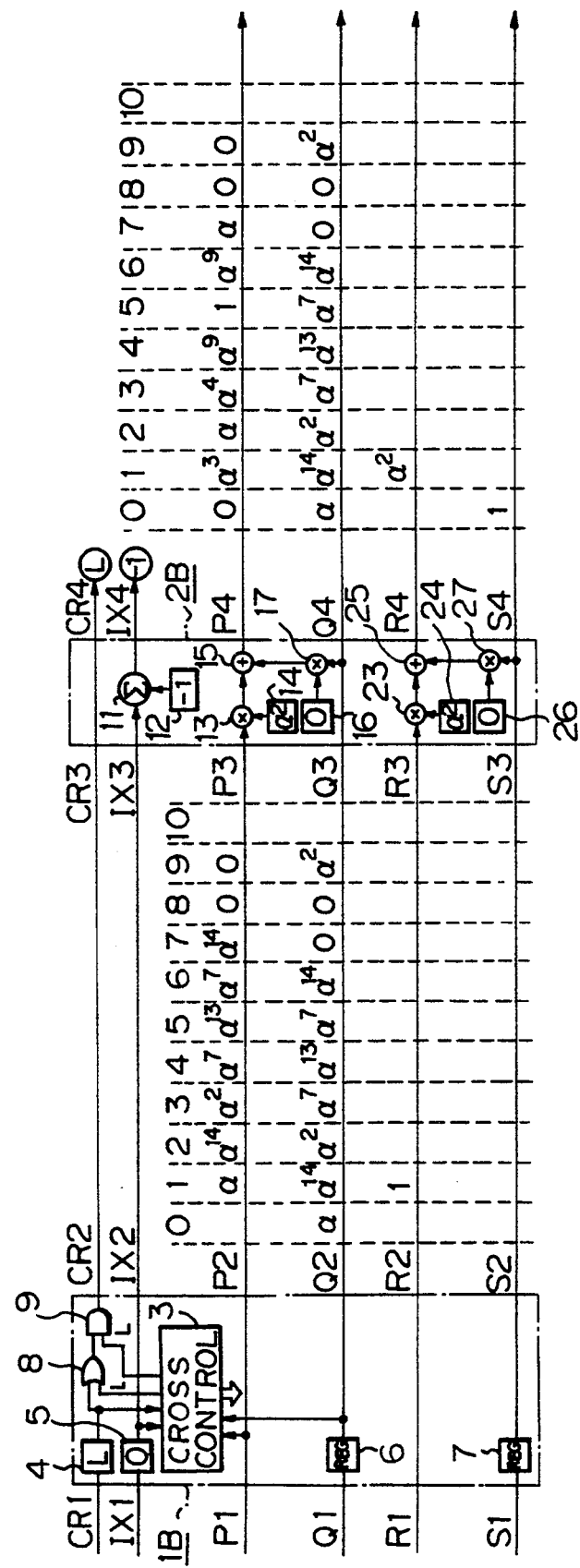
Figure 11C:
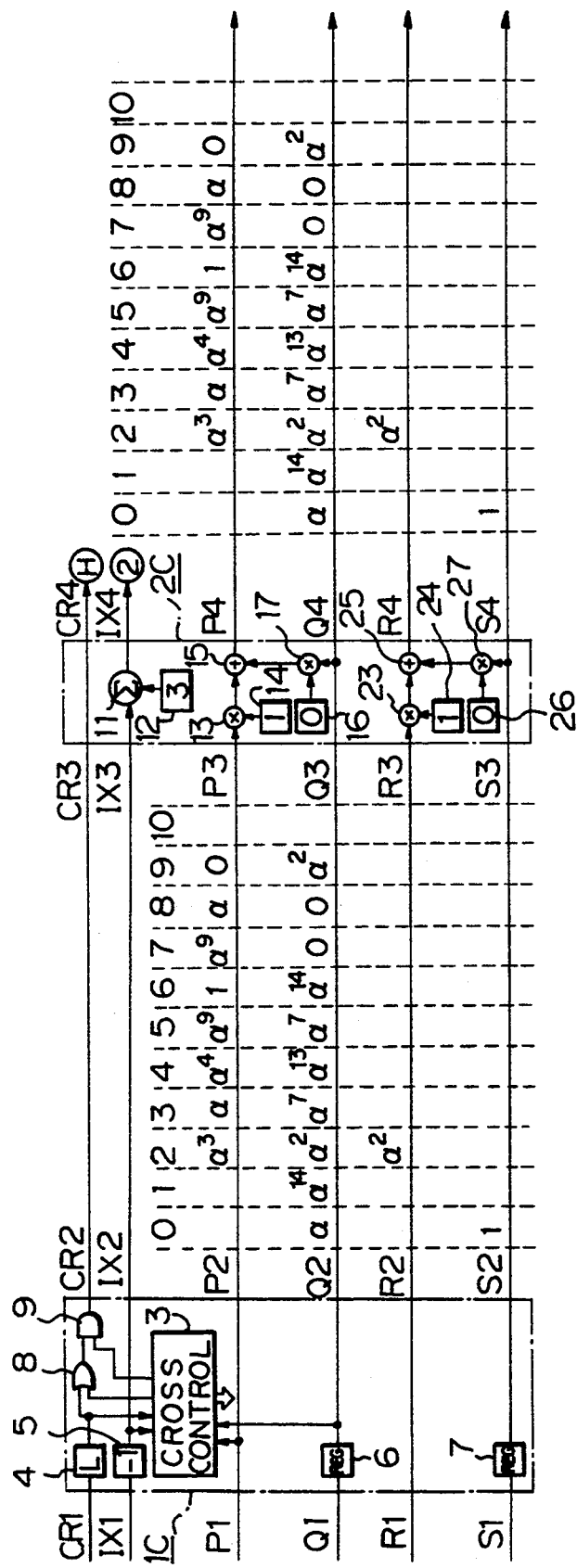
Figure 11D:
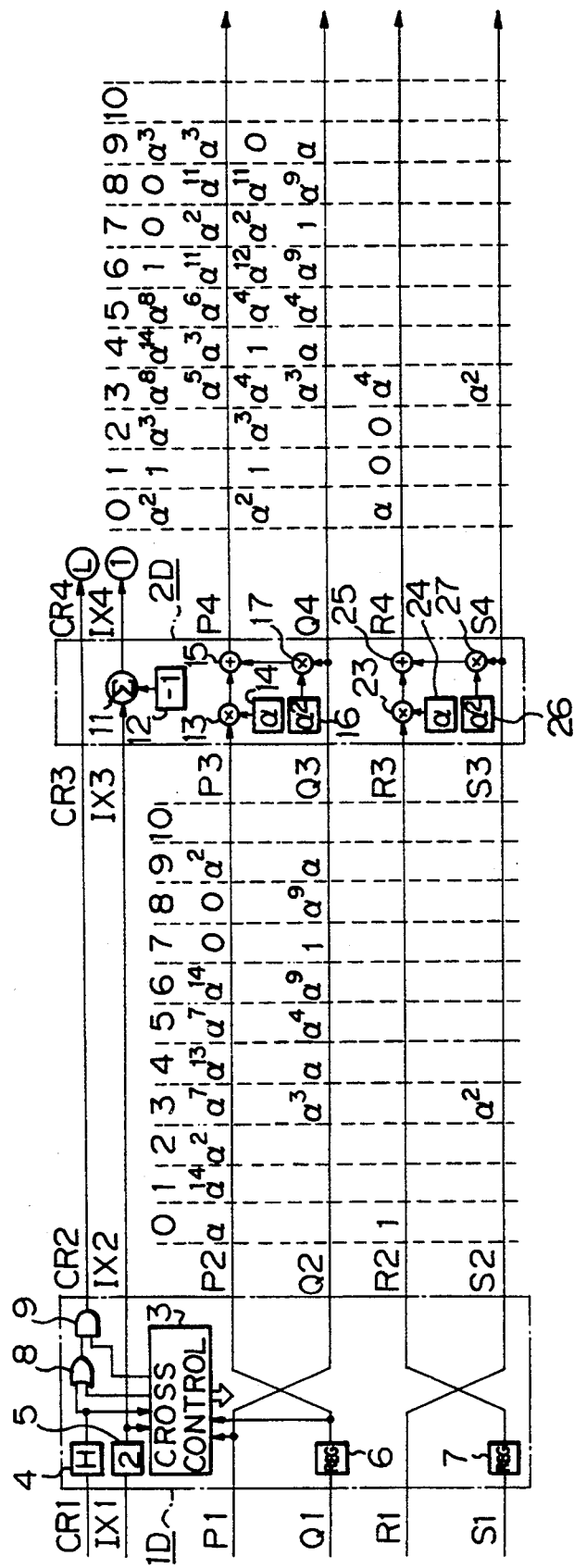
Figure 11E:
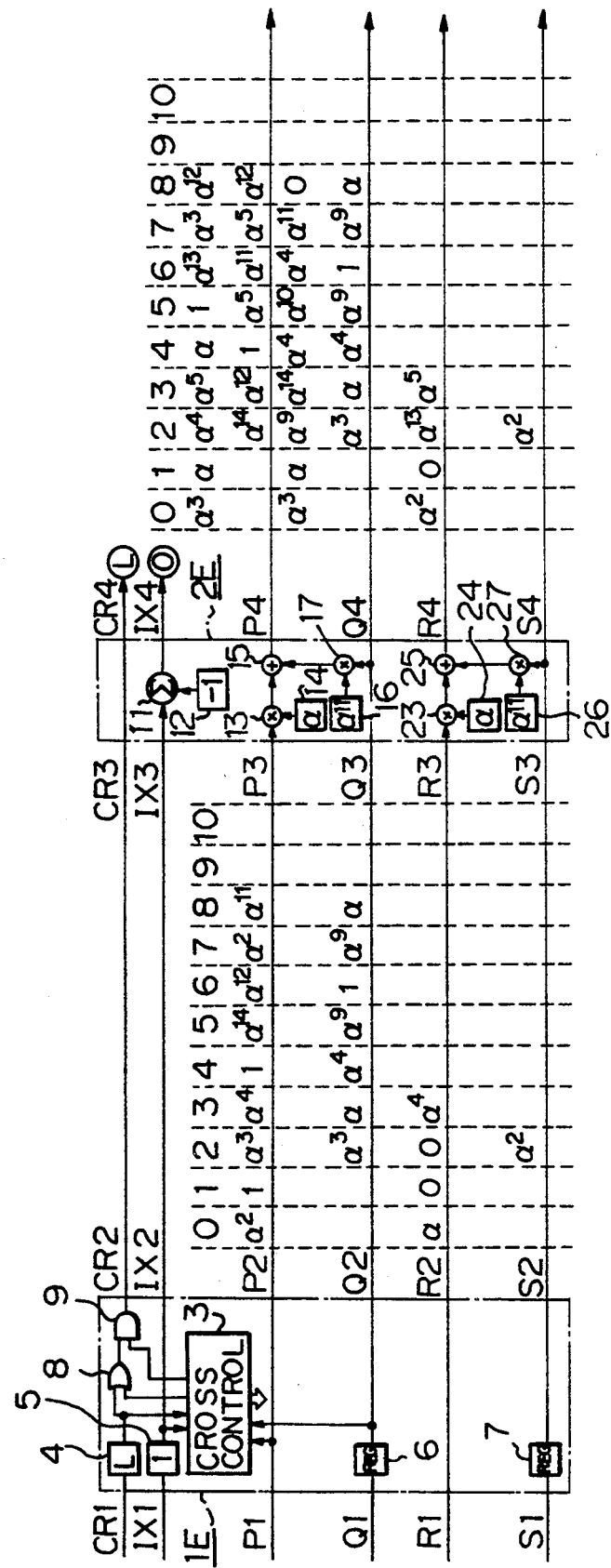
Figure 11F:
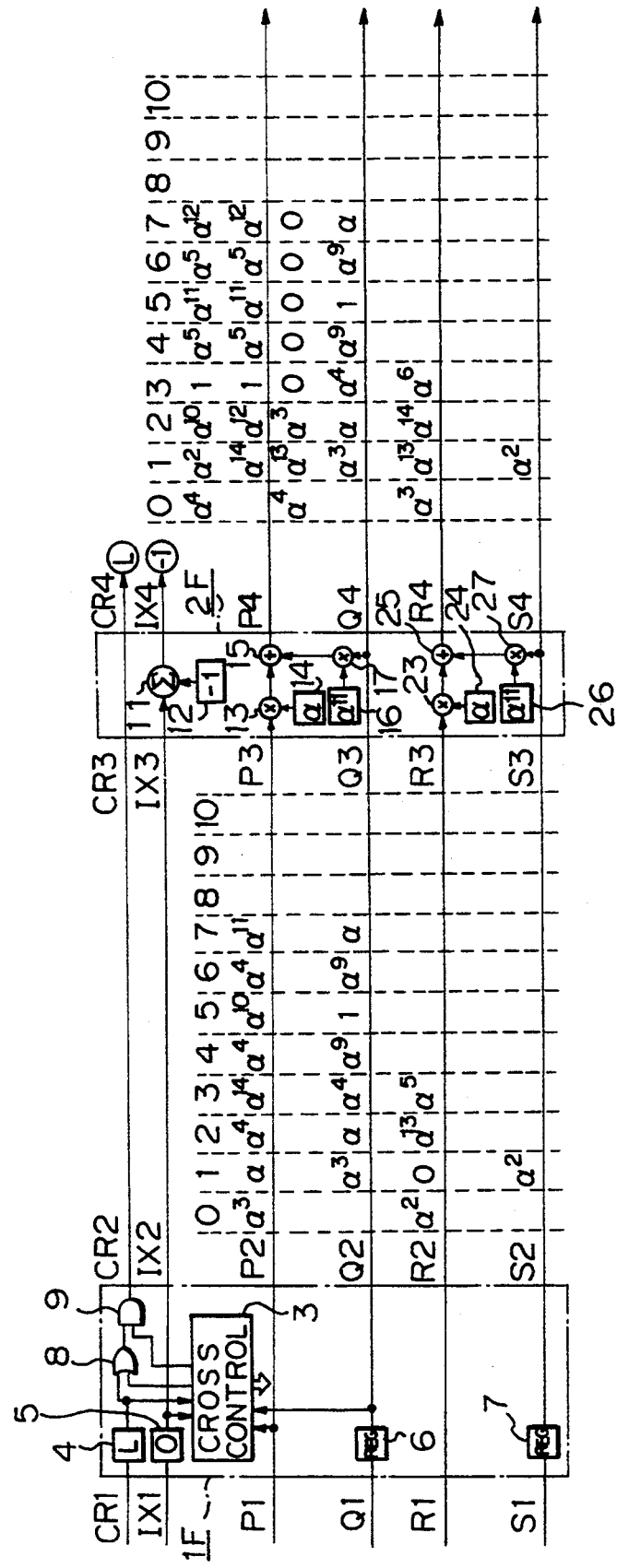

Another example of 5-error correction code is described in relation to FIGS. 8A–8B and 11A–11F. As shown by the hatched portions in FIG. 8A, three symbol errors exist and the two second and third upper coefficients of the syndrome polynomial are set to 0. The two upper coefficients are set to 0 in the case of the error pattern of $\alpha^5$, 1, and $\alpha^3$ as shown in FIG. 8B. The coefficients of the syndrome polynomial $S(x)$ are:

$S_0=\alpha$, $S_1=\alpha^{14}$, $S_2=\alpha^2$, $S_3=\alpha^7$, $S_4=\alpha^{13}$, $S_5=\alpha^7$, $S_6=\alpha^{14}$, $S_7$ and $S_8=0$, $S_9=\alpha^2$ The operations of the control section 1 and arithmetic operating section 2 when the invention is applied to the foregoing example are shown in FIGS. 11A–11F. In a manner similar to FIGS. 9A to 9H and 10A to 10J, the processes are executed sequentially from FIG. 11A to FIG. 11B, FIG. 11C, ... FIG. 11F.

In FIG. 11A, the processes of the steps at 31, 32, 3, 36, 38, 43, and 44 are sequentially executed in accordance with the flowchart shown in FIG. 4.

FIG. 11B shows the processes at the second stage at which the processes in steps 32, 33, 34, 41, and 44 are sequentially performed.

FIG. 11C shows the processes at the third stage at which the processes in steps 32, 33, 34, 35, 40, and 44 are sequentially performed.

FIG. 11D shows the processes at the fourth stage at which the processes in steps 32, 33, 36, 38, 43, and 44 are sequentially performed.

FIG. 11E shows the processes at the fifth stage at which the processes in steps 32, 33, 34, 41, and 44 are sequentially performed.

FIG. 11F shows the processes at the sixth stage at which the processes in steps 32, 33, 34, 41, and 44 are sequentially performed.

Because the condition in step 44 is satisfied at this stage, step 45 to stop the arithmetic operation is executed and the processes are finished.

In the foregoing example attention is directed to the operation of the data control section 1C at the third stage in FIG. 11C. Since $(IX=-1)$, the cross control of the data control section IC is performed so as to set the signal fed to OR gate 8 to the high level (H). This means that even when $(CR_1=L)$, it is necessary to cross the data lines at some position after this stage. Therefore, a check is made to see if it is possible to cross in the data control section 1C or not. For this purpose, the polynomial series in which the delay of one clock is added for the Q series and the polynomial series of the P series are compared, thereby deciding whether the highest degree coefficients are simultaneously loaded into the register or not. In this example, when the highest degree coefficients of the Q series is $\alpha^2$, the P series is still 0. Therefore, since in the data control section 1C, it is impossible to cross, the signal to AND gate 9 is set to H to set the Flag ($CR_4=H$), thereby transferring the flag so as to cross at the next and subsequent stages. At this time, the contents of registers 14 and 24 are set to 1 and the contents of registers 16 and 26 are set to 0 so as not to perform the arithmetic operating processes.

Further, in the arithmetic operating section 2C at the third stage of FIG. 11C, the process to increase the flag IX by (+3) is performed. When the cross is performed when $(IX=-1)$, it is generally sufficient to execute a process to increase the flag IX by (+1). On the other hand, even when the highest degree coefficients cannot be loaded and the arithmetic operating section is made inoperative, 1 is added to IX. In the arithmetic operating section 2C in FIG. 11C at the third stage in the foregoing example, the foregoing two situations simultaneously occur, so that it is considered that it is sufficient to add 2 to the flag IX. Nevertheless, it is generally necessary to add 3.

Figure 12:
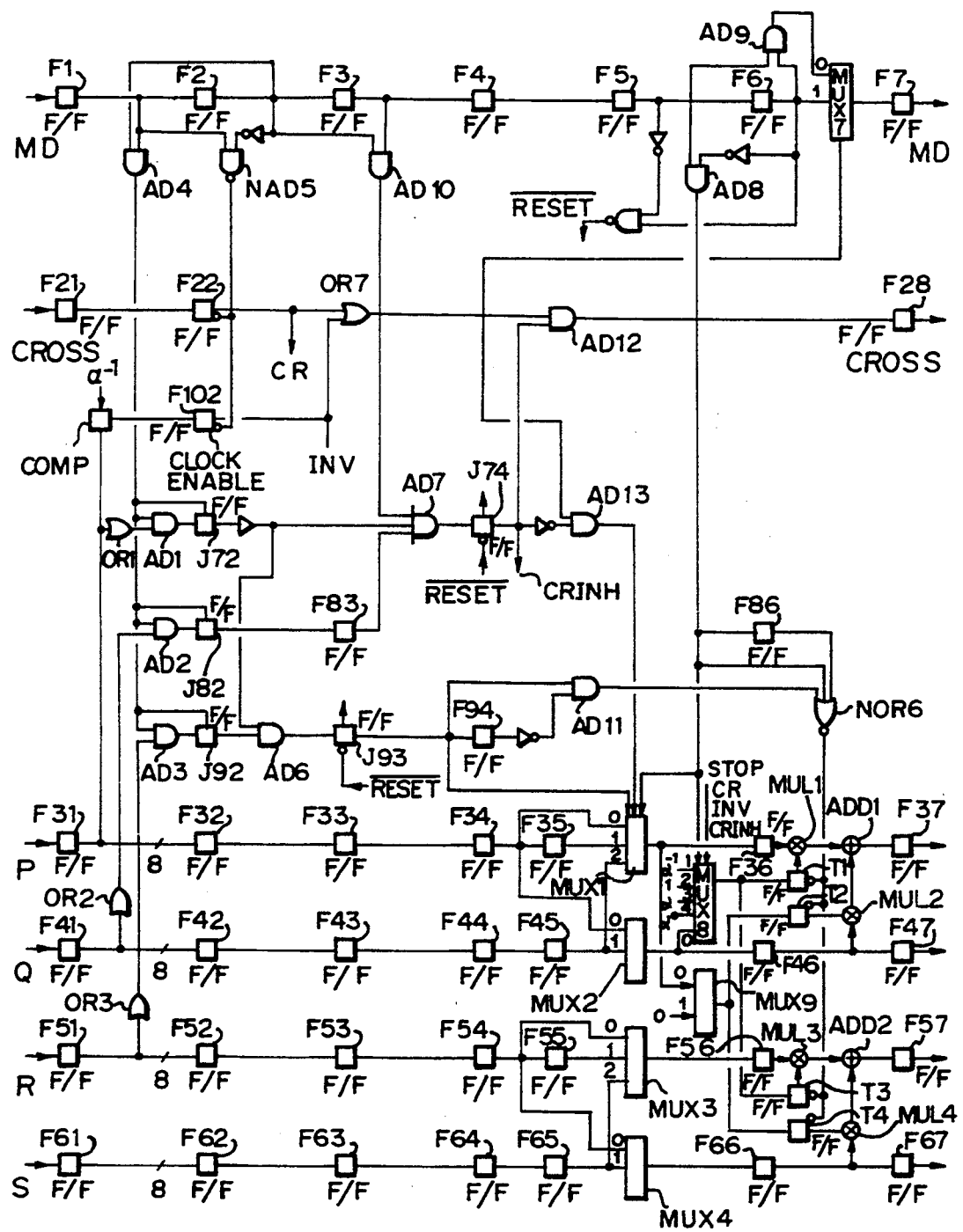
FIG. 12 is a circuit diagram of an operable embodiment of the present invention.

An example of a practical circuit embodiment of the algorithm arithmetic operation is shown in FIG. 2. In FIG. 12, a symbol of F00 denotes a D-type flip-flop; J00 indicates a JK-type flip-flop; and T1 to T4 represent clock enable D-type flip-flops. In comparing the fundamental construction of FIGS. 9A–9H, for example, with the circuit of FIG. 2, the OR gate 8 corresponds to OR gate OR7 and the AND gate 9 corresponds to AND gate AD7. On the other hand, multipliers 13 and 17 correspond to multipliers MUL1 and MUL2, adder 15 corresponds to adder ADD1, and registers 14 and 16 correspond to flip-flops T1 and T2. Similarly, multipliers 23 and 27 correspond to multipliers MUL3 and MUL4, adder 25 corresponds to adder ADD2, and registers 24 and 26 correspond to flip-flops T3 and T4.

Further, the flag CR is represented by CROSS in the circuit of FIG. 12.

A distinguishing point of the circuit arrangement of FIG. 12 relates to the handling of the flag IX. In the foregoing description, the flag IX has been independently transmitted and received among the stages, however, the flag IX generally needs about five bits and to obtain the maximum capability of the code, eight bits are usually necessary. Therefore, when the circuit of each stage is realized as an integrated circuit, for example, sixteen input and output pins are needed. This results in an increase in cost and is disadvantageous. On the other hand, although the ordinary adder 11 has been provided to add or subtract the flag IX, it is preferable that adder 11 be omitted.

Because of the foregoing reasons, in the arrangement of FIG. 12, the flag IX is added to the head of the P series, thereby reducing the number of input and output pins. Further, the additions and subtractions of the flag IX are executed by the multiplier MUL1 and the adder for the flag IX is omitted. That is, by considering that the addition of IX is $\alpha_{IX}$, the addition and subtraction of IX is replaced to the addition and subtraction of the index. In this case, to detect (IX=$-1$), a comparator COMP of eight bits is provided and when $\alpha^{-1}$ is detected the comparator COMP outputs a high level (H). An output signal of the comparator COMP is latched into a flip-flop F102 with a clock enable signal. A signal INV indicative of the attribute of the data series which has started is formed by this flip-flop F102 and the signal INV is input to the OR gate OR7. The CROSS signal from the preceding stage is supplied to the OR gate OR7 through flip-flops F21 and F22.

A mode signal MD in FIG. 12 has two roles, one of which is to signal the start of the input of the polynomial series, and the second of which is to indicate pulse width, that is, the maximum degree widths of P, Q, R, and S plus one clock for IX. Therefore, the data of the fundamental circuit is set and the mode is reset by the MD signal.

Flip-flops J72, J82, and J92 are JK flip-flops that produce the signals that are set to the high level H by only the number of degrees of the polynomials which are input to the P, Q, and R series. JK flip-flops are used so that even if the coefficients after the highest degree coefficient are set to "0" the output is not set to a low level L. By use of this output, the negative signal of flip-flop J72 and the output signal of flip-flop F83 that is obtained by delaying flip-flop J82 by one stage are compared, thereby discriminating whether the highest degree coefficients of the P and Q series can be simultaneously input to the registers T1 and T2 or not. This discrimination signal is the signal from AND gate AD7 and is once latched by flip-flop J74. If this signal is set to a high level H, it is expressed as CRINH to mean the inhibition of the cross (CROSS INHIBIT). In the flowchart of FIG. 4, this discrimination corresponds to the discriminating steps at 35 and 36, in which (CRINH=H) corresponds to NO and (CRINH=L) corresponds to YES in steps 35 and 36.

By comparing the negative output of flip-flop J72 and the output signal of flip-flop J92, the condition to stop the arithmetic operation as in step 34 of the flowchart of FIG. 4 is detected. If the output signal of flip-flop J93 is set to a high level H, all of the arithmetic operations are stopped and the number of delay stages of the P and R series can be also matched with that of the Q and S series. This control is performed by multiplexers MUX1 and MUX4, MUX8, and MUX9. On the other hand, when the maximum degree is only reduced by 1 in the algorithm arithmetic operation, the multiplexer MUX7 selects the 0 input, thereby reducing the pulse width of the mode signal MD by one clock.

FIGS. 13A to 13C represent in tabular form the selecting operations that are executed by the indicated data selectors, and in FIGS. 13A to 13C, the corresponding relations with the steps in the flowchart of FIG. 4 are also shown.

Figures 1, 14A:
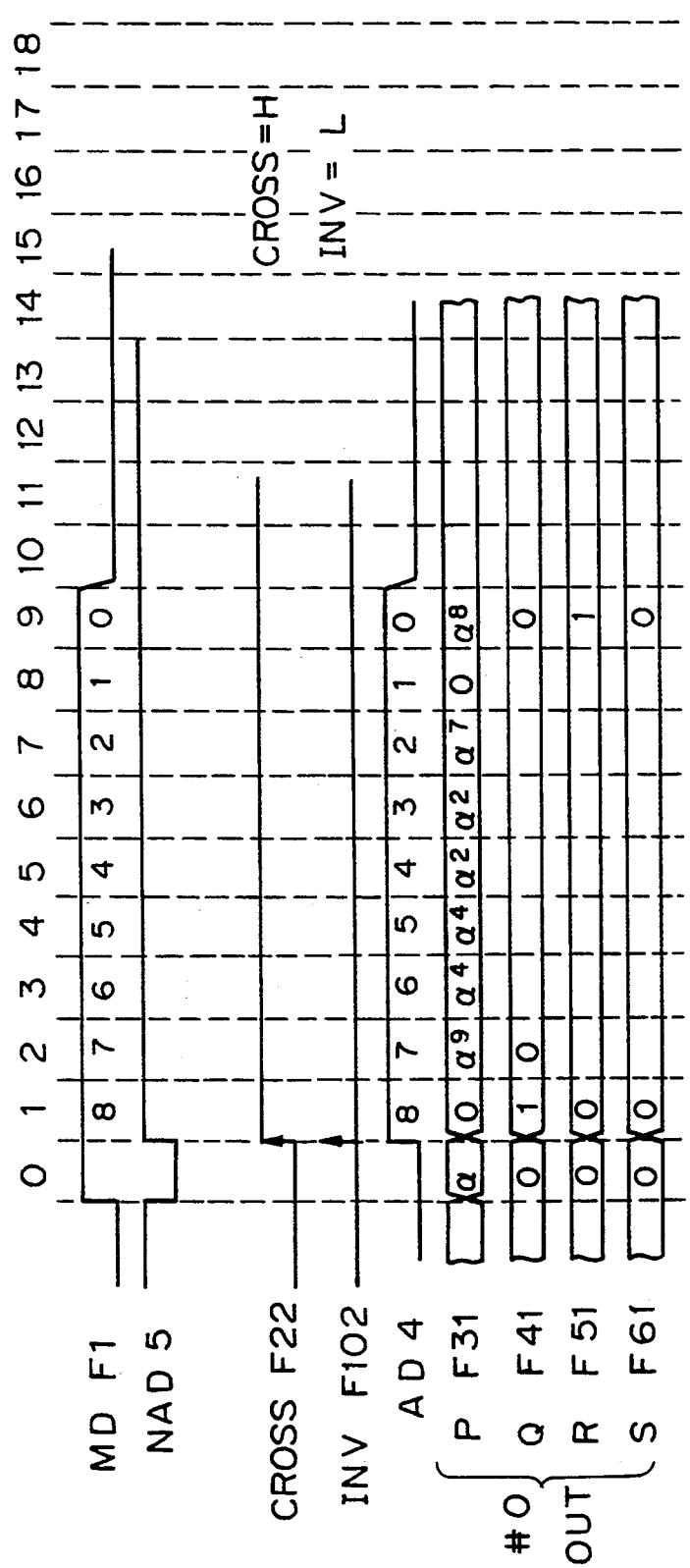
Figures 2, 14A:
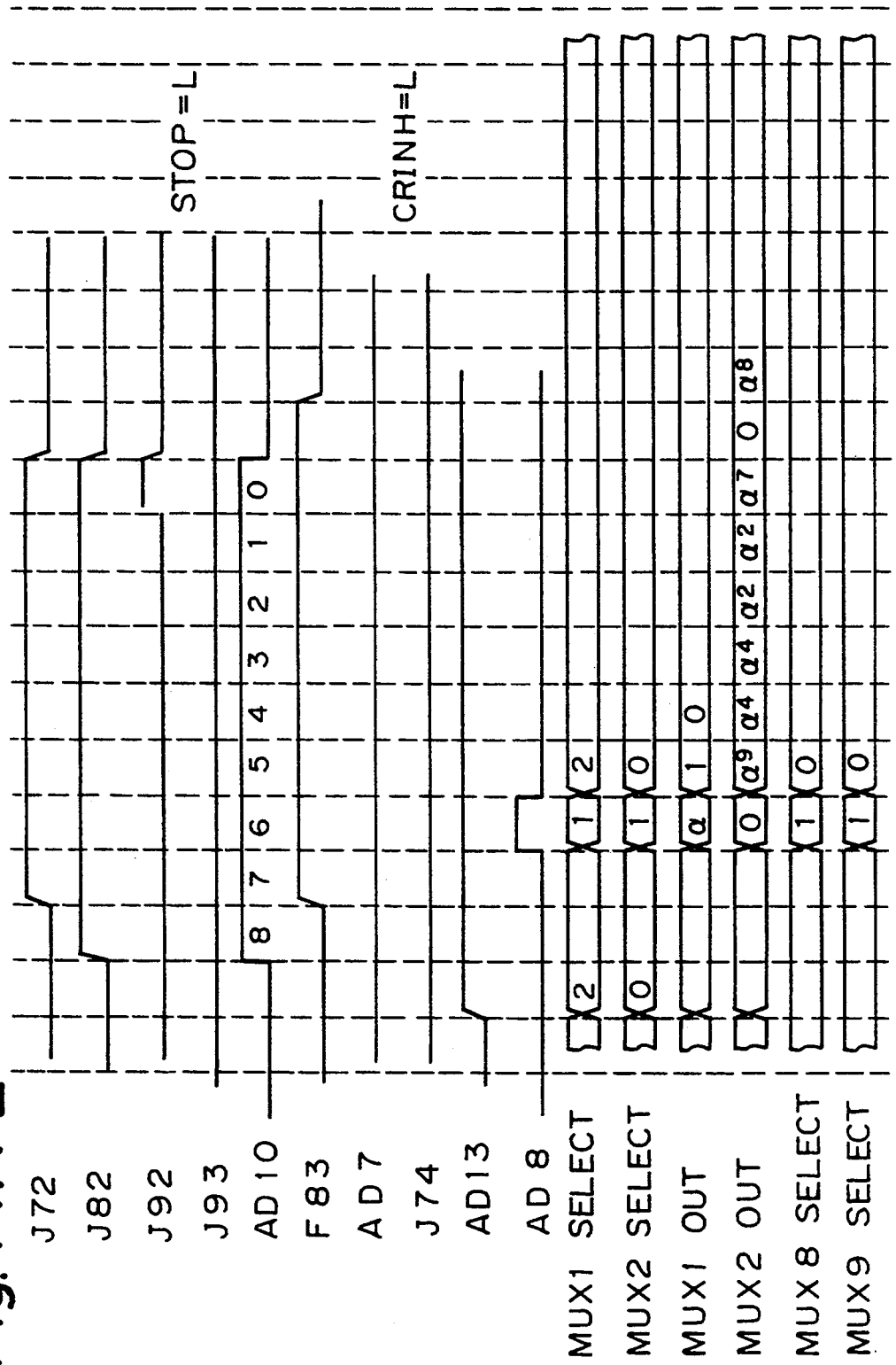
Figures 3, 14A:
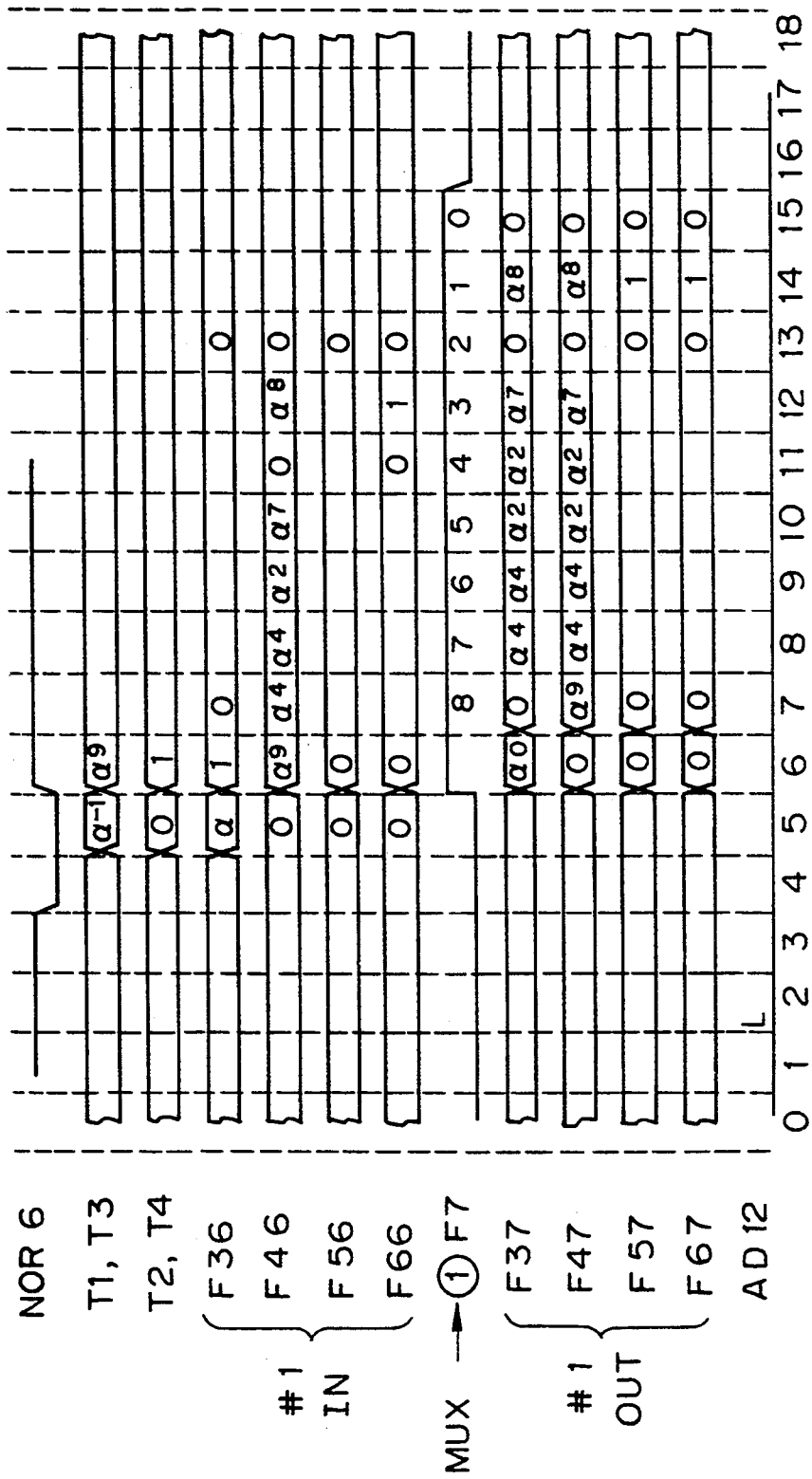
Figures 2, 14B:
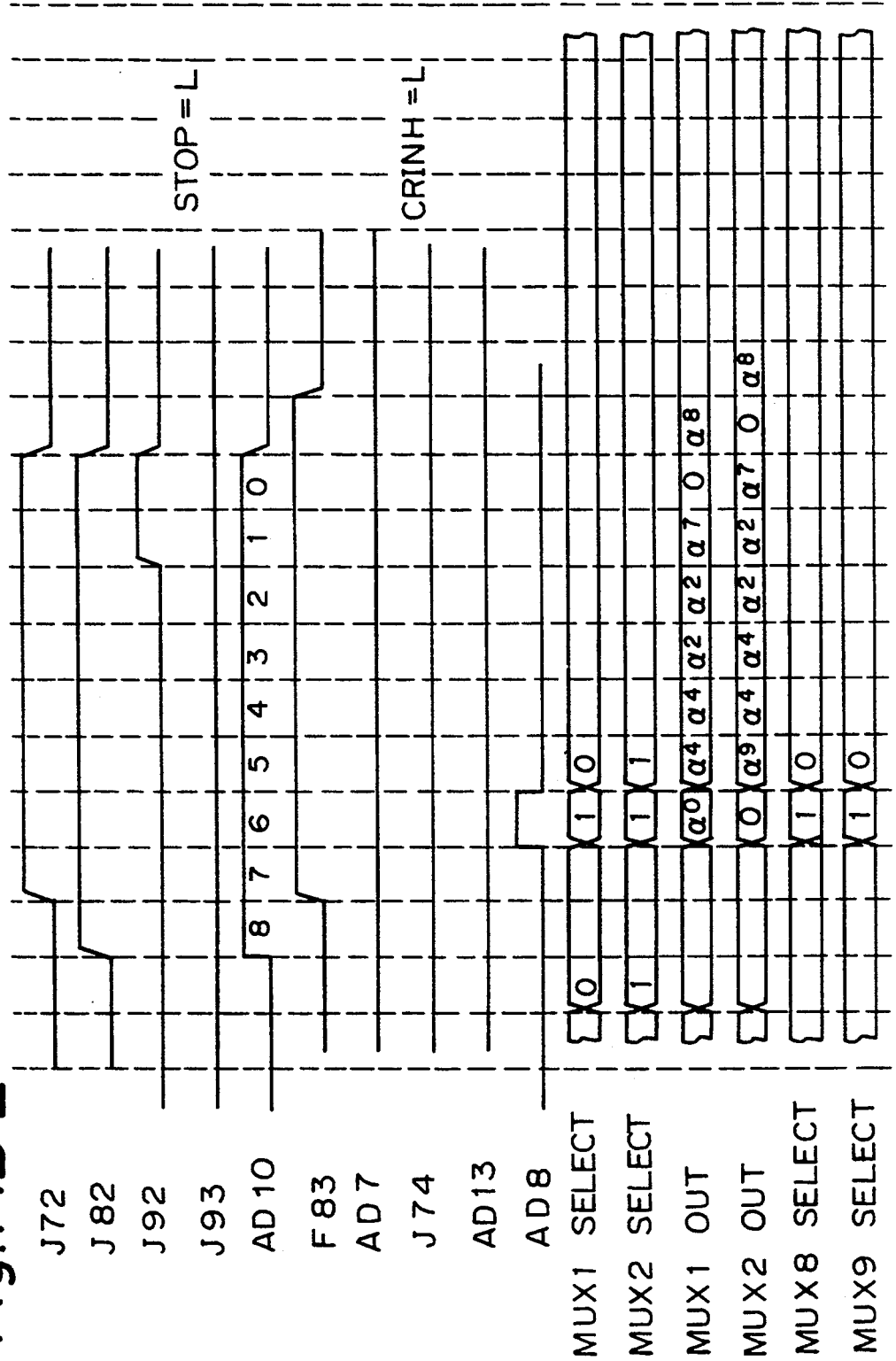
Figures 3, 14B:
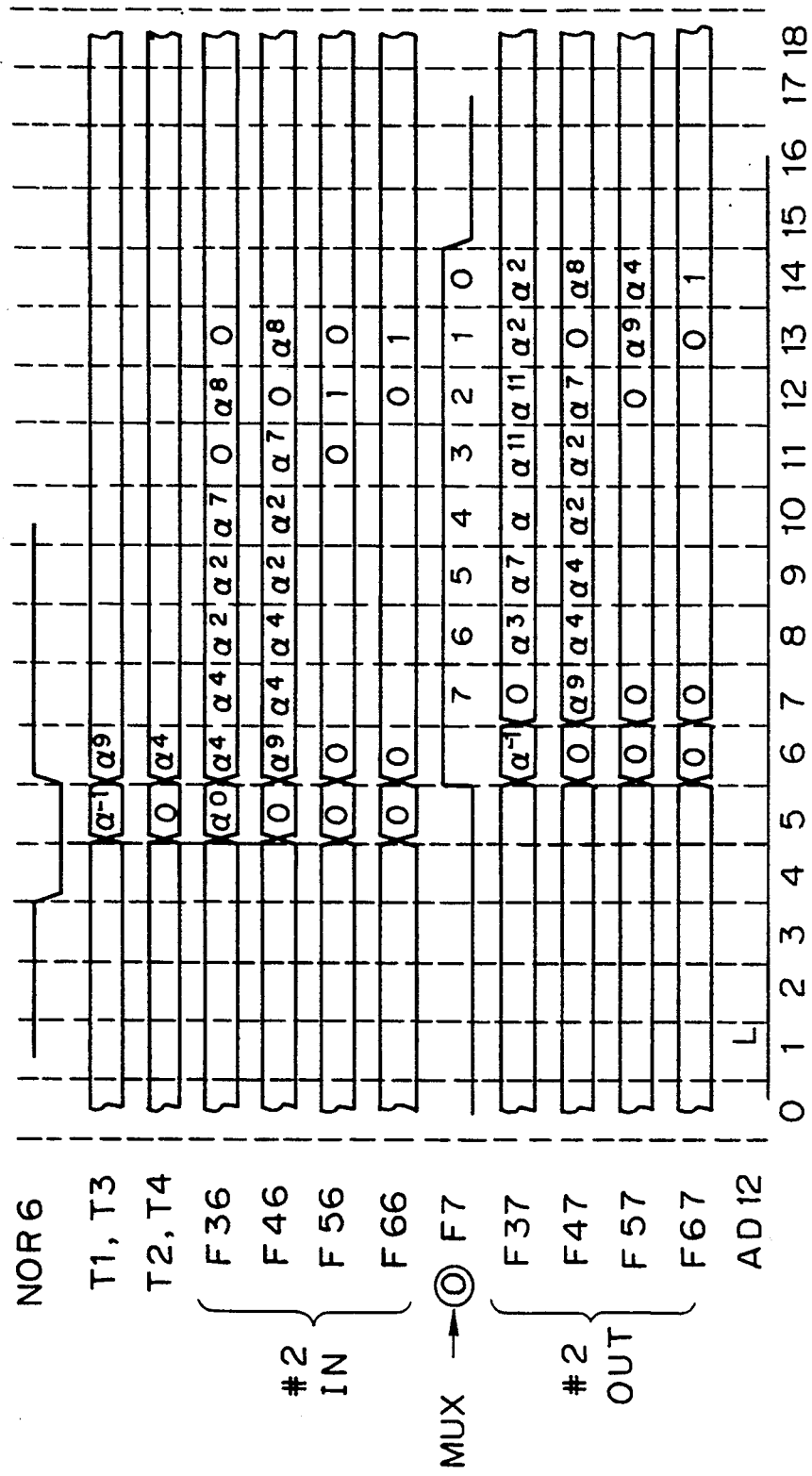
Figures 2, 14C:
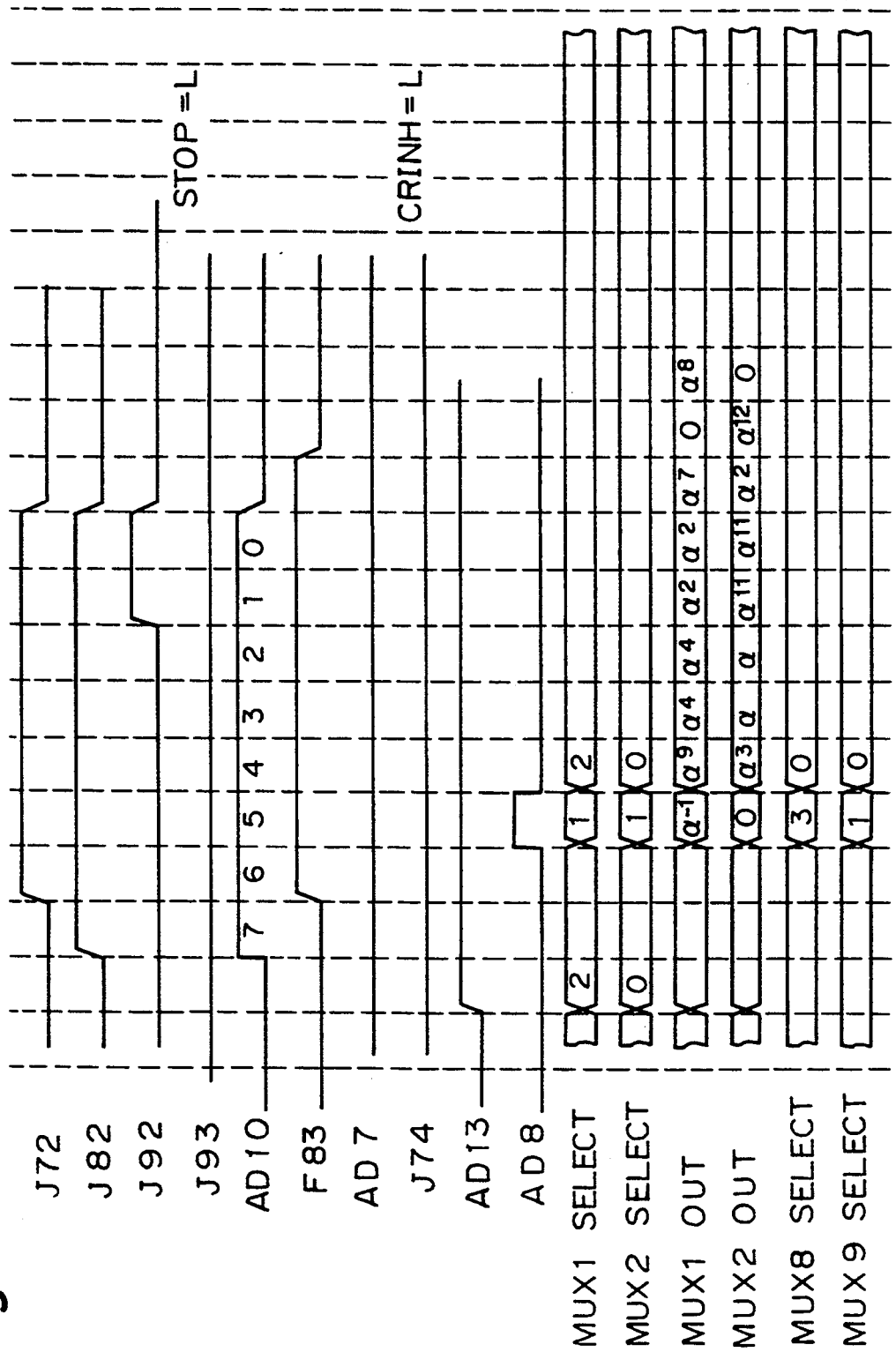
Figures 3, 14C:
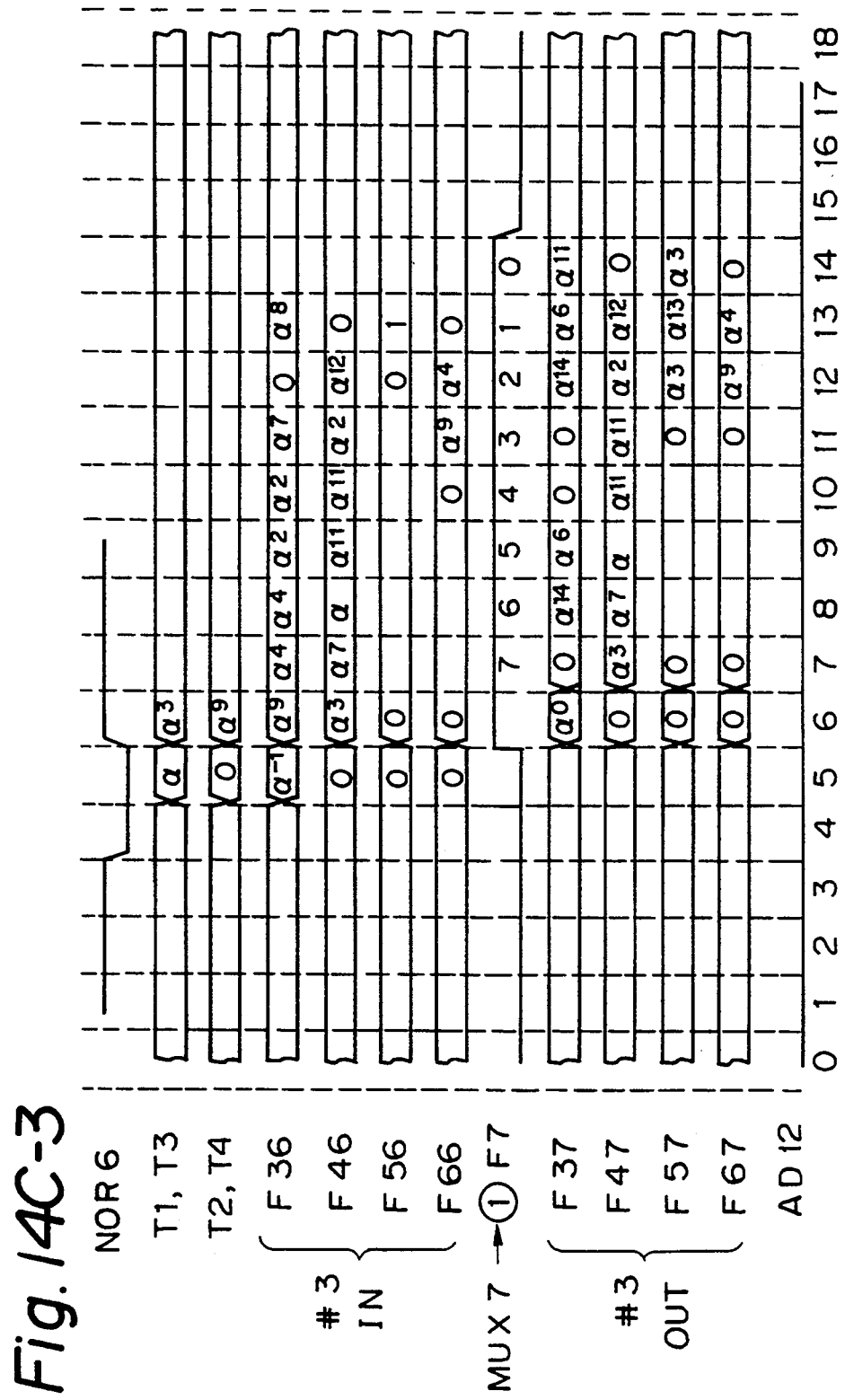
Figures 2, 14D:
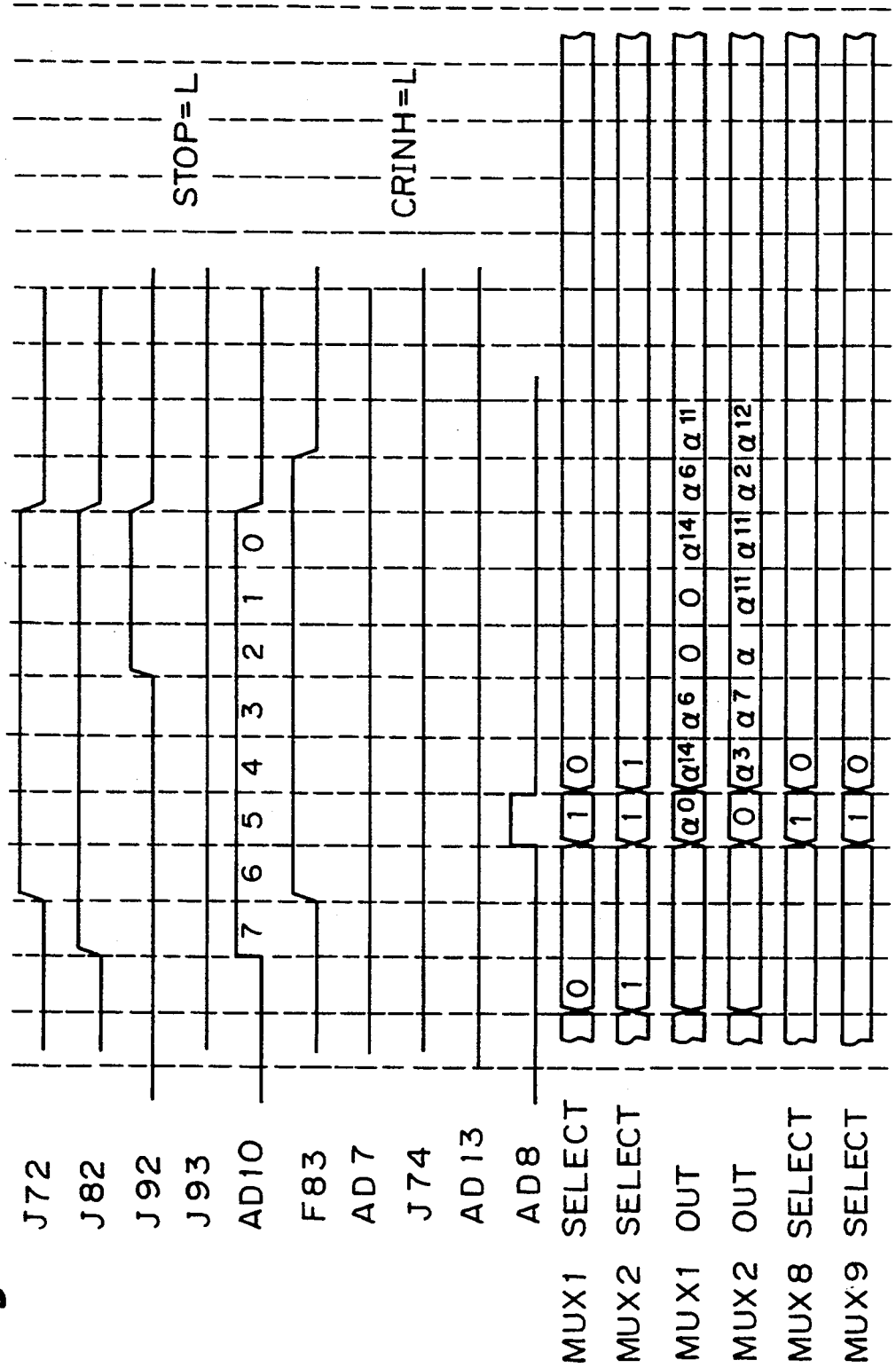
Figures 3, 14D:
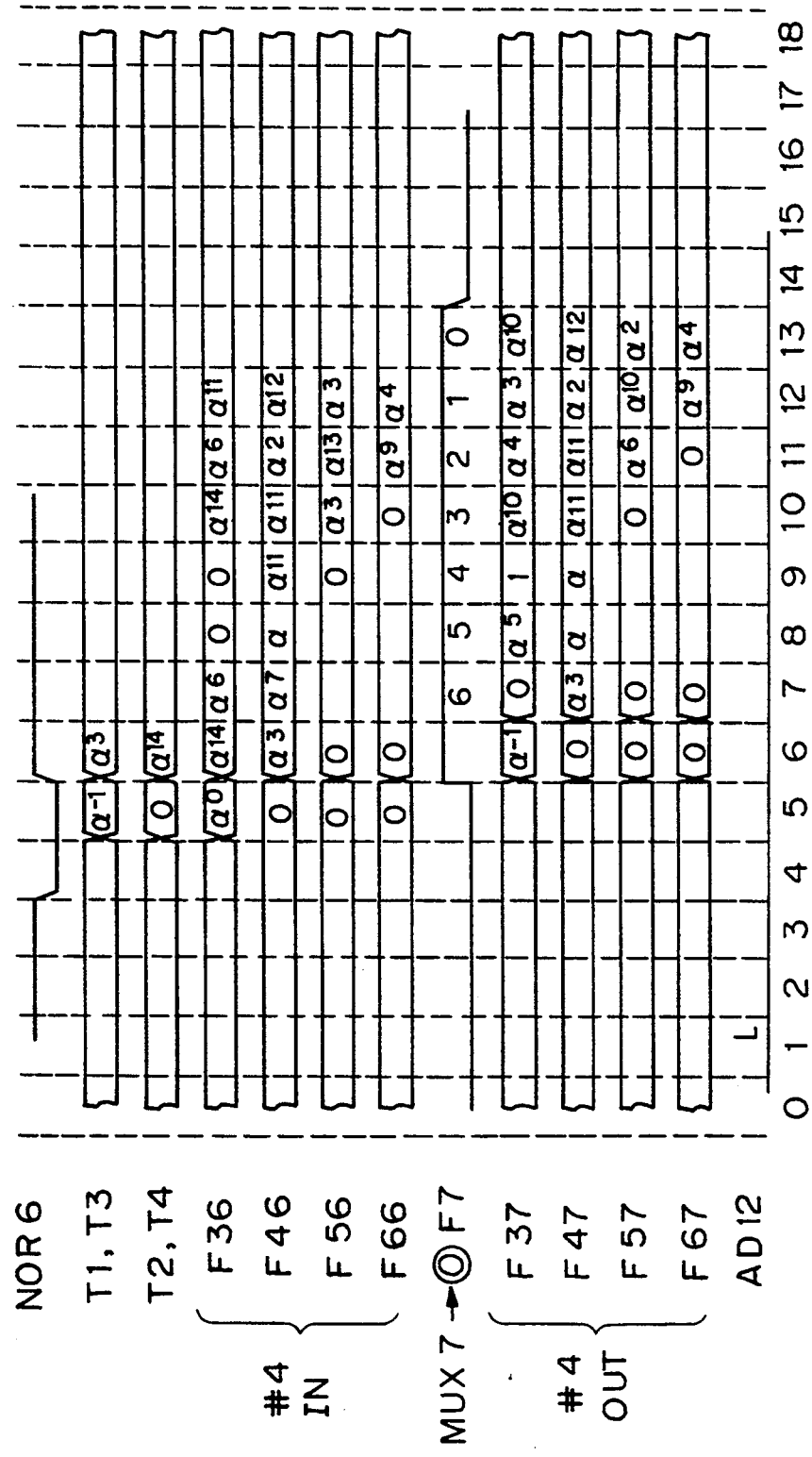
Figures 2, 14E:
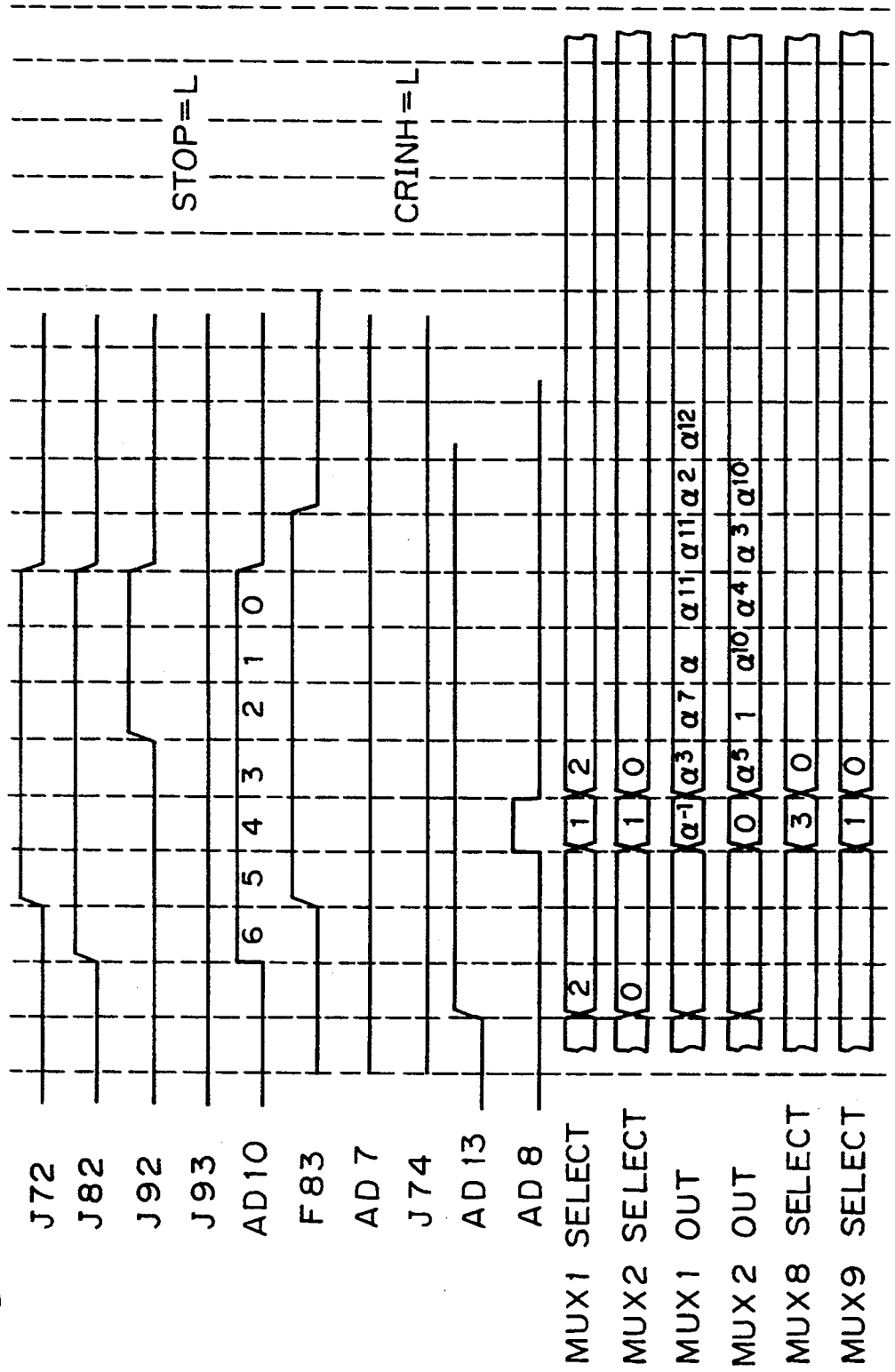
Figures 2, 14F:
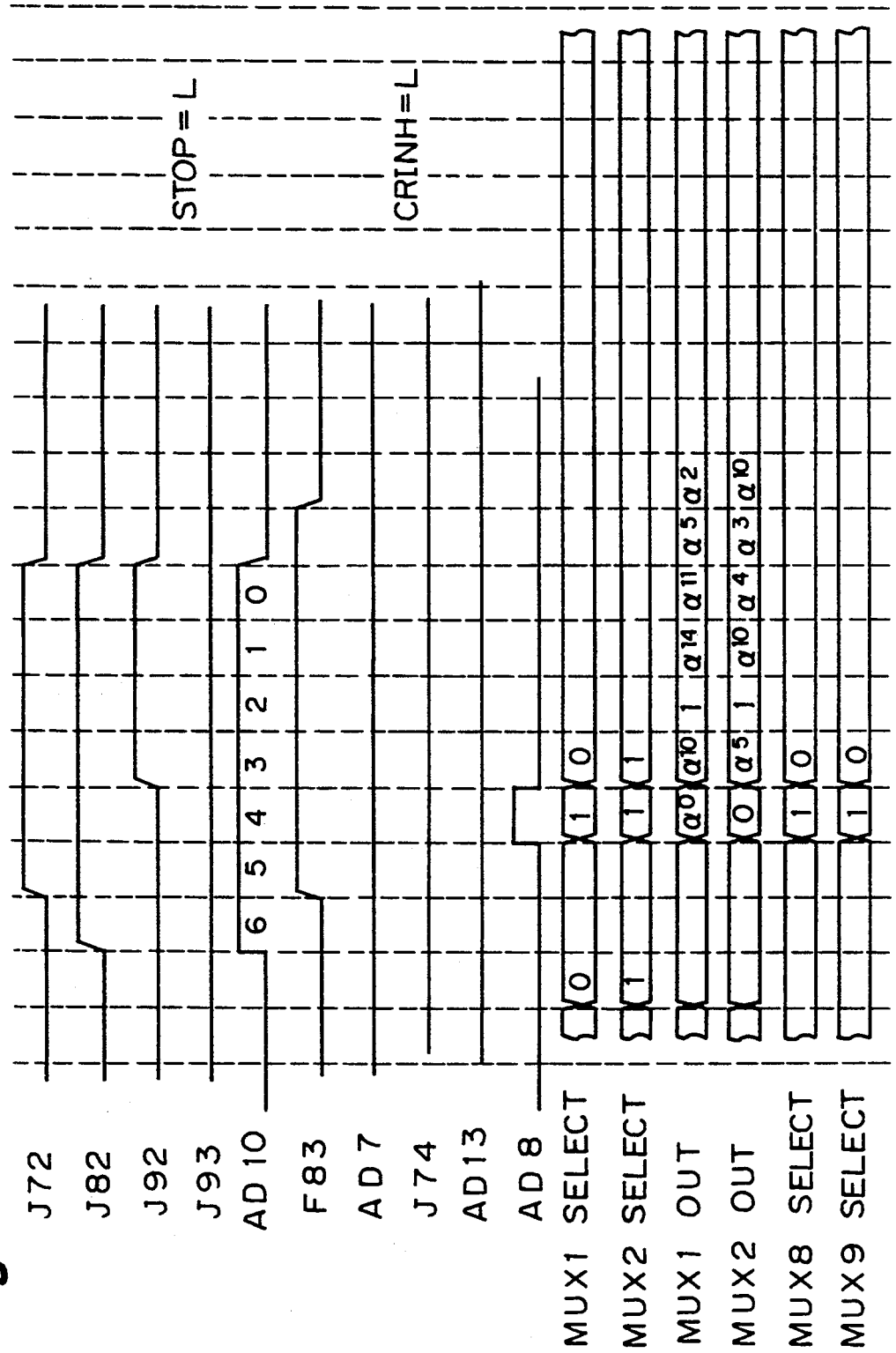
Figures 3, 14F:
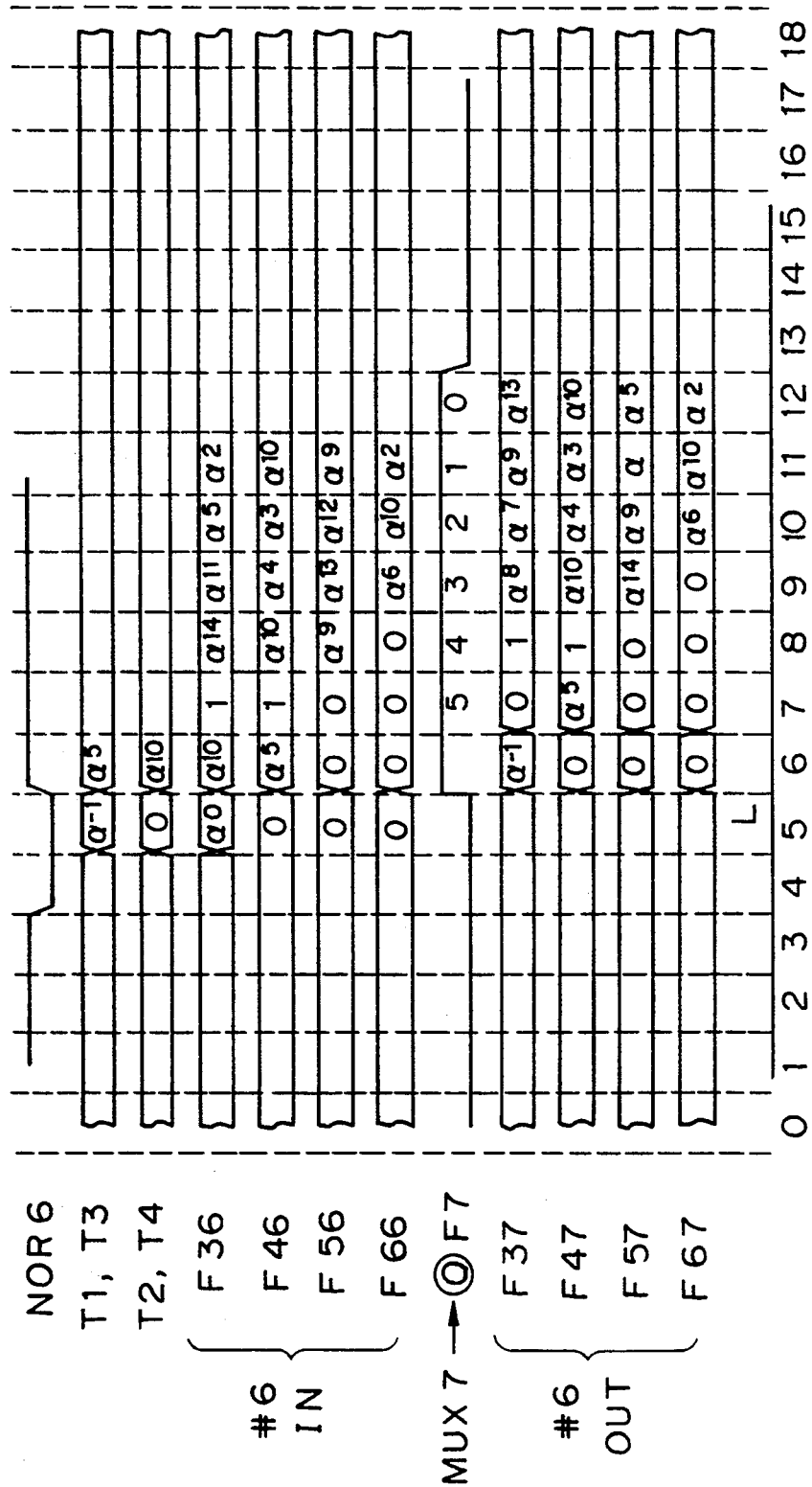
Figures 2, 14G:
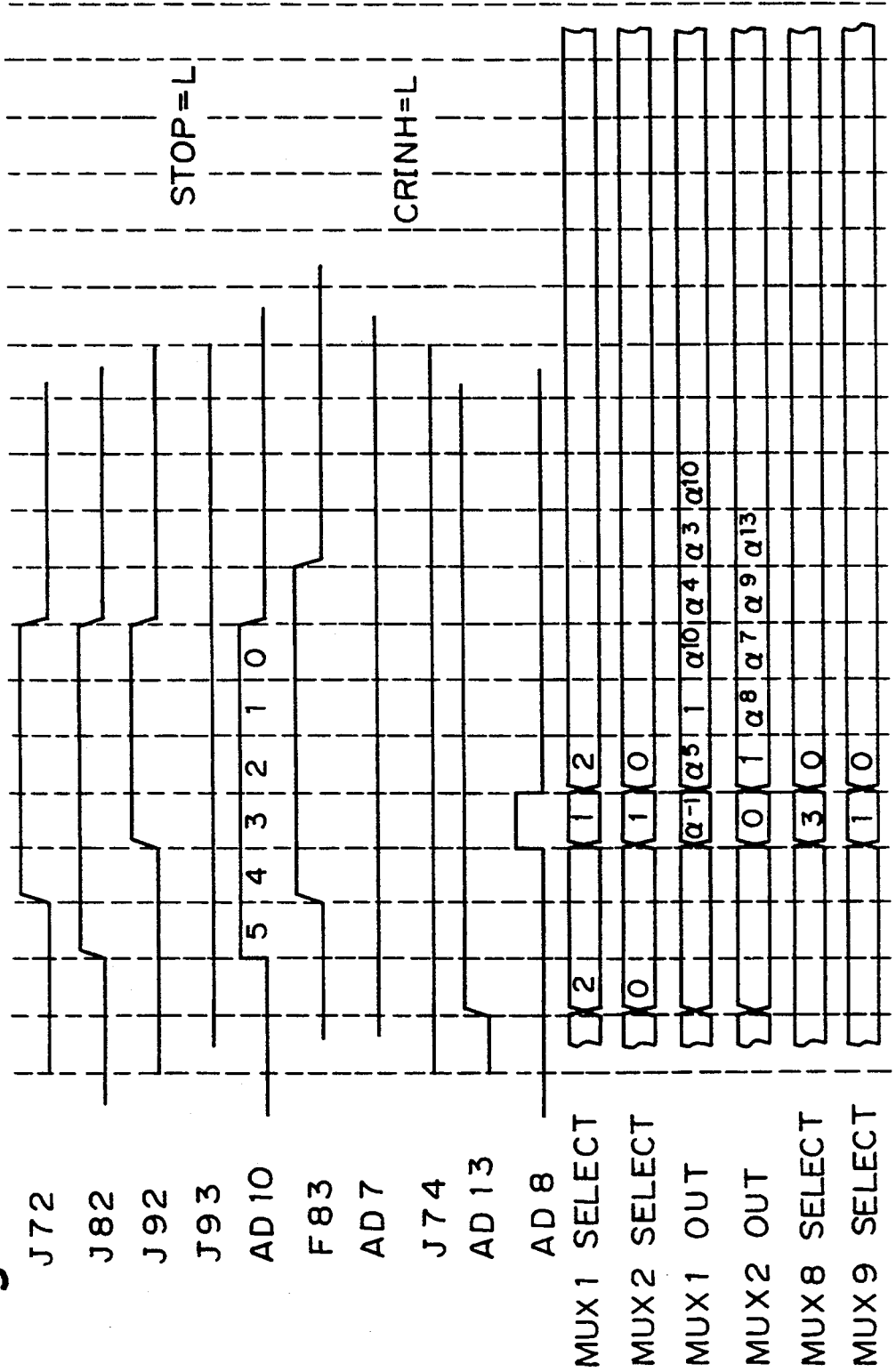
Figures 3, 14G:
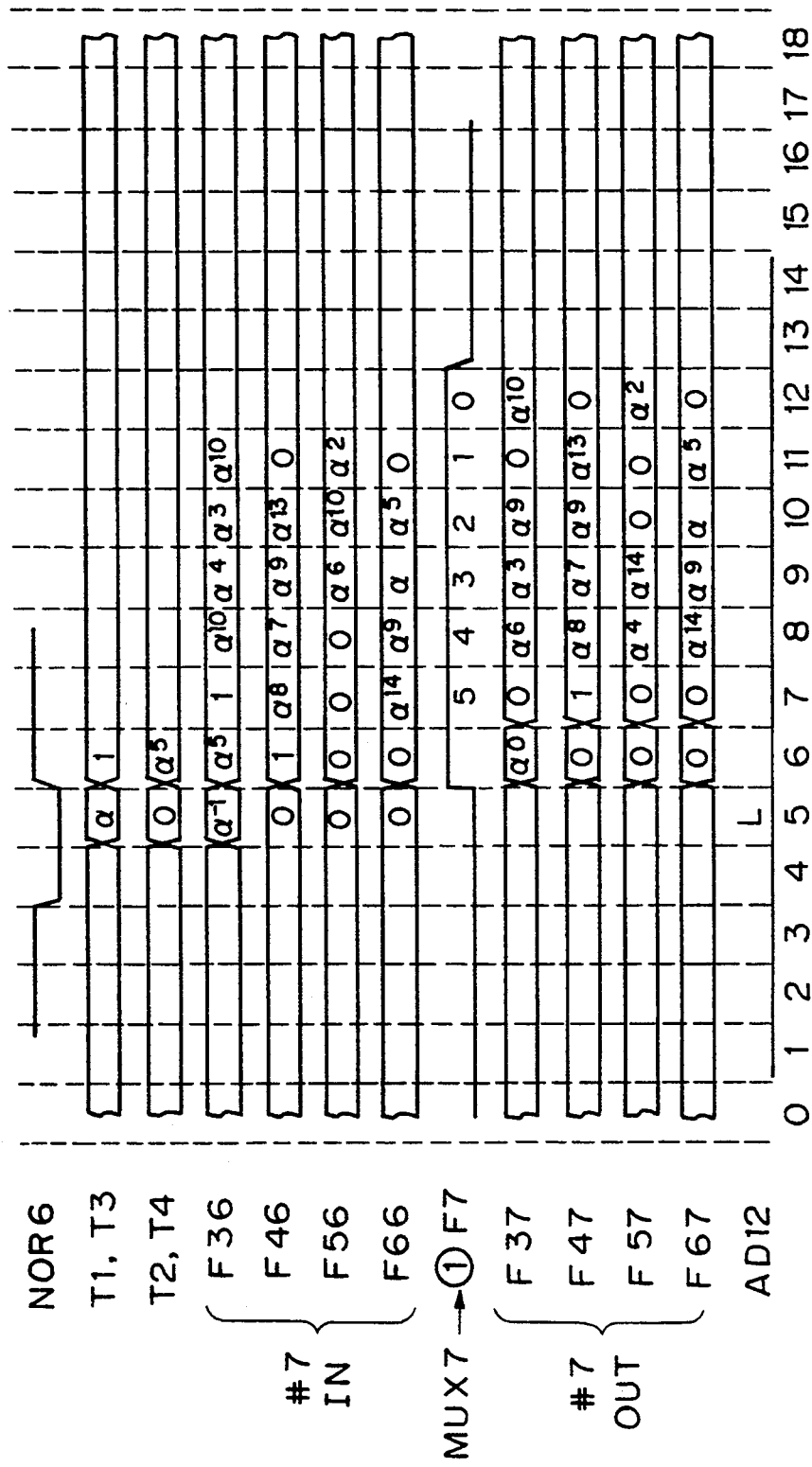
Figures 2, 14H:
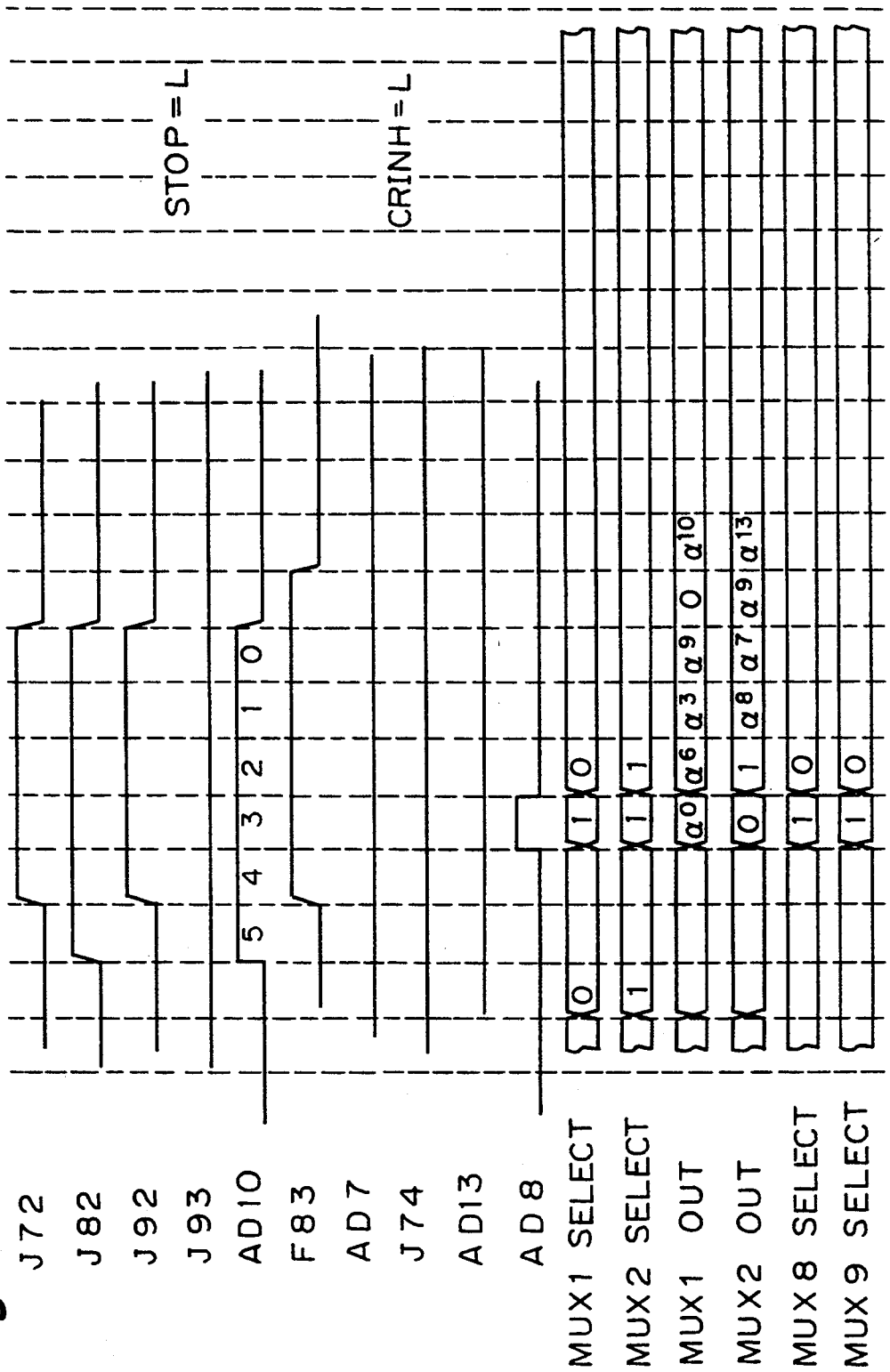
Figures 3, 14H:
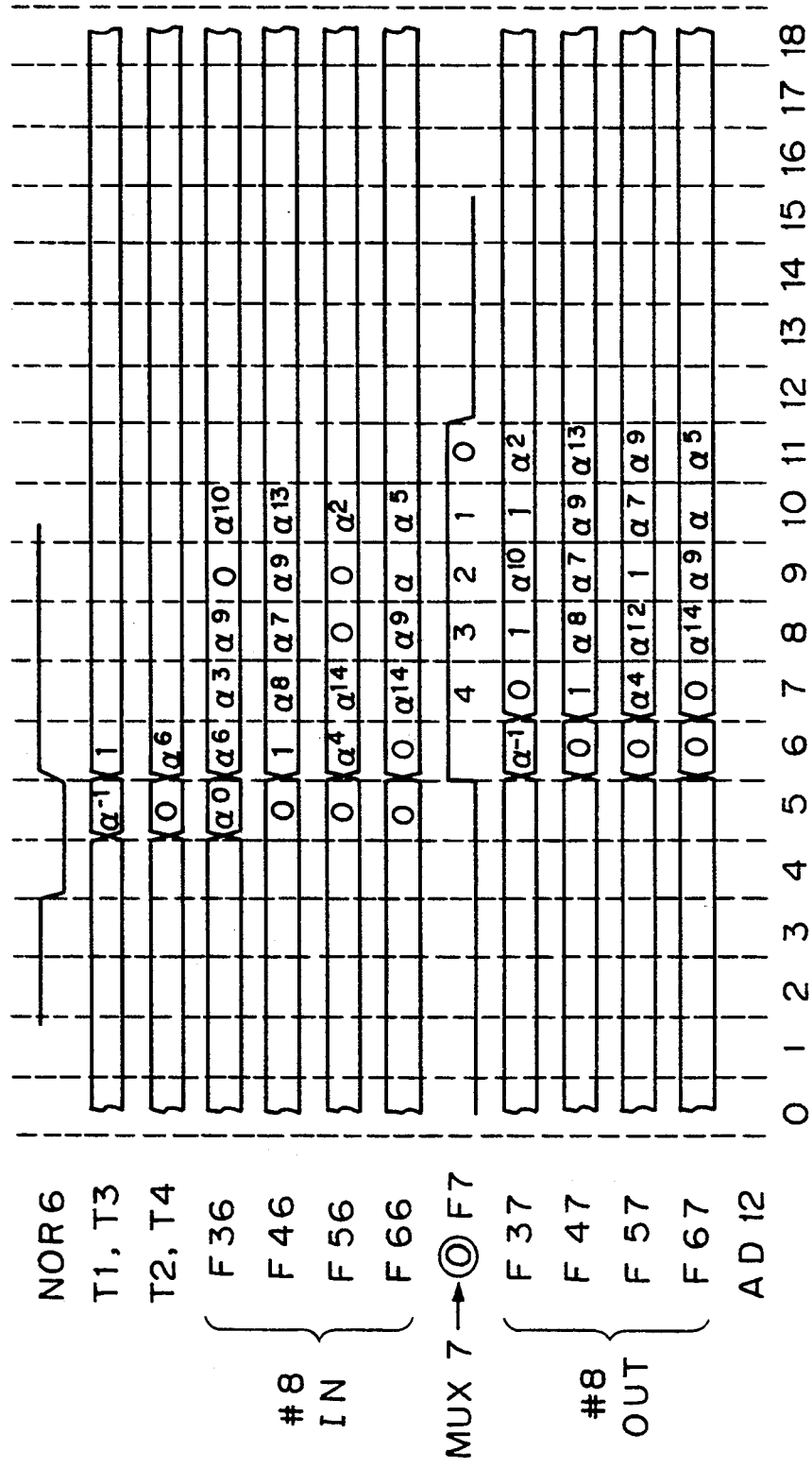
Figures 2, 14I:
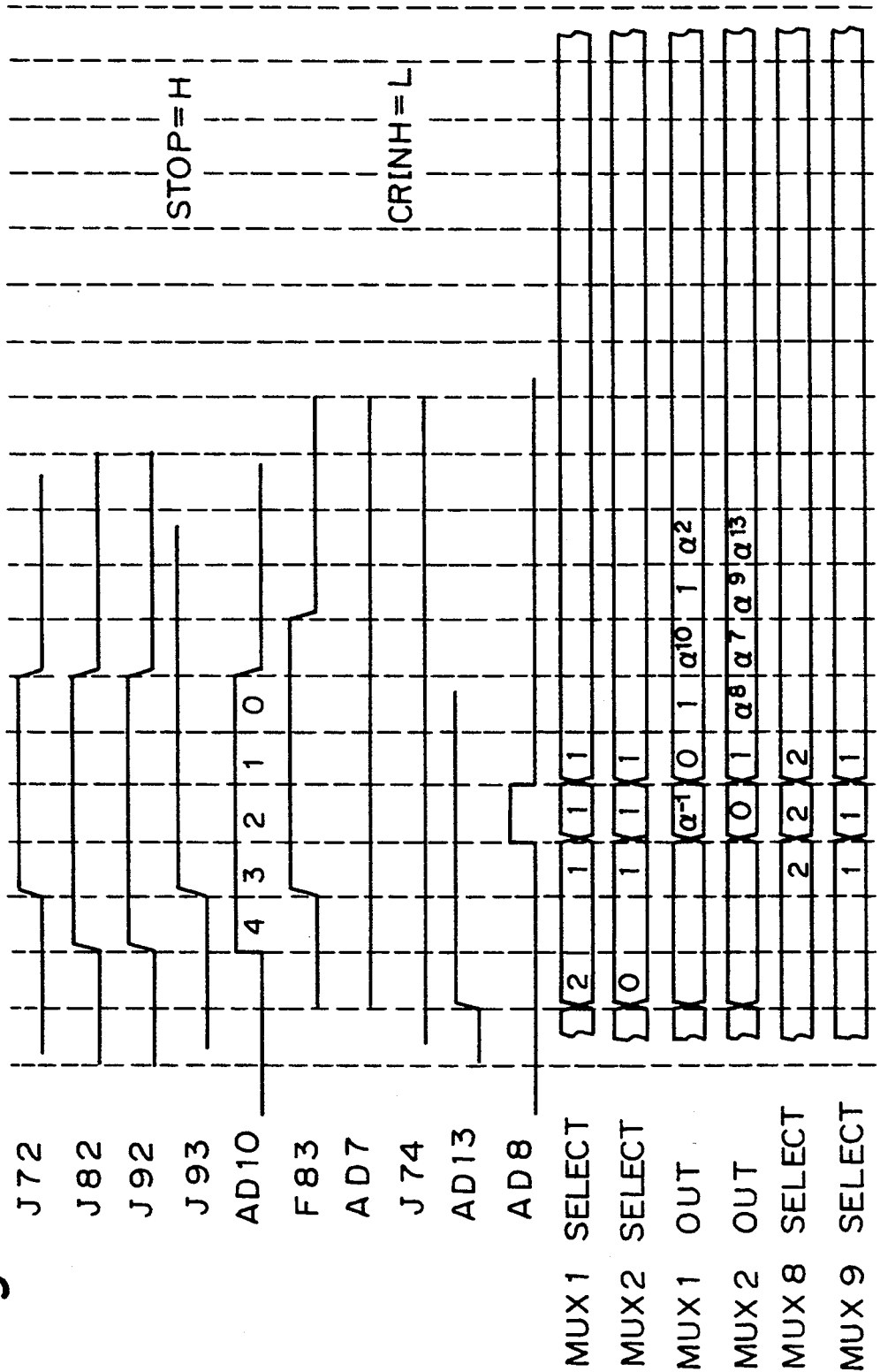
Figures 3, 14I:
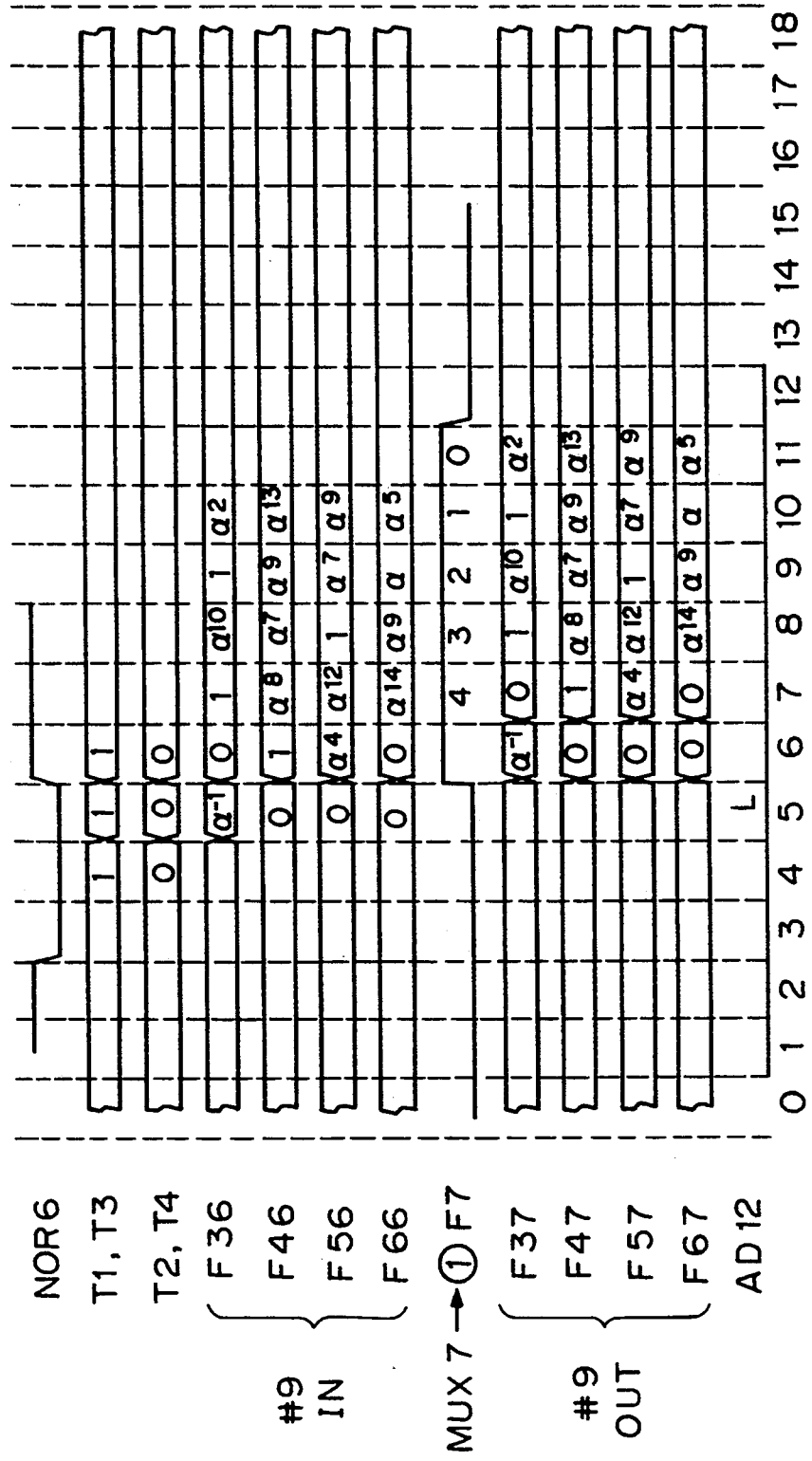

FIGS. 14A to 14I are timing charts showing the operation of the circuit of FIG. 12, which relate to the example of 4-error correction, as described above. FIG. 14A shows the operation of the circuit at the first stage and the operation of each of the second to the ninth stages is respectively shown in FIGS. 14B to 14I.

According to the present invention, by merely cascade connecting the fundamental or basic circuits, it is possible to constitute a decoding circuit of Reed-Solomon code capable to correcting any number of errors. In particular, according to the invention, the arithmetic operations are continuously executed in a real time manner without using a buffer memory and it is effective for high speed data such as digital video data.

Further, according to the invention, in the case where the flag that denotes the difference of degrees of a product polynomial and a initial polynomial is transmitted to the next stage, the flag is time-division multiplexed in the data sequence. Therefore, the number of input and/or output pins are reduced when the inventive system is realized by an integrated circuit. Moreover, a multiplication circuit for the operation of polynomials can be applied instead of an adder because the addition and subtraction of the flags that denote the difference of degrees are transformed into a multiplication.

The above description is given on preferred embodiments of the invention, but it will be apparent that many modifications and variations could be effected by one skilled in the art without departing from the spirit or scope of the novel concepts of the invention, which should be determined by appended claims.

What is claimed is:

1. A method for decoding Reed-Solomon Code to obtain an error position polynomial $\sigma(x)$ and an error evaluation polynomial $\omega(x)$ by a Euclidean algorithm for correcting t symbol errors, comprising the following steps in the following order:

obtaining a syndrome polynomial S(x);

receiving a polynomial B(x) to be decoded and having an initial value $x^{2t}$;

delaying the polynomial B(x) to reduce the degree thereof by one;

multiplying the highest degree of the syndrome polynomial S(x) and the highest degree of the polynomial B(x) having the initial value $x^{2t}$, which is determined by the number t of symbol errors to be corrected, to obtain a product of said polynomials;

sequentially reducing the degree of the product of said polynomials by one and repeating the step of multiplying, wherein the data sequence of the product polynomial and the data sequence of the polynomial B(x) are interchanged in dependence on the condition of a first flag indicating the magnitude and direction of the difference between the highest degrees of the product polynomial and the polynomial B(X), providing a second flag indicating whether the data sequence of the product polynomial and the data sequence of the polynomial B(x) have been interchanged, until polynomials h(x) and g(x) are obtained that satisfy the relation of $$f(x) \cdot B(x) + g(x) \cdot S(x) = h(x)$$

where the degree of h(x) < the degree of g(x) ≦ t; and then setting said polynomial g(x) to said error position polynomial $\sigma(x)$, and setting said polynomial h(x) to said error evaluation polynomial $\omega(x)$.

2. A method according to claim 1, further comprising the step of stopping said step of sequentially reducing the degree when said degree of the product polynomial equals 3.

* * * * *

UNITED STATES PATENT AND TRADEMARK OFFICE
CERTIFICATE OF CORRECTION

PATENT NO. : 5,341,385

DATED : August 23, 1994

INVENTOR(S) : Norihisa Shirota

It is certified that error appears in the above-indentified patent and that said Letters Patent is hereby corrected as shown below:

Col. 2, line 57, change "," to --;--
        line 59, change "," to --.--
Col. 7, line 1, insert --Thus, the error pattern is--

Col. 8, line 22, change "$(a^9xa^4)$" to --$(a^9x+a^4)$--

Col. 9, line 8, insert -- 0   $a^{10}$   1   $a^{14}$   $a^{11}$   $a^5$   $a^2$
Col. 10, line 6, change "R4>" to --R4<--
Col. 11, line 6, change "h(x)>" to --h(x)<--
Col. 14, line 30, after "and" insert --44-- line 46, change "$S_0a^3$" to --$S_0=a^3$--

UNITED STATES PATENT AND TRADEMARK OFFICE
CERTIFICATE OF CORRECTION

PATENT NO. : 5,341,385
DATED : August 23, 1994
INVENTOR(S) : Norihisa Shirota

It is certified that error appears in the above-indentified patent and that said Letters Patent is hereby corrected as shown below:

Col. 15, line 66, change "3" to --33--
Col. 16, line 22, change "IC" to --1C--
Col. 17, line 46, after ""0"" insert --,--

Col. 18, line 67, change "B(X)" to B(x)--

Signed and Sealed this

Nineteenth Day of September, 1995

Attest:

BRUCE LEHMAN

Attesting Officer

Commissioner of Patents and Trademarks